(12) United States Patent  (10) Patent No.: US 8,012,609 B2
Takeda  (45) Date of Patent: Sep. 6, 2011

(54) ORGANIC ELECTROLUMINESCENCE DEVICE

(75) Inventor: Akira Takeda, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 337 days.

(21) Appl. No.: 12/199,836

(22) Filed: Aug. 28, 2008

(65) Prior Publication Data

US 2009/0058279 A1 Mar. 5, 2009

(30) Foreign Application Priority Data

Aug. 29, 2007 (JP) .................................. 2007-222775

(51) Int. Cl.
*H01L 51/54* (2006.01)
*H01J 1/62* (2006.01)

(52) U.S. Cl. ......... 428/690; 428/917; 313/504; 313/506

(58) Field of Classification Search ........................ None
See application file for complete search history.

(56) References Cited

U.S. PATENT DOCUMENTS

| 6,303,238 | B1 | 10/2001 | Thompson et al. | |
| 6,653,654 | B1 * | 11/2003 | Che .................................. | 257/40 |
| 2002/0117662 | A1 * | 8/2002 | Nii ..................................... | 257/40 |
| 2004/0263067 | A1 | 12/2004 | Saitoh et al. | |

FOREIGN PATENT DOCUMENTS

| JP | 2005-48004 | A | 2/2005 |
| WO | 00/57676 | A1 | 9/2000 |
| WO | 00/70655 | A2 | 11/2000 |
| WO | 02/47440 | A1 | 6/2002 |
| WO | 2007/109629 | A2 | 9/2007 |

OTHER PUBLICATIONS

"City Collegiate". Isotopes of Hydrogen. Date published: Unknown. City Collegiate. Date accessed: Jan. 6, 2010. <http://www.citycollegiate.com/isotopesofhydrogen.htm>.*
Extended European Search Report dated Dec. 4, 2008.
Tong et al.,J. Phys. Chem., Enhancement of OLED Efficiencies and High-Voltage Stabilities of Light-Emitting Materials by Deuteration (XP-002503898), 2007, vol. 111, pp. 3490-3494.

* cited by examiner

*Primary Examiner* — Dawn L. Garrett
(74) *Attorney, Agent, or Firm* — Sughrue Mion, PLLC

(57) ABSTRACT

An organic electroluminescent device includes a pair of electrodes; and an organic layer between the pair of electrodes, which includes a light-emitting layer and contains a compound represented by the following formula (1):

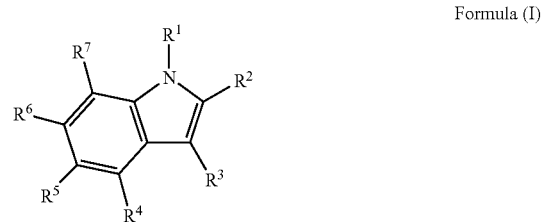

Formula (I)

wherein each of $R^1$ to $R^7$ independently represents a hydrogen atom or a substituent with the proviso that at least one of $R^1$ to $R^7$ represents a deuterium atom or a substituent containing a deuterium atom.

11 Claims, No Drawings

ORGANIC ELECTROLUMINESCENCE DEVICE

BACKGROUND OF THE INVENTION

1. Field of the Invention

The present invention relates to an organic electroluminescence device capable of converting electric energy to light and thereby emitting light (which device may hereinafter be called "organic EL device", "luminescence device", or "device"), in particular, to an organic electroluminescence device excellent in light emitting property and durability.

2. Description of the Related Art

Today, research and development on various display devices (organic luminescence devices) using organic light-emitting materials are actively performed. Of these devices, organic EL devices can realize luminescence with high luminance at low voltage and therefore are drawing attention as promising display devices.

In recent years, devices have improved efficiency by using a phosphorescent material therefor. As the phosphorescent material, an iridium complex and a platinum complex are known (refer to, for example, U.S. Pat. No. 6,303,238, and International Patent Publication Nos. 00/57676 and 00/70655). Satisfactory durability cannot however be attained even by the technologies disclosed therein.

International Patent Publication No. 02/047440 discloses the use of an organic compound containing a deuterium atom, but it has no description about effects produced by combined use of such an organic compound and a phosphorescence emission metal complex material.

JP-A-2005-48004 (The term "JP-A" as used herein refers to an "unexamined published Japanese patent application".) discloses the use of a deuterium-containing carbazole material that produces phosphorescence at ordinary temperatures, but it also has no description about effects produced by combined used of such a carbazole material and a phosphorescence emission metal complex material.

SUMMARY OF THE INVENTION

An object of the present invention is to provide a luminescence device excellent in efficiency (power consumption) and durability.

The above-described object is achieved by the following means.

<1> An organic electroluminescent device comprising:
a pair of electrodes; and
an organic layer between the pair of electrodes, which comprises a light-emitting layer and contains a compound represented by the following formula (1):

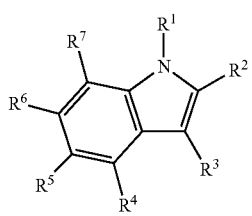

Formula (I)

wherein
each of $R^1$ to $R^7$ independently represents a hydrogen atom or a substituent with the proviso that at least one of $R^1$ to $R^7$ represents a deuterium atom or a substituent containing a deuterium atom.

<2> The organic electroluminescence device according to <1>, wherein
the light emitting layer contains a phosphorescent material.

<3> The organic electroluminescence device according to <1>, wherein
the light emitting layer contains at least one of a platinum complex phosphorescent material and an iridium complex phosphorescent material.

<4> The organic electroluminescence device according to <1>, wherein
the light emitting layer contains a platinum complex phosphorescent material.

<5> The organic electroluminescence device according to <1>, wherein
the light emitting layer contains a platinum complex phosphorescent material having a tetradentate ligand.

<6> The organic electroluminescence device according to <1>, wherein
at least one of $R^2$ to $R^7$ in the formula (I) represents a deuterium atom.

<7> The organic electroluminescence device according to <1>, wherein
the compound represented by the formula (I) is contained in the light emitting layer.

<8> The organic electroluminescence device according to <1>, wherein
the compound represented by the formula (I) is contained in a layer adjacent to the light emitting layer.

<9> The organic electroluminescence device according to <1>, wherein
$R^1$ in the formula (I) represents an aryl group or a heteroaryl group.

<10> The organic electroluminescence device according to <1>, wherein
at least one of $R^2$ and $R^3$ in the formula (I) is an alkyl group having a tertiary or quaternary carbon atom, and
the alkyl group is bound to the compound via the tertiary or quaternary carbon atom.

<11> The organic electroluminescence device according to <1>, wherein
the compound represented by the formula (I) is represented by the following formula (Ia):

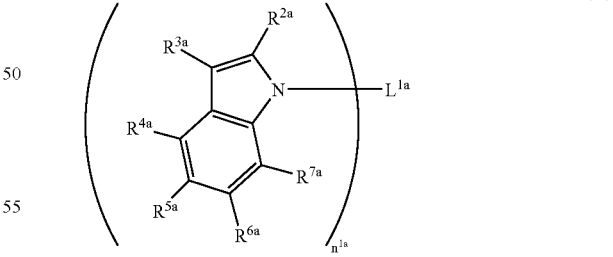

Formula (Ia)

wherein
$R^{2a}$ to $R^{7a}$ have the same meanings as $R^2$ to $R^7$ in the compound represented by the formula (I) respectively,
$n^{1a}$ represents an integer of 2 to 6, and
$L^{1a}$ represents an $n^{1a}$-valent linking group.

<12> The organic electroluminescence device according to <1>, wherein
the compound represented by the formula (I) is represented by the following formula (Ib):

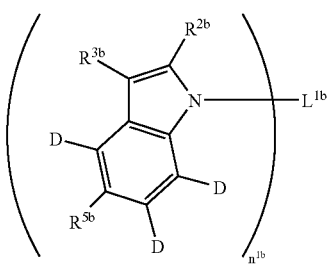

Formula (Ib)

wherein $R^{2b}$, $R^{3b}$ and $R^{5b}$ have the same meanings as $R^2$, $R^3$ and $R^5$ in the compound represented by the formula (I) respectively, $n^{1b}$ represents an integer of 2 to 4, and $L^{1b}$ represents an $n^{1b}$-valent linking group.

<13> The organic electroluminescence device according to <1>, wherein the compound represented by the formula (I) is represented by the following formula (Ic):

$(Ind)_n$-L  Formula (Ic)

wherein

Ind represents a residue structure of the compound represented by the formula (I), L represents a linking group bound to the 2- or 3-position of the indole ring of the compound represented by the formula (I), and n represents an integer of 2 or greater.

DETAILED DESCRIPTION OF THE INVENTION

The organic electroluminescence device of the invention (which may hereinafter be called "device of the invention") has, between a pair of electrodes, one or more organic layers (which may be composed only of an organic compound or may contain an inorganic compound) containing a light emitting layer and contains, in any of the organic layers, at least one compound represented by the following formula (I).

The compound of the invention represented by the formula (I) has excellent chemical stability and undergoes less deterioration, for example, decomposition of materials during device operation. It is therefore possible to prevent deterioration in the efficiency or life of the organic electroluminescence device which will otherwise occur by the decomposition product.

The compounds represented by the formula (I) will hereinafter be described.

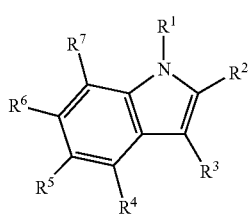

Formula (I)

In the formula (I), each of $R^1$ to $R^7$ represents a hydrogen atom or a substituent, with the proviso that at least one of $R^1$ to $R^7$ represents a deuterium atom or a deuterium-containing substituent.

The term "deuterium-containing substituent" as used in the invention refers to the group formed by substituting a deuterium atom for a hydrogen atom in a substituent.

The suitable ratio between deuterium atoms and hydrogen atoms (the number of deuterium atoms:the number of hydrogen atoms) in the formula (I) is from 100:0 to 1:99. Put another way, such a ratio has the meaning that the proportion of deuterium atoms in the sum total of hydrogen atoms and deuterium atoms (deuteration rate) in the formula (I) is from 1% to 100%. This deuteration rate can be determined by measuring a proton NMR spectrum of the compound together with an internal standard compound containing hydrogen atoms the number and the chemical shift of which are known, and then by calculating the ratio between the integrals of the signals in the spectrum measured.

The range of the deuterium/hydrogen ratio is preferably from 100:0 to 5:95 (equivalent to the deuteration rate of 5 to 100%), more preferably from 100:0 to 50:50 (equivalent to the deuteration rate of 50 to 100%), especially preferably from 100:0 to 80 to 20 (equivalent to the deuteration rate of 80 to 100%).

A hydrogen atom at any position of the compound represented by the formula (I) may be a deuterium atom. It is preferred that the hydrogen atoms of $R^2$ and $R^3$ are deuterium atoms, more preferred that the hydrogen atoms of $R^2$ to $R^7$ are deuterium atoms, especially preferred that all of the hydrogen atoms are deuterium atoms.

The substituent represented by $R^1$ to $R^7$ is not particularly limited and examples of it include alkyl groups, alkenyl groups, alkynyl groups, aryl groups, heteroaryl groups, amino groups, alkoxy groups, aryloxy groups, heterocyclic oxy groups, acyl groups, alkoxycarbonyl groups, aryloxycarbonyl groups, acyloxy groups, acylamino groups, alkoxycarbonylamino groups, aryloxycarbonylamino groups, sulfonylamino groups, sulfamoyl groups, carbamoyl groups, alkylthio groups, arylthio groups, heterocyclic thio groups, sulfonyl groups, sulfinyl groups, ureido groups, phosphoric acid amide groups, a hydroxy group, a mercapto group, halogen atoms, a cyano group, a sulfo group, a carboxyl groups, a nitro group, a hydroxamic acid group, a sulfino group, a hydrazino group, an imino group, heterocyclic groups other than heteroaryl groups, silyl groups, silyloxy groups, and a deuterium atom. These substituents may be substituted further with another substituent, or these substituents may be coupled to form a ring.

The alkyl groups are preferably $C_{1-30}$, more preferably $C_{1-20}$, especially preferably $C_{1-10}$ alkyl groups and examples include methyl, ethyl, n-propyl, isopropyl, n-butyl, tert-butyl, n-octyl, n-nonyl, n-decyl, n-dodecyl, n-octadecyl, n-hexadecyl, cyclopropyl, cyclobutyl, cyclopentyl, cyclohexyl, cyclooctyl, 1-adamantyl and trifluoromethyl.

The alkenyl groups are preferably $C_{2-30}$, more preferably $C_{2-20}$, especially preferably $C_{2-10}$ alkenyl groups and examples include vinyl, allyl, 1-propenyl, 1-isopropenyl, 1-butenyl, 2-butenyl, and 3-pentenyl.

The alkynyl groups are preferably $C_{2-30}$, more preferably $C_{2-20}$, especially preferably $C_{2-10}$ alkynyl groups and examples include ethynyl, propargyl, 1-propinyl, and 3-pentynyl.

The aryl groups are preferably $C_{6-30}$, more preferably $C_{6-20}$, especially preferably $C_{6-12}$ aryl groups and examples include phenyl, o-methylphenyl, m-methylphenyl, p-methylphenyl, 2,6-xylyl, p-cumenyl, mesityl, naphthyl, and anthranyl.

The heteroaryl groups are preferably $C_{1-30}$, more preferably $C_{1-12}$ heteroaryl groups and heteroatoms are, for example, nitrogen, oxygen and sulfur atoms. Specific examples include imidazolyl, pyrazolyl, pyridyl, pyrazyl, pyrimidyl, triazinyl, quinolyl, isoquinolinyl, pyrrolyl, indolyl, furyl, thienyl, benzoxazolyl, benzimidazolyl, benzothiazolyl, carbazolyl, and azepinyl.

The amino groups are preferably $C_{0-30}$, more preferably $C_{0-20}$, especially preferably $C_{0-10}$ amino groups and examples include amino, methylamino, dimethylamino, diethylamino, dibenzylamino, diphenylamino, and ditolylamino.

The alkoxy groups are preferably $C_{1-30}$, more preferably $C_{1-20}$, especially preferably $C_{1-10}$ alkoxy groups and examples include methoxy, ethoxy, butoxy, and 2-ethylhexyloxy.

The aryloxy groups are preferably $C_{6-30}$, more preferably $C_{6-20}$, especially preferably $C_{6-12}$ aryloxy groups and examples include phenyloxy, 1-naphthyloxy, and 2-naphthyloxy.

The heterocyclic oxy groups are preferably $C_{1-30}$, more preferably $C_{1-20}$, especially preferably $C_{1-12}$ heterocyclic oxy groups and examples include pyridyloxy, pyrazyloxy, pyrimidyloxy, and quinolyloxy.

The acyl groups are preferably $C_{2-30}$, more preferably $C_{2-20}$, especially preferably $C_{2-12}$ acyl groups and examples include acetyl, benzoyl, formyl, and pivaloyl.

The alkoxycarbonyl groups are preferably $C_{2-30}$, more preferably $C_{2-20}$, especially preferably $C_{2-12}$ alkoxycarbonyl groups and examples include methoxycarbonyl and ethoxycarbonyl.

The aryloxycarbonyl groups are preferably $C_{7-30}$, more preferably $C_{7-20}$, especially preferably $C_{7-12}$ aryloxycarbonyl groups and examples include phenyloxycarbonyl.

The acyloxy groups are preferably $C_{2-30}$, more preferably $C_{2-20}$, especially preferably $C_{2-10}$ acyloxy groups and examples include acetoxy and benzoyloxy.

The acylamino groups are preferably $C_{2-30}$, more preferably $C_{2-20}$, especially preferably $C_{2-10}$ acylamino groups and examples include acetylamino and benzoylamino.

The alkoxycarbonylamino groups are preferably $C_{2-30}$, more preferably $C_{2-20}$, especially preferably $C_{2-12}$ alkoxycarbonylamino groups and examples include methoxycarbonylamino.

The aryloxycarbonylamino groups are preferably $C_{7-30}$, more preferably $C_{7-20}$, especially preferably $C_{7-12}$ aryloxycarbonylamino groups and examples include phenyloxycarbonylamino.

The sulfonylamino groups are preferably $C_{1-30}$, more preferably $C_{1-20}$, especially preferably $C_{1-12}$ sulfonylamino groups and examples include methanesulfonylamino and benzenesulfonylamino.

The sulfamoyl groups are preferably $C_{0-30}$, more preferably $C_{0-20}$, especially preferably $C_{0-12}$ sulfamoyl groups and examples include sulfamoyl, methylsulfamoyl, dimethylsulfamoyl, and phenylsulfamoyl.

The carbamoyl groups are preferably $C_{1-30}$, more preferably $C_{1-20}$, especially preferably $C_{1-12}$ carbamoyl groups and examples include carbamoyl, methylcarbamoyl, diethylcarbamoyl, and phenylcarbamoyl.

The alkylthio groups are preferably $C_{1-30}$, more preferably $C_{1-20}$, especially preferably $C_{1-12}$ alkylthio groups and examples include methylthio and ethylthio.

The arylthio groups are preferably $C_{6-30}$, more preferably $C_{6-20}$, especially preferably $C_{6-12}$ arylthio groups and examples include phenylthio.

The heterocyclic thio groups are preferably $C_{1-30}$, more preferably $C_{1-20}$, especially preferably $C_{1-12}$ heterocyclic thio groups and examples include pyridylthio, 2-benzimidazolylthio, 2-benzoxazolylthio, and 2-benzthiazolylthio.

The sulfonyl groups are preferably $C_{1-30}$, more preferably $C_{1-20}$, especially preferably $C_{1-12}$ sulfonyl groups and examples include mesyl, tosyl, and trifluoromethanesulfonyl.

The sulfinyl groups are preferably $C_{1-30}$, more preferably $C_{1-20}$, especially preferably $C_{1-12}$ sulfinyl groups and examples include methanesulfinyl and benzenesulfinyl.

The ureido groups are preferably $C_{1-30}$, more preferably $C_{1-20}$, especially preferably $C_{1-12}$ ureido groups and examples include ureido, methylureido, and phenylureido.

The phosphoric acid amide groups are preferably $C_{1-30}$, more preferably $C_{1-20}$, especially preferably $C_{1-12}$ phosphoric acid amide groups and examples include diethylphosphoric acid amide and phenylphosphoric acid amide.

Examples of the halogen atoms include fluorine, chlorine, bromine, and iodine.

The heterocyclic groups other than heteroaryl groups are preferably $C_{1-30}$, more preferably $C_{1-12}$ heterocyclic groups and heteroatoms are, for example, nitrogen, oxygen, and sulfur atoms. Specific examples include piperidyl, morpholino, and pyrrolidyl.

The silyl groups are preferably $C_{3-40}$, more preferably $C_{3-30}$, especially preferably $C_{3-24}$ silyl groups and examples include trimethylsilyl, triethylsilyl, triisopropylsilyl, dimethyl-tert-butylsilyl, dimethylphenylsilyl, diphenyl-tert-butylsilyl, triphenylsilyl, tri-1-naphthylsilyl, and tri-2-naphthylsilyl.

The silyloxy groups are preferably $C_{3-40}$, more preferably $C_{3-30}$, especially preferably $C_{3-24}$ silyloxy groups and examples include trimethylsilyloxy and triphenylsilyloxy.

The substituent as $R^1$ is preferably an alkyl group, an aryl group, a heteroaryl group or a silyl group, more preferably an alkyl group having 1 to 10 carbon atoms, an aryl group having 6 to 20 carbon atoms or a heteroaryl group having 4 to 20 carbon atoms, especially preferably an aryl group having 6 to 20 carbon atoms. The aryl group is preferably a phenyl group, a 1-naphthyl group, a 2-naphthyl group, a 9-anthracenyl group or a 1-pyrenyl group, more preferably a phenyl group, a 1-naphthyl group, a 2-naphthyl group or a 9-anthracenyl group, especially preferably a phenyl group.

The substituent as $R^1$ may be substituted further with another substituent. A plurality of compounds represented by the formula (I) may be contained via the substituent as $R^1$. In this case, the number of the compounds contained in the formula (I) is preferably 2 or greater, more preferably from 2 to 4, still more preferably 2 or 3, especially preferably 2.

The substituent as $R^2$ or $R^3$ is preferably an alkyl group, an aryl group, a heteroaryl group, or a silyl group, more preferably an alkyl group, an aryl group, or a heteroaryl group, especially preferably an alkyl group.

When $R^2$ and $R^3$ are alkyl groups, it means that they are substituents which have a primary to quaternary carbon atom and at the same time, are linked to the compound represented by the formula (I) via the carbon atom. They are preferably substituents which have a secondary to quaternary carbon atom and at the same time, are linked to the compound via the carbon atom; more preferably substituents which have a tertiary or quaternary carbon atom and at the same time, are linked to the compound via the carbon atom; especially preferably substituents which have a quaternary carbon atom and at the same time, are linked to the compound via the carbon atom. Examples of a substituent which is linked to the compound via a primary carbon atom include a methyl group; those of a substituent which is linked to the compound via a secondary carbon atom include an ethyl group and a benzyl group; those of a substituent which is linked to the compound via a tertiary carbon atom include an isopropyl group and a diphenylmethyl group, and those of a substituent which is linked to the compound via a quaternary carbon atom include a tert-butyl group, a 1-adamantyl group, and a trityl group.

The alkyl group of $R^2$ and $R^3$ each is preferably a methyl group, an ethyl group, an isopropyl group, an n-butyl group, a tert-butyl group, a benzyl group, a diphenylmethyl group, a trityl group, a 1-adamantyl group or a 2-adamantyl group, more preferably a methyl group, an isopropyl group, an n-butyl group, a tert-butyl group, a trityl group or a 1-adamantyl group, especially preferably a tert-butyl group, a trityl group or a 1-adamantyl group, because it is thought that the hydrogen atom in the α-position of an alkyl group substituting for a hydrogen atom on the indole skeleton is chemically active, so the absence of hydrogen atoms at the relevant position is desirable in point of stability of the compound.

It is preferable that neither $R^2$ nor $R^3$ is a hydrogen atom, it is more preferable that either $R^2$ or $R^3$ is a substituent (not a hydrogen atom), and it is especially preferable that $R^3$ is a substituent (not a hydrogen atom).

The substituent as $R^4$ to $R^7$ each is preferably an alkyl group, an aryl group, a heteroaryl group, a halogen atom, a cyano group or a silyl group, more preferably an alkyl group, an aryl group, a heteroaryl group, a fluorine atom, a cyano group or a tertiary silyl group, especially preferably an alkyl group having 1 to 10 carbon atoms or a triarylsilyl group having 1 to 30 carbon atoms. Each of these substituents may further be substituted by another substituent, or any two of these substituents may combine with each other to form a ring.

As to the proportion of deuterium atoms substituting for hydrogen atoms in each substituent, the higher the better in most cases. This is because the positions having undergone deuterium substitution are thought to be inactive against chemical reactions affecting deterioration of pertinent materials as compared to the case where hydrogen atoms are present at the positions without substitution. In addition, activities toward chemical reactions vary with the kinds of substituents. Therefore, it is thought that the range of the preferred proportion also varies depending on the kind of the substituent concerned. For example, the proportion in a case where the substituent is an alkyl group is preferably from 10 to 100%, more preferably from 50 to 100%, especially preferably from 80 to 100%. In a case where the substituent is an aryl group, the proportion is preferably from 20 to 100%, more preferably from 70 to 100%, especially preferably from 85 to 100%.

Examples of a deuterium-substituted substituent include a $CD_3$ group, a $C_2D_5$ group, a $CD(CD_3)_2$ group, a $CD_2C_6H_5$ group, a $CD_2C_6D_5$ group, a $CH_2C_6D_5$ group, a $C(CD_3)_3$ group, a $C_6DH_4$ group (phenyl-d1 group), a $C_6D_5$ group (phenyl-d5 group), a $C_5D_4N$ group (pyridyl-d4 group), a $Si(CD_3)_3$ group and a $Si(C_6D_5)_3$ group. Of these groups, for the reason mentioned above, a $CD_3$ group, a $C_2D_5$ group, a $CD(CD_3)_2$ group, a $CD_2C_6D_5$ group, a $C(CD_3)_3$ group, a $C_6D_5$ group (phenyl-d5 group), a $C_5$ $D_4N$ group (pyridyl-d4 group), a $Si(CD_3)_3$ group and a $Si(C_6D_5)_3$ group are preferable to the others, a $CD(CD_3)_2$ group, a $C(CD_3)_3$ group, a $C_6D_5$ group (phenyl-d5 group), a $C_5D_4N$ group (pyridyl-d4 group) and a $Si(CD_3)_3$ group are more preferable to the others, and a $C(CD_3)_3$ group, a $C_6D_5$ group (phenyl-d5 group) and a $Si(CD_3)_3$ group are especially preferable to the others.

Each of $R^2$ to $R^7$, though may be either a hydrogen atom, or a deuterium atom, or the substituent as recited above, is preferably a deuterium-substituted substituent. On the indole skeleton, $R^2$ and $R^3$ are situated in the positions which are thought to be especially high in activity toward chemical reactions. So, each of $R^2$ and $R^3$ prefers being a deuterium atom or a substituent to being a hydrogen atom, and it further prefers being a substituent to being a deuterium atom. Alternatively, it is also preferable that at least either $R^2$ or $R^3$ is a substituent and the rest is a deuterium atom, and it is more preferable that $R^3$ is a substituent and $R^2$ is a deuterium atom. Among the positions of $R^4$ to $R^7$, the position thought to be higher in activity toward chemical reactions is the position of $R^5$. Although the position of $R^5$ is thought to be lower in activity than the positions of $R^2$ and $R^3$, $R^5$ prefers being a deuterium atom or a substituent to being a hydrogen atom.

Each of the compounds represented by the formula (I) for use in the invention plays a function of transporting electric charge (electron/hole) in an organic electroluminescence device. In particular, it is expected that the compounds have high capability for transport of holes. Since the function is thought to be played mainly by the moiety of the indole structure in each of the compounds represented by the formula (I), it is advantageous for each compound to have a plurality of indole structures. However, the presence of too many indole structures causes an increase in molecular weight of the compound, so it is thought that problems come up during the process of forming an organic layer, e.g., by vacuum evaporation. In view of the foregoing, preferred configurations of the compound represented by the formula (I) are thought to be those formed by linking a proper number of indole structures to appropriate positions on the indole skeleton, and examples thereof include the compounds represented by the following formulae (Ia), (Ib) and (Ic), respectively.

A group of compounds which are especially preferred among the compounds represented by the formula (I) for use in the invention are represented by the following formula (Ia). The compounds represented by the formula (Ia) are illustrated below.

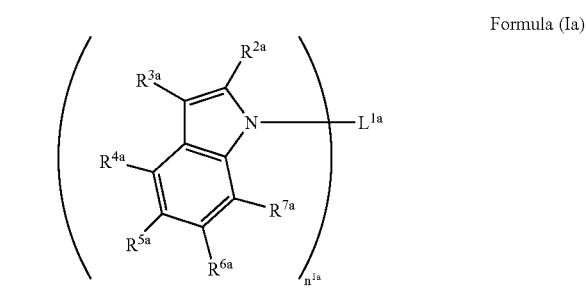

Formula (Ia)

$R^{2a}$ to $R^{7a}$ have the same meanings and preferred ranges as $R^2$ to $R^7$ of the compound represented by the formula (I) have respectively.

$n^{1a}$ stands for an integer of 2 to 6, preferably 2 to 4, more preferably 2 or 3, especially preferably 2.

$L^{1a}$ represents an $n^{1a}$-valent linking group.

Examples of the linking group represented by $L^{1a}$ include an aliphatic linking group (wherein the number of carbon atoms is preferably from 1 to 20, more preferably from 1 to 10, especially preferably from 1 to 6, and as examples of the divalent linking group are included a methylene group, a dimethylmethylene group, a diphenylmethylene group, a fluorenediyl group, an ethylene group and a cyclohexanediyl group, while as examples of the trivalent linking group are included a methine group, a methylmethine group, a phenylmethine group and a terrt-butylmethine group), a linking group derived from an aromatic ring (which has preferably 6 to 20, more preferably 6 to 10, especially preferably 6 to 8, carbon atoms, with examples including arylene groups containing a benzene ring, a naphthalene ring, an anthracene ring, a pyrene ring and a triphenylene ring), a linking group derived from a heteroaromatic ring (which has as its hetero atom preferably a nitrogen atom, a sulfur atom or an oxygen atom, more preferably a sulfur atom or a nitrogen atom, especially preferably a nitrogen atom, with examples including heteroarylene groups containing a pyridine ring, a pyrimidine ring, a pyrazine ring, a triazine ring, a thiophene ring, a dibenzothiophene ring, a furan ring and a dibenzofuran ring), a linking group derived from a silyl group (examples of which include a dimethylsilylene group, a diphenylsilylene group, a methylphenylsilylene group and a divalent group derived from silole as the divalent linking groups, a methylsilylidyne group, a phenylsilylidyne group and a tert-butylsilylidyne group as the trivalent linking groups, and the tetravalent group derived from a silyl group), a linking group derived from an amino group (examples of which include a methylimino group, a phenylimino group and a tert-butylimino group as the divalent linking groups, and a nitrilo group as the trivalent linking group), an oxy group and a thio group. These linking groups may be used in combination of any two or more thereof.

The linking group $L^{1a}$ is preferably an aliphatic linking group or a linking group derived from an aromatic ring, a heteroaromatic ring, a silyl group or an amino group, more preferably an aliphatic linking group, or a linking group derived from an aromatic or heteroaromatic ring, especially preferably an aliphatic linking group.

The aliphatic linking group is preferably a methylene group, a dimethylmethylene group, a diphenylmethylene group, a fluorene ring residue, an ethylene group, a cyclohexane ring residue, a methine group, a metylmethine group, a phenylmethine group or a tert-butylmethine group, more preferably a methylene group, a dimethylmethylene group, a diphenylmethylene group, a fluorene ring residue, an ethylene group or a cyclohexane ring residue, especially preferably a dimethylmethylene group.

Another group of compounds which are especially preferred among the compounds represented by the formula (I) for use in the invention are represented by the following formula (Ib). The compounds represented by the formula (Ib) are illustrated below.

Formula (Ib)

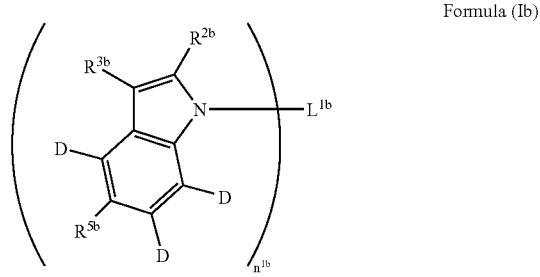

$R^{2b}$, $R^{3b}$ and $R^{5b}$ have the same meanings as $R^2$, $R^3$ and $R^5$ of the compound represented by the formula (I) have respectively.

$n^{1b}$ stands for an integer of 2 to 4.

$L^{1b}$ represents an $n^{1b}$-valent linking group.

Although $R^{2b}$, $R^{3b}$ and $R^{5b}$ have the same meanings and preferred ranges as $R^2$, $R^3$ and $R^5$ of the compound represented by the formula (I) have respectively, it is especially preferred that each of them be an alkyl group having 1 to 20 carbon atoms, an aryl group having 6 to 20 carbon atoms, a heteroaryl group having 4 to 20 carbon atoms, a silyl group having 3 to 20 carbon atoms or a deuterium atom.

Examples of the alkyl group having 1 to 20 carbon atoms include a methyl group, an ethyl group, an isopropyl group, a tert-butyl group, a cyclohexyl group, a benzyl group, a 1-adamantyl group and a trityl group.

As to the alkyl group having 1 to 20 carbon atoms, the number of carbon atoms therein is preferably from 3 to 10, more preferably from 4 to 6, especially preferably 4.

Examples of the aryl group having 6 to 20 carbon atoms include a phenyl group, a 1-naphthyl group, a 2-naphthyl group, a 1-anthracenyl group, a 2-anthracenyl group, a 9-anthracenyl group, a 1-pyrenyl group and a 2-pyrenyl group.

As to the aryl group having 6 to 20 carbon atoms, the number of carbon atoms therein is preferably from 6 to 14, more preferably from 6 to 10, especially preferably 6.

Examples of the heteroaryl group having 4 to 20 carbon atoms include nitrogen-containing heteroaryl groups, such as a 2-pyridyl group, a 3-pyridyl group, a 4-pyridyl group, a 1-quinolyl group, a 2-quinolyl group, a 1-isoquinolyl group, a 3-isoquinolyl group, a 9-carbazolyl group, a 3-carbazolyl group, a 2-imidazolyl group, a 2-benzimidazolyl group and a 1-benzimidazolyl group; sulfur-containing heteroaryl groups, such as a 2-thienyl group, a 3-thienyl group, a 2-benzothienyl group and a 3-benzothienyl group; and oxygen-containing heteroaryl groups, such as a 2-furyl group, a 3-furyl group, a 2-benzofuryl group and a 3-benzofuryl group.

As to the heteroaryl group having 4 to 20 carbon atoms, the number of carbon atoms therein is preferably from 5 to 12, more preferably from 5 to 9, especially preferably 5.

When $R^{2b}$ and $R^{3b}$ are looked upon as a combination, it is preferable that each of them is chosen from alkyl groups, aryl groups or a deuterium atom. And it is more preferable that the $R^{2b}$-$R^{3b}$ combination is chosen from combinations of alkyl groups with a deuterium atom or combinations of aryl groups with a deuterium atom. In particular, a choice from combinations of alkyl groups with a deuterium atom is advantageous to the $R^{2b}$-$R^{3b}$ combination.

$n^{1b}$ stands for an integer of 2 to 4, preferably 2 or 3, more preferably 2. $L^{1b}$ represents an $n^{1b}$-valent linking group containing an aromatic ring or a heteroaromatic ring.

$L^{1b}$ has the same meaning as $L^{1a}$ in the compound represented by the formula (Ia) has.

Examples of an aromatic ring contained in $L^{1b}$ include benzene, naphthalene, biphenyl, fluorene, anthracene, pyrene and triphenylene. The number of carbon atoms in the aromatic ring is preferably from 6 to 20, more preferably from 6 to 12, especially preferably 6.

When $L^{1b}$ has a benzene structure, examples of the linking group as $L^{1b}$ include 1,2-phenylene, 1,3-phenylene, 1,4-phenylene, 1,3,5-benzenetriyl and 1,2,4-benzenetriyl. Of these groups, 1,3-phenylene, 1,4-phenylene and 1,3,5-benzenetriyl are preferred over the others, 1,3-phenylene and 1,4-phenylene are more preferred, and 1,3-phenylene is especially preferred.

When $L^{1b}$ has a biphenyl structure, examples of a combination of linking positions on the biphenyl skeleton include combinations of the 2- and 2'-positions, the 3- and 3'-positions, the 4- and 4'-positions, the 3- and 5-positions and the 3-, 3'-, 5- and 5'-positions. Of these combinations, the combinations of the 3- and 3'-positions, the 4- and 4'-positions and the 3-, 3'-, 5- and 5'-positions are preferred over the others, the combinations of the 3- and 3'-positions and the 4- and 4'-positions are more preferred, and the combination of the 4- and 4'-positions (namely 4,4'-biphenylylene) is especially preferred.

The hetero atom in the heteroaromatic ring which $L^{1b}$ contains is preferably a nitrogen atom, a sulfur atom or an oxygen atom, more preferably a sulfur atom or a nitrogen atom, especially preferably a nitrogen atom. Examples of the heteroaromatic ring contained in $L^{1b}$ include pyridine, pyrimidine, pyrazine, triazine, thiophene, dibenzothiophene, furan, dibenzofuran and carbazole. The number of carbon atoms in the heteroaromatic ring is preferably from 5 to 20, more preferably from 6 to 10, especially preferably 5.

When $L^{1b}$ has a pyridine structure, examples of a combination of linking positions on the pyridine skeleton include combinations of the 2- and 6-positions, the 3- and 5-positions, the 2- and 5-positions, the 2-, 4- and 6-positions and the 2-, 3-, 5- and 6-positions. Of these combinations, the combinations of the 2- and 6-positions, the 3- and 5-positions and the 2-, 4- and 6-positions are preferred over the others, the combinations of the 2- and 6-positions and the 3- and 5-positions are more preferred, and the combination of the 2- and 6-positions is especially preferred.

Still another group of compounds which are especially preferred among the compounds represented by the formula (I) for use in the invention are represented by the following formula (Ic).

(Ind)n-L                      Formula (Ic)

In the formula (Ic), Ind represents a residue structure of the compound represented by the formula (I), L represents a linking group bound to the 2- or 3-position of the indole ring in the compound represented by the formula (I), and n stands for an integer of 2 or greater.

The compounds represented by the formula (Ic) are illustrated below.

In the formula (Ic), Ind represents a residue structure of the compound represented by the formula (I), and it has the same preferred scope as the residue structure of the compound represented by the formula (I) has.

In the formula (Ic), n stands for an integer of 2 or greater, preferably 2 to 4, more preferably 2 or 3, especially preferably 2.

In the formula (Ic), L represents an n-valent linking group bonding to the 2- or 3-position of the indole ring of the compound represented by the formula (I). The position at which Ind is bound to L is the 2- or 3-position, preferably the 3-position.

Examples of the linking group represented by L include an aliphatic linking group (wherein the number of carbon atoms is preferably from 1 to 20, more preferably from 1 to 10, especially preferably from 1 to 6, and as examples of the divalent linking group are included a methylene group, a dimethylmethylene group, a diphenylmethylene group, an ethylene group and a cyclohexanediyl group, while as examples of the trivalent linking group are included a methine group, a methylmethine group, a phenylmethine group and a terrt-butylmethine group), a linking group derived from an aromatic ring (which has preferably 6 to 20, more preferably 6 to 10, especially preferably 6 to 8, carbon atoms, with examples including arylene groups containing a benzene ring, a naphthalene ring, an anthracene ring, a pyrene ring and a triphenylene ring), a linking group derived from a heteroaromatic ring (which has as its hetero atom preferably a nitrogen atom, a sulfur atom or an oxygen atom, more preferably a sulfur atom or a nitrogen atom, especially preferably a nitrogen atom, with examples including heteroarylene groups containing a pyridine ring, a pyrimidine ring, a pyrazine ring, a triazine ring, a thiophene ring, a dibenzothiophene ring, a furan ring and a dibenzofuran ring), a linking group derived from a silyl group (examples of which include a dimethylsilylene group, a diphenylsilylene group, a methylphenylsilylene group and the group derived from silole as the divalent linking groups, a methylsilylidyne group, a phenylsilylidyne group and a tert-butylsilylidyne group as the trivalent linking groups, and the tetravalent linking group derived from a silyl group), a linking group derived from an amino group (examples of which include a methylimino group, a phenylimino group and a tert-butylimino group as the divalent linking groups, and a nitrilo group as the trivalent linking group), an oxy group and a thio group. These linking groups may be used in combination of any two or more thereof. In addition, n-valent substituents formed by removing hydrogen atoms from the substituent represented by $R^1$ may be included in examples of a linking group represented by L.

The linking group represented by L is preferably an aliphatic linking group, and a linking group derived from an aromatic ring, a heteroaromatic ring or a silyl group, more preferably an aliphatic linking group or a linking group derived from an aromatic ring, especially preferably an aliphatic linking group.

The aliphatic linking group is preferably a methylene group, a dimethylmethylene group, a 2,2-adamantyl group, a 1,1-cyclohexanediyl group, a 1,1-cyclopentanediyl group, a 9,9-fluorenediyl group, a diphenylmethylene group, an ethylene group, a 1,2-cis-cyclohexanediyl group, a 1,2-trans-cyclohexanediyl group, a 1,4-cis-cyclohexanediyl group or a 1,4-trans-cyclohexanediyl group, more preferably a dimethylmethylene group, a 2,2-adamantyl group, a 1,1-cyclohexanediyl group, a 1,1-cyclopentanediyl group, a 9,9-fluorenediyl group or a diphenylmethylene group, especially preferably a dimethylmethylene group, a 9,9-fluorenediyl group or a diphenylmethylene group.

The compound of the invention represented by the formula (I) may be a low molecular compound, an oligomer compound, or a polymer compound (having a mass average molecular weight (in terms of polystyrene) of preferably from 1000 to 5000000, more preferably from 2000 to 1000000, still more preferably from 3000 to 100000) having, in the main chain or a side chain thereof, the structure represented by the formula (I) insofar as the compound satisfies the above-described ratio of deuterium atoms and hydrogen atoms in the invention. The compound of the invention represented by the formula (I) is preferably a low molecular compound.

When the compound represented by the formula (I) for use in the invention is an oligomer or polymer compound having structures represented by formula (I), the structures may be introduced in either of the main and side chains. In a case where the structures are introduced in the main chain, two or more of $R^1$ to $R^7$, preferably two or more of $R^1$, $R^3$ and $R^5$, especially $R^1$ and $R^5$, are included in the main chain, while in a case where the structures are introduced in side chains, any of $R^1$ to $R^7$, preferably either $R^1$, or $R^3$, or $R^5$, especially preferably $R^1$, is included in each of the side chains.

In the invention, the compound of the invention represented by the formula (I) may be contained in any of the organic layers without limiting its using purpose. The compound of the invention represented by the formula (I) is introduced preferably in any one or more of a light emitting layer, a hole injection layer, a hole transport layer, an electron transport layer, an electron injection layer, an exciton blocking layer, and a charge blocking layer.

In the invention, the compound represented by the formula (I) is contained preferably in a light emitting layer or a layer adjacent thereto. The compound represented by the formula (I) may be contained in both a light emitting layer and a layer adjacent thereto.

The compound of the invention represented by the formula (I) is contained in a light emitting layer in an amount of preferably from 1 to 99.9 mass %, more preferably from 50 to 99.9 mass %, still more preferably from 80 to 99.9 mass %, each based on the total mass of the light emitting layer.

When the compound of the invention represented by the formula (I) is contained in a layer other than a light emitting layer, it is contained in an amount of preferably from 1 to 100 mass %, more preferably from 50 to 100 mass %, still more preferably from 80 to 100 mass %.

Examples of the compound represented by the formula (I) are illustrated below, but the invention should not be construed as being limited to these compounds. Additionally, each D in the following structural formulae stands for a deuterium atom. The compounds illustrated below may be used alone or as combinations of any two or more thereof. Further, each of the following compounds may be used in combination with a compound which is identical in structural formula except that some of the deuterium atoms in the structural formula are replaced by hydrogen atoms, as long as the deuterium/hydrogen ratio falls within the range specified by the invention. When each compound represented by the formula (I) is used in combination with a compound which is identical in structure except that part or all of the deuterium atoms in the structure are replaced by hydrogen atoms, it is appropriate that the proportion of the compound represented by the formula (I) in the mixture of these compounds be at least 1 mass %.

1-1

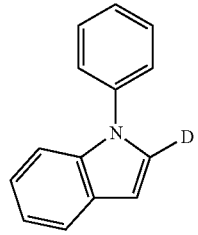

1-2

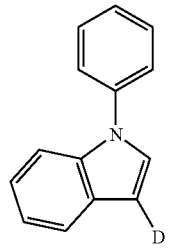

1-3

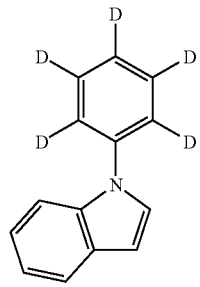

1-4

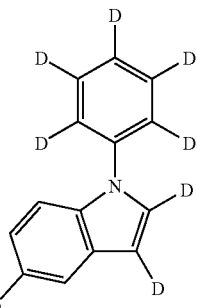

1-5

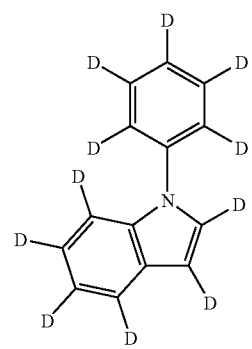

1-6

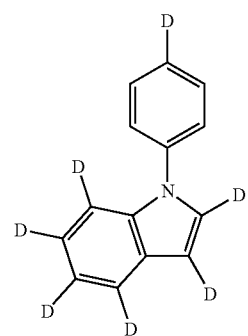

1-7

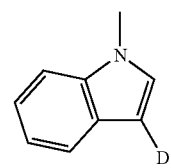

1-8

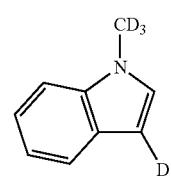

1-9

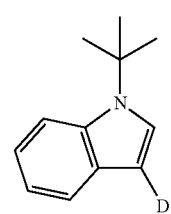

1-10
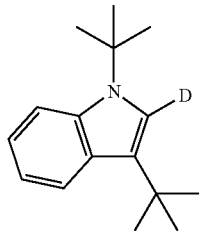
1-11
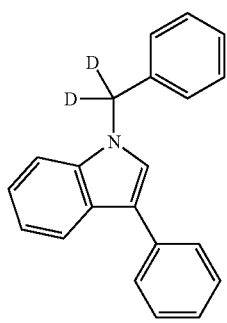
1-12
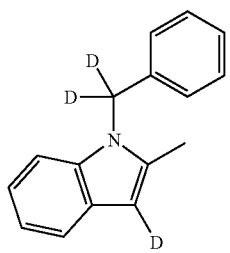
1-13
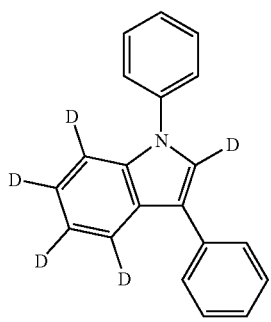
1-14
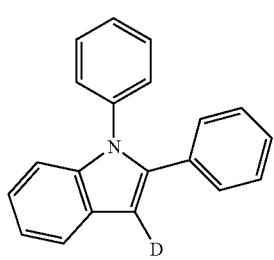
1-15
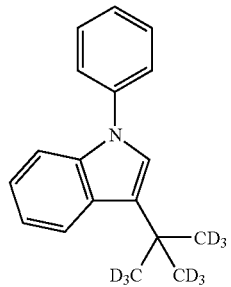
1-16
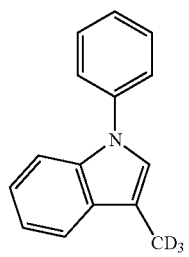
1-17
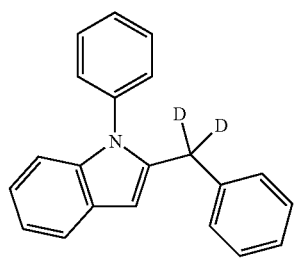
1-18
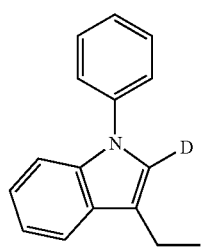
1-19
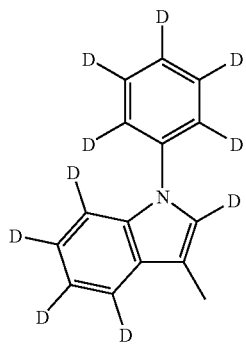

1-20 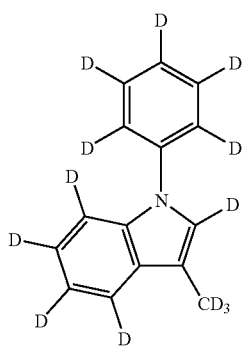
1-21 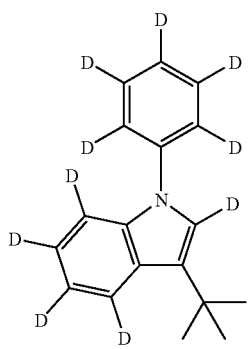
1-22 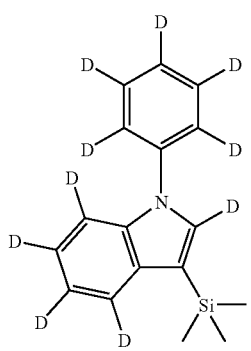
1-23 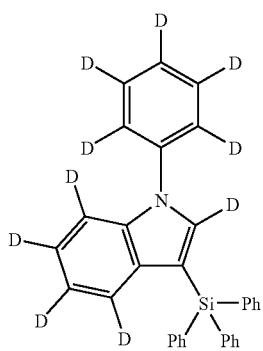
1-24 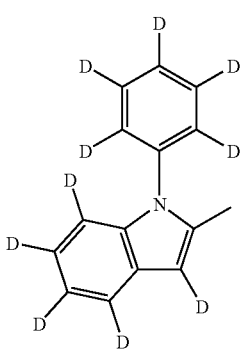
1-25 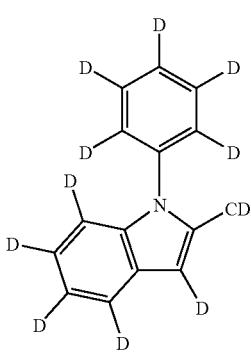
1-26 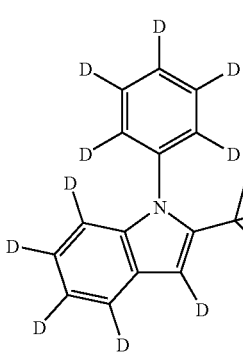
1-27 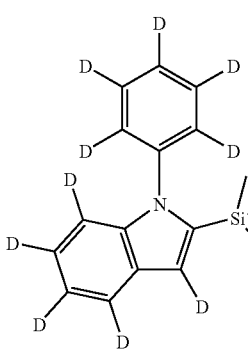

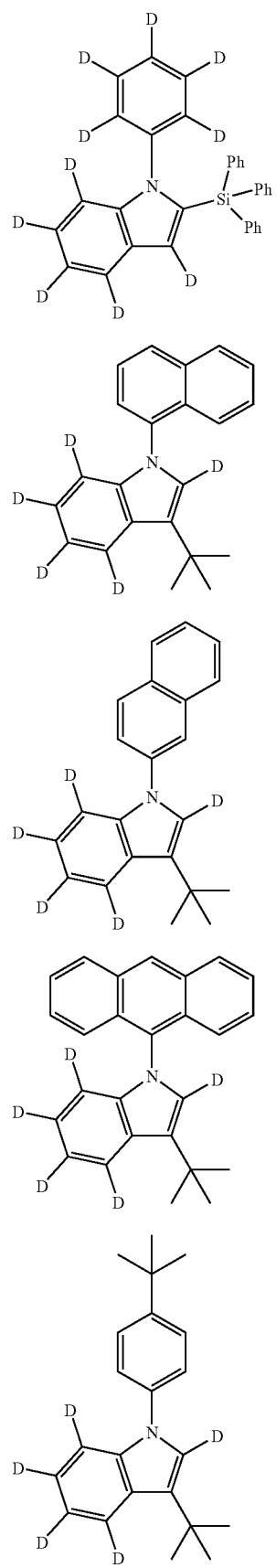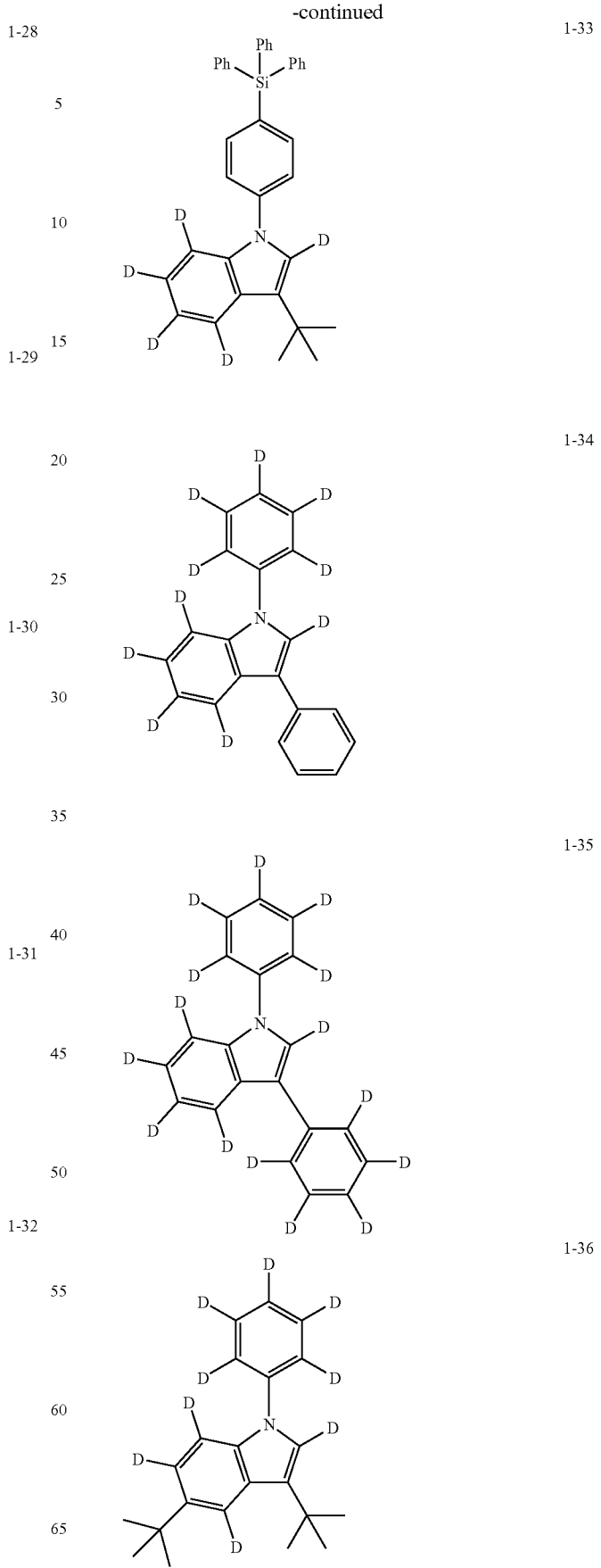

1-37
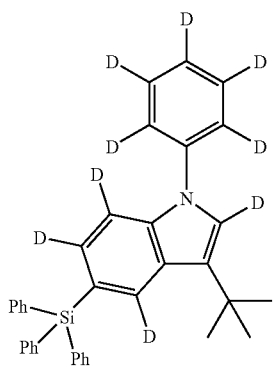
1-38
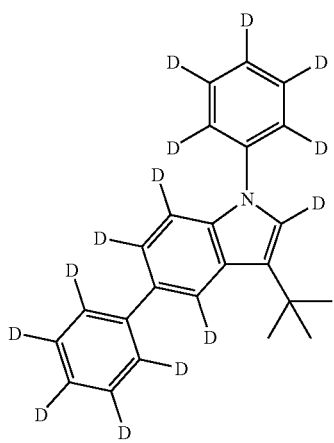
2-1
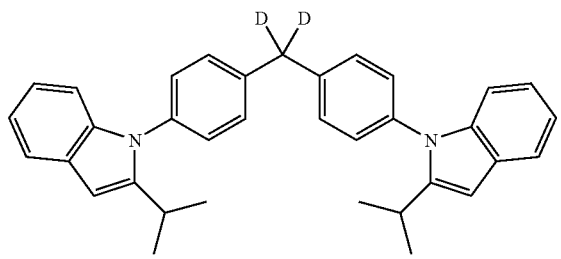
2-2
2-3
2-4
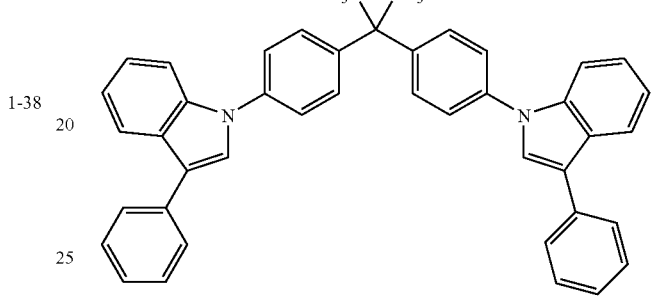
2-5
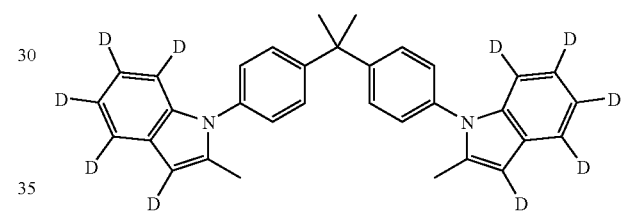
2-6
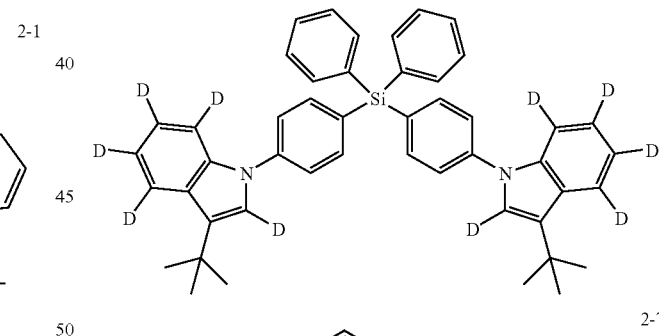
2-7
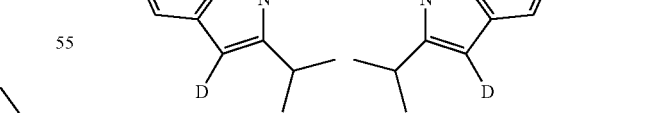
2-8
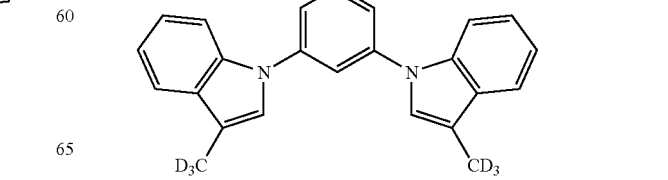

2-9
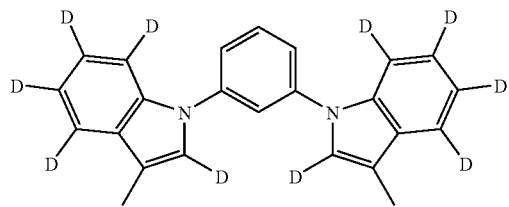
2-10
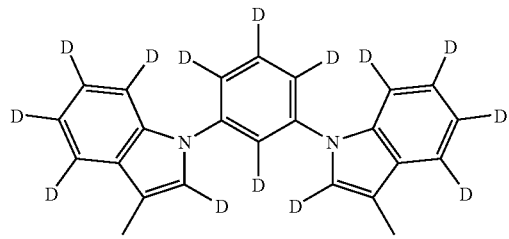
2-11
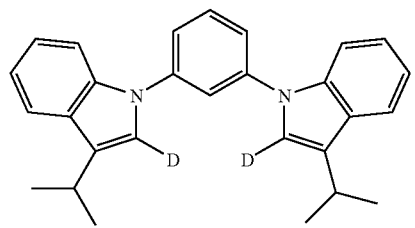
2-12
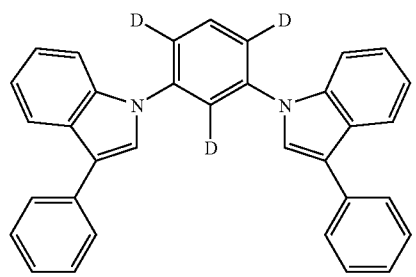
2-13
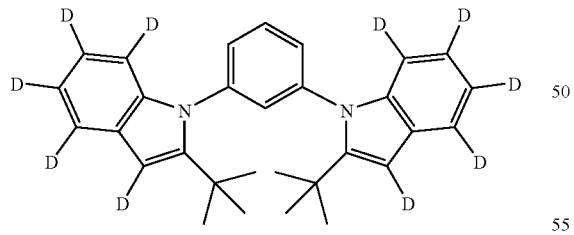
2-14
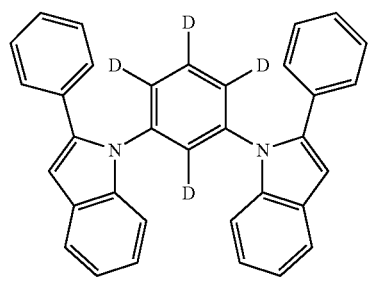
2-15
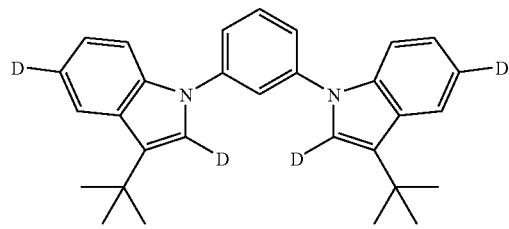
2-16
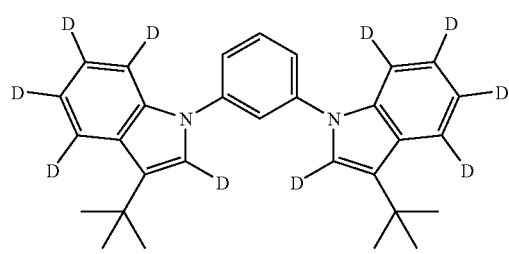
2-17
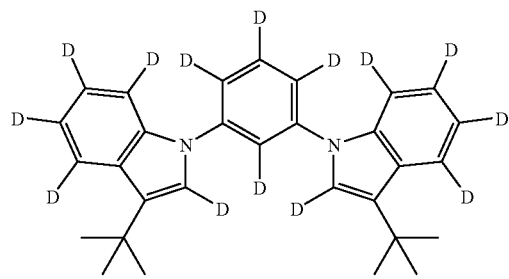
2-18
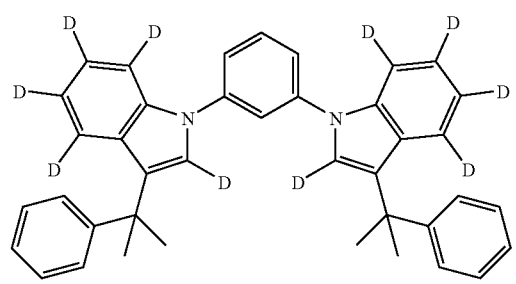
2-19
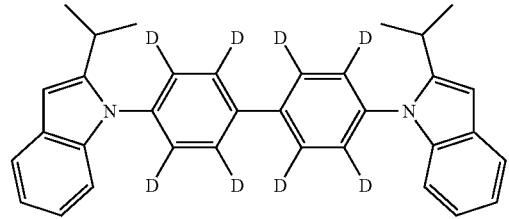
2-20
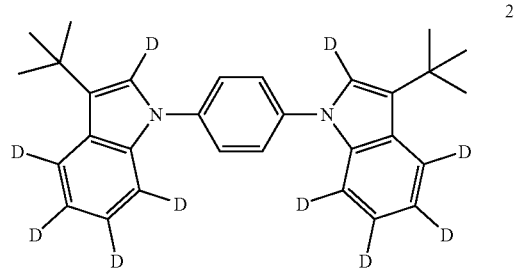

2-21
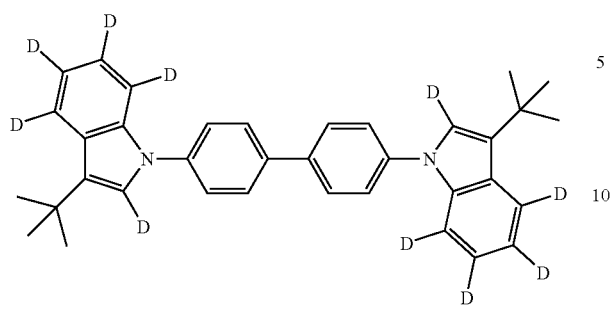
2-22
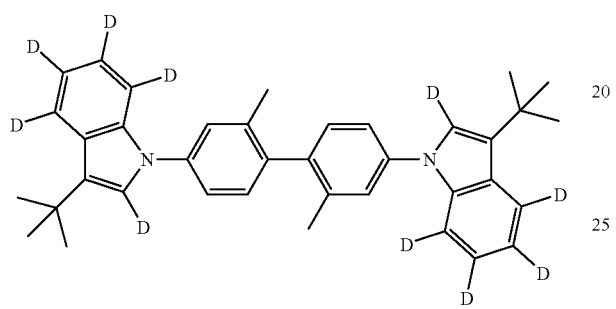
2-23
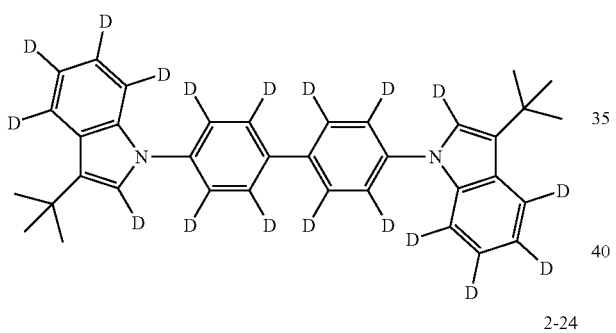
2-24
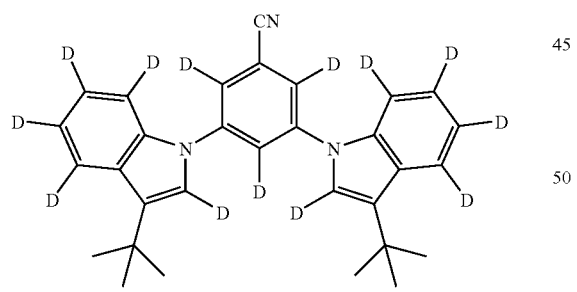
2-25
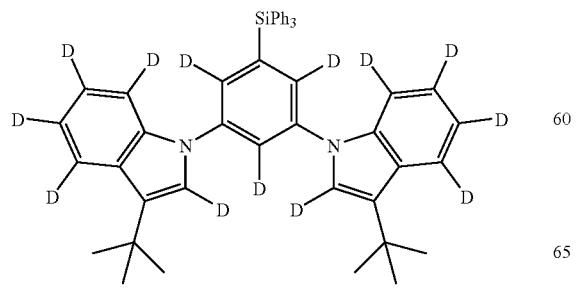
2-26
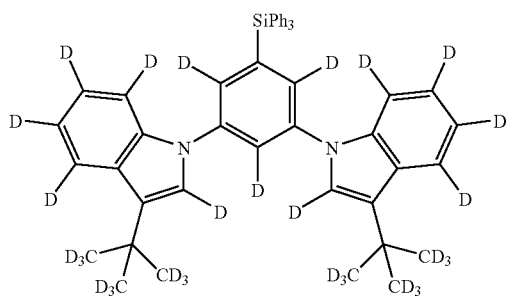
2-27
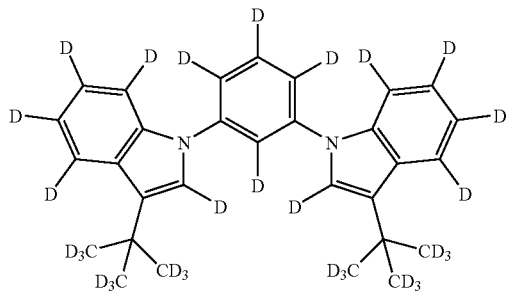
2-28
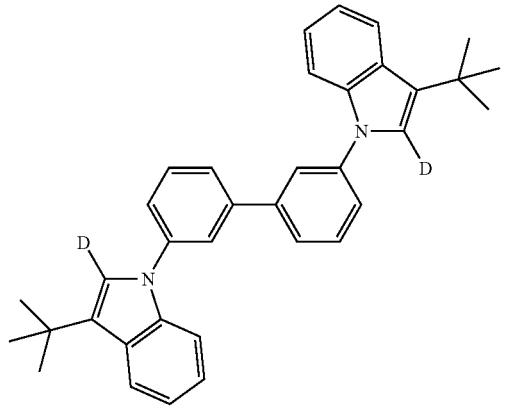
2-29
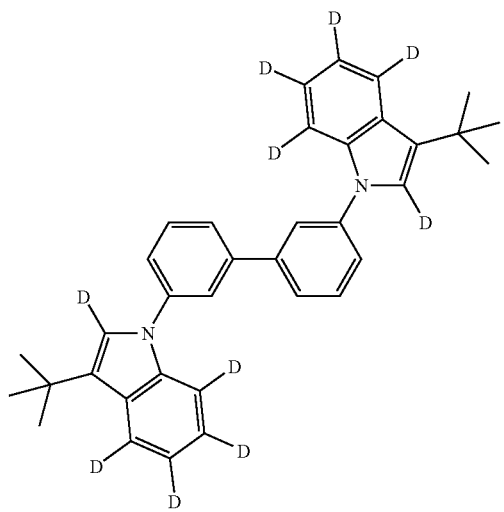

2-30
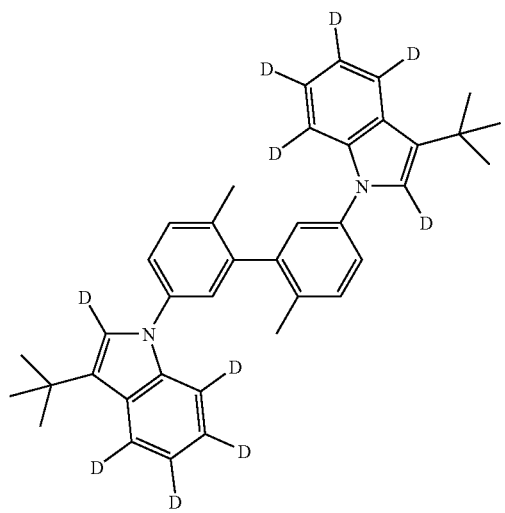
2-31
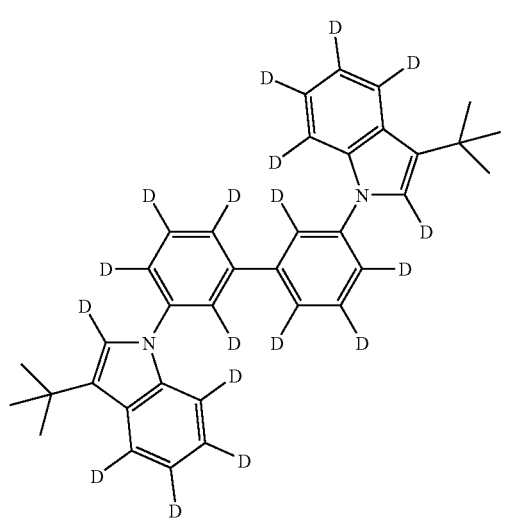
2-32
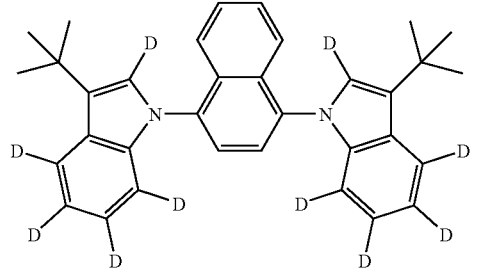
2-33
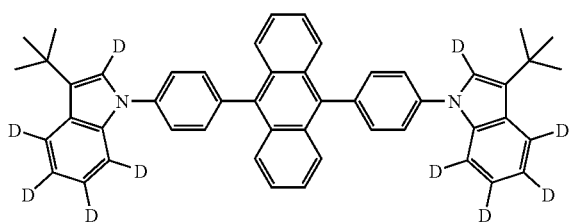
2-34
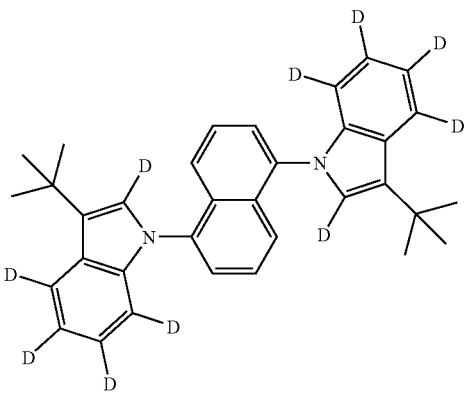
2-35
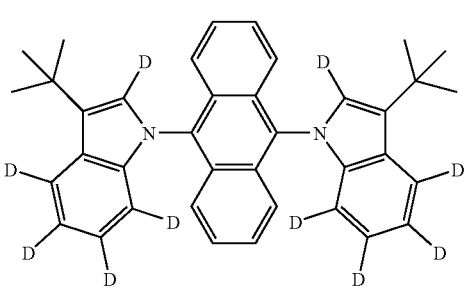
2-36
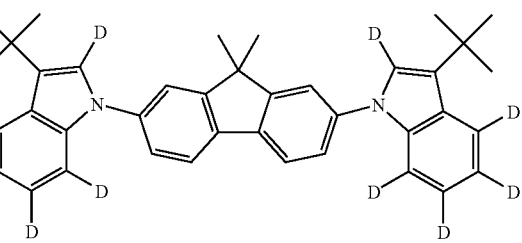
2-37
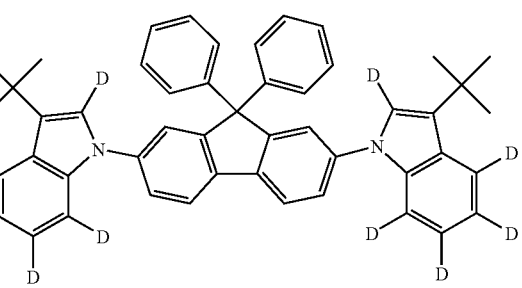

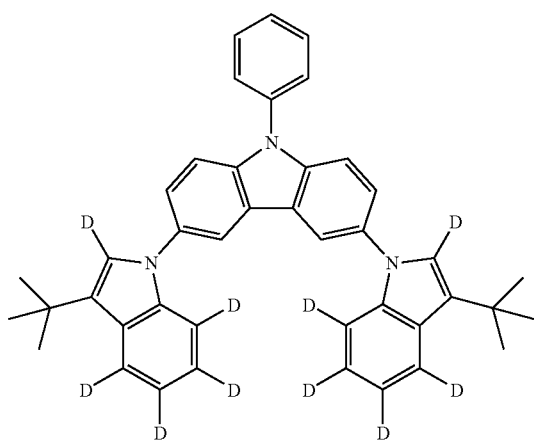
2-38
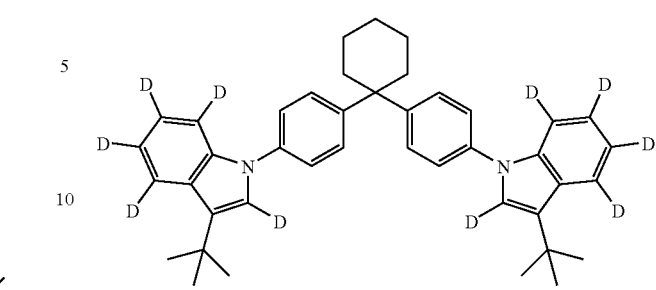
2-42
2-43
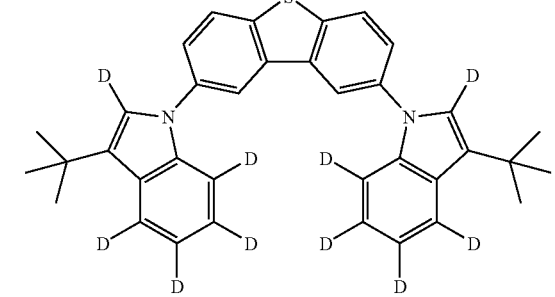
2-39
2-44
2-40
2-45
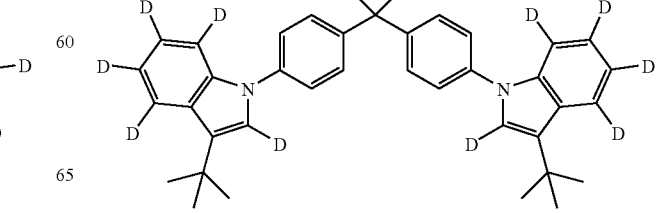
2-41
2-46

-continued
2-47
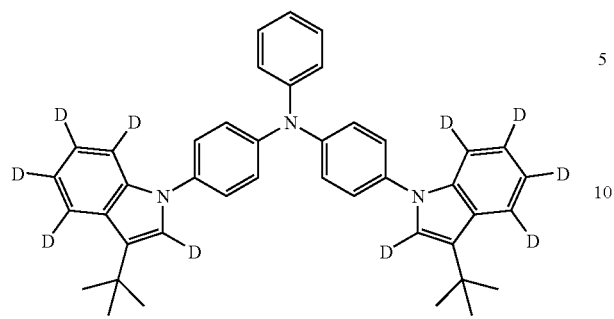
2-48
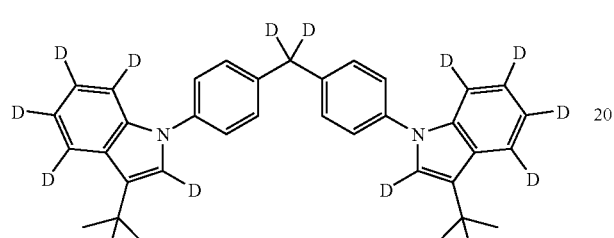
2-49
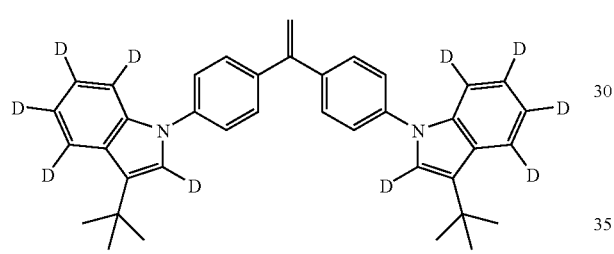
4-50
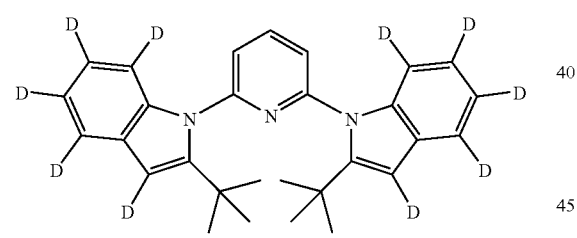
2-51
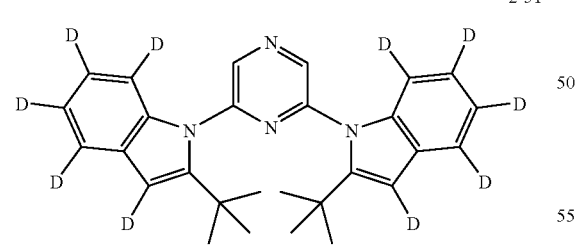
-continued
2-53
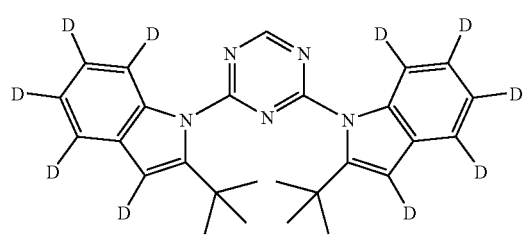
2-54
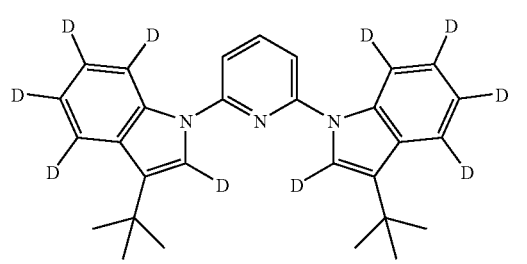
2-55
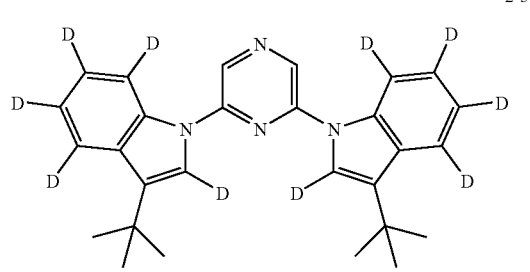
2-56
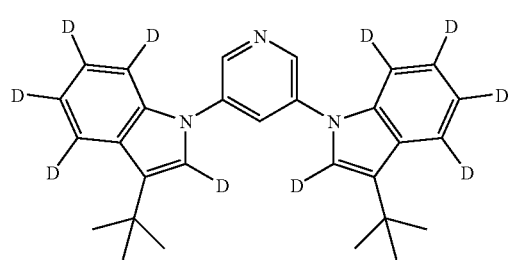
2-57
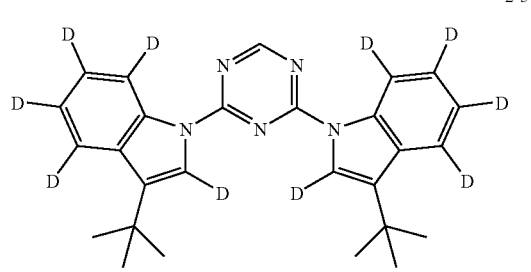
2-58
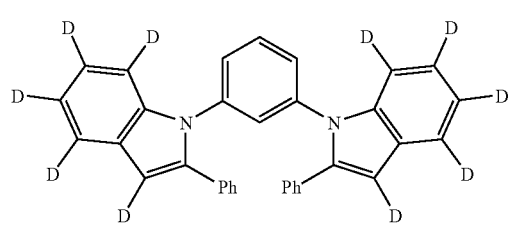
2-52

2-59
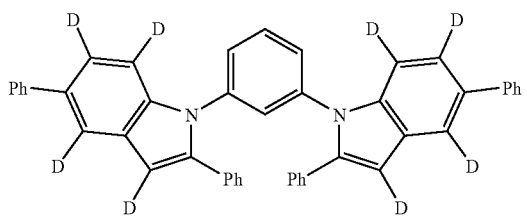
2-60
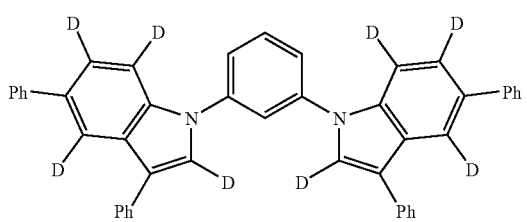
2-61
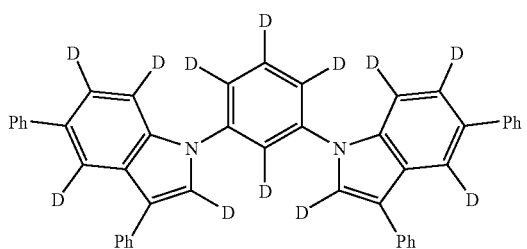
2-62
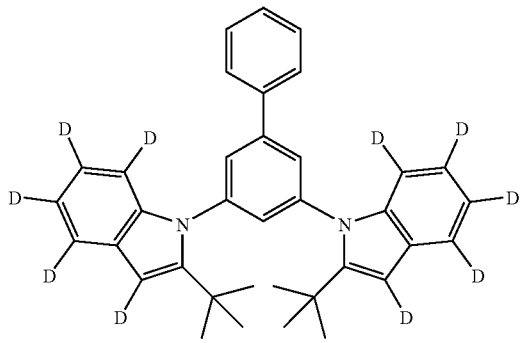
2-62
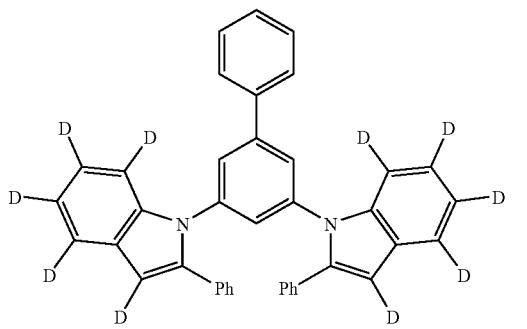
2-63
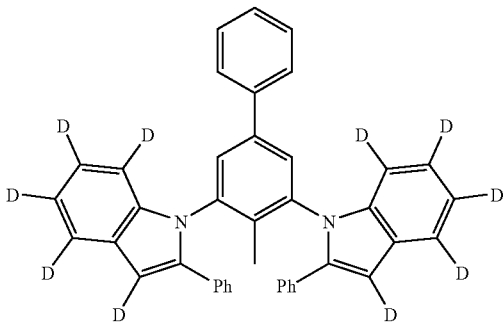
2-64
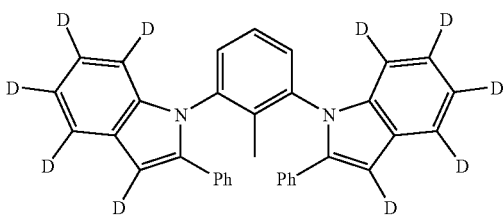
2-65
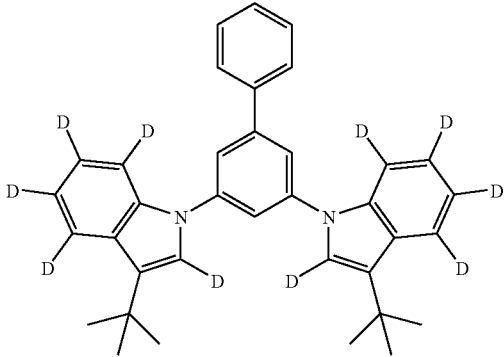
2-66
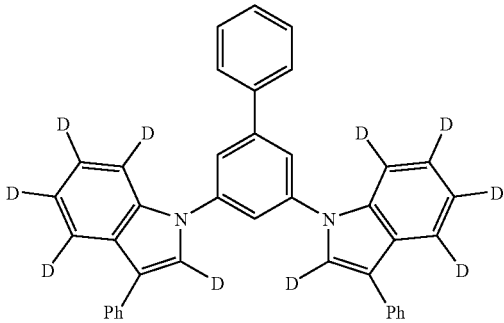
2-67
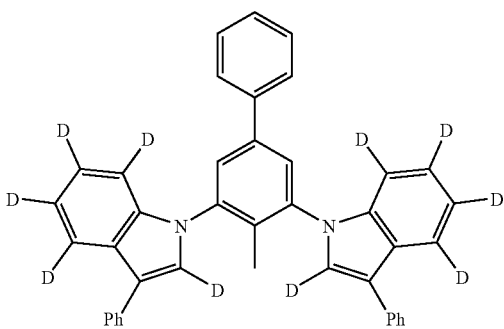

-continued
2-68
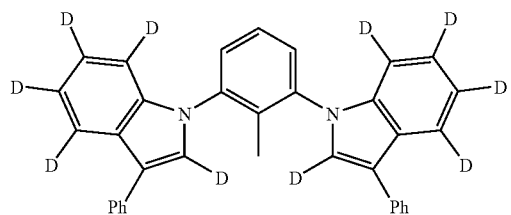
2-69
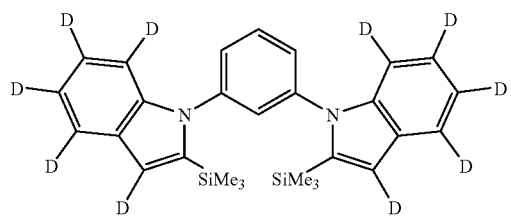
2-70
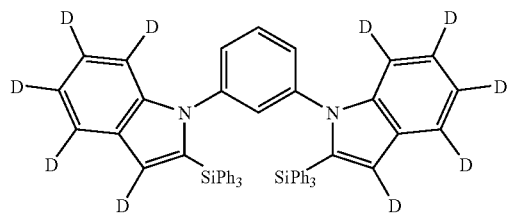
2-71
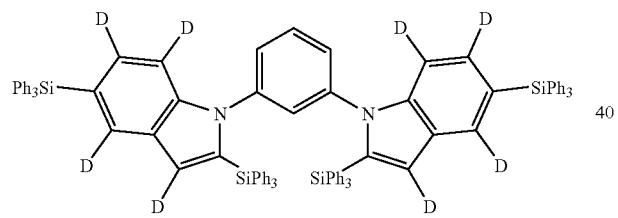
2-72
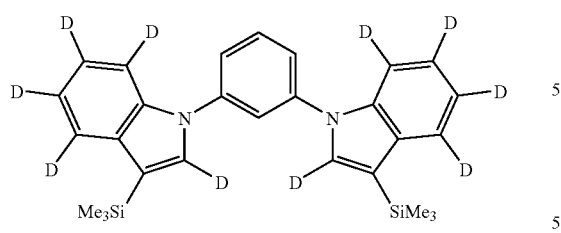
2-73
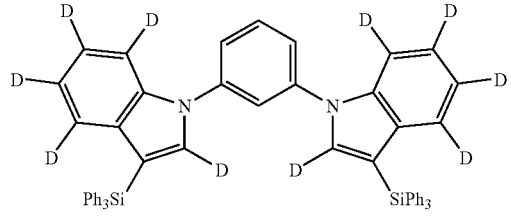
-continued
2-74
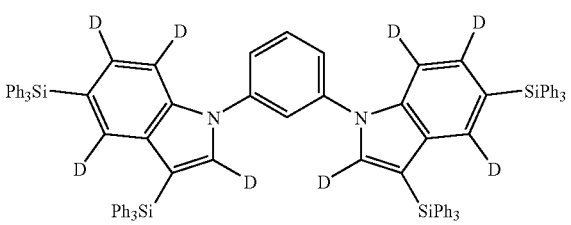
3-1
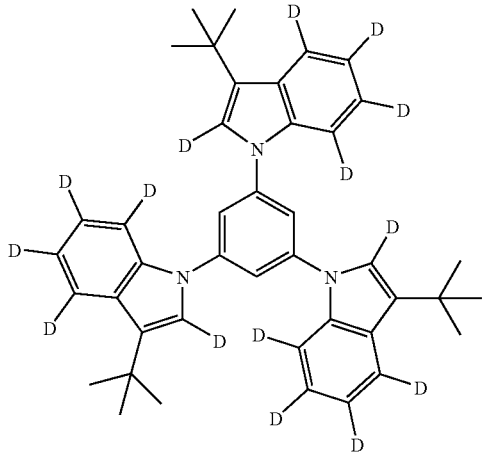
3-2
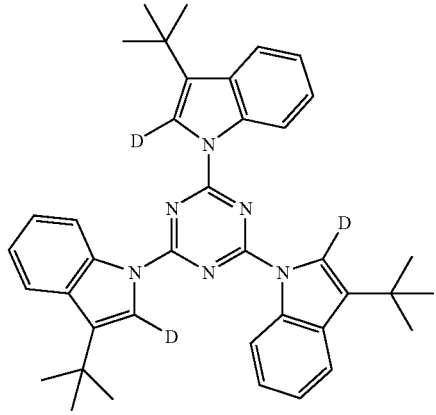
3-3
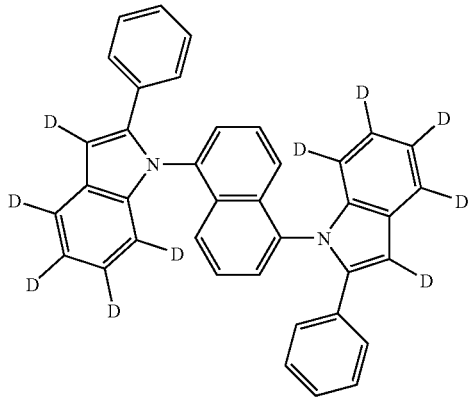

-continued
3-4
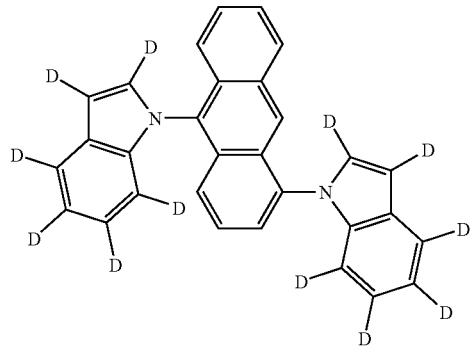
3-5
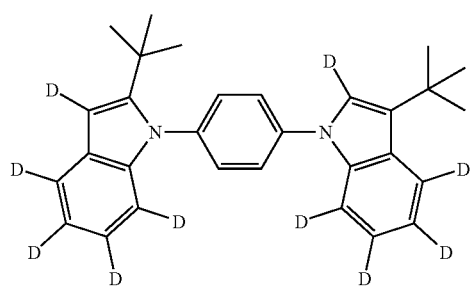
3-6
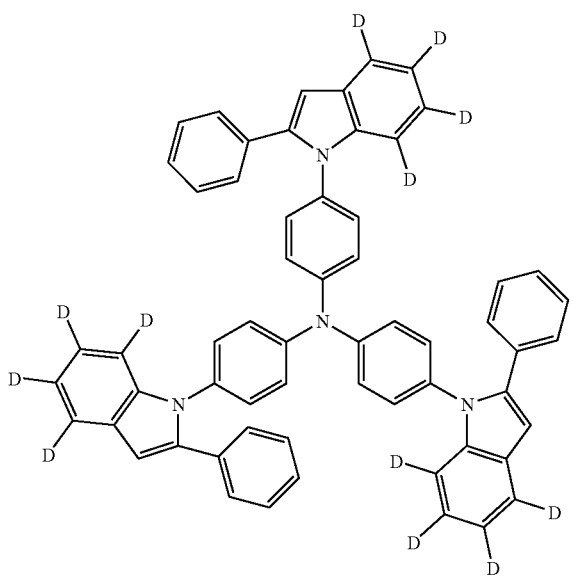
-continued
3-7
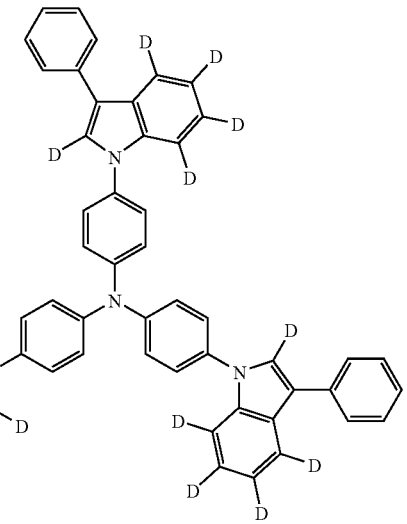
3-8
3-9
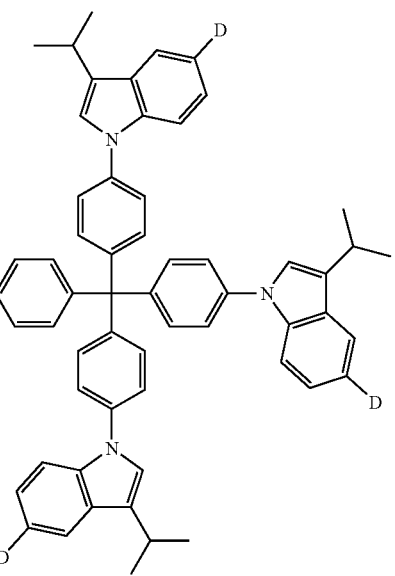

3-10
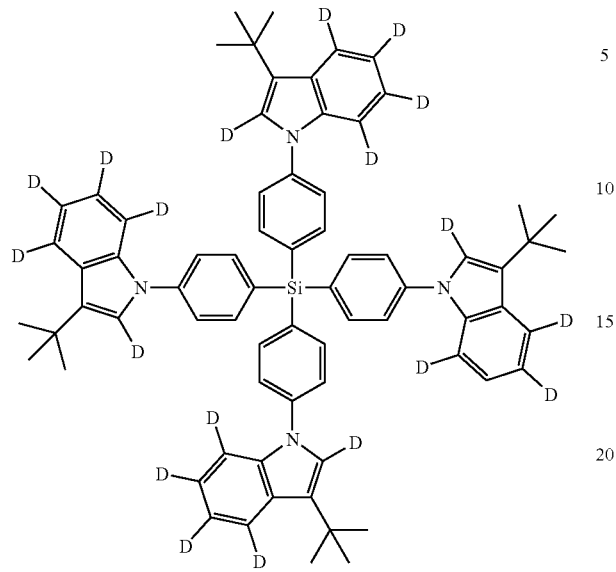
3-11
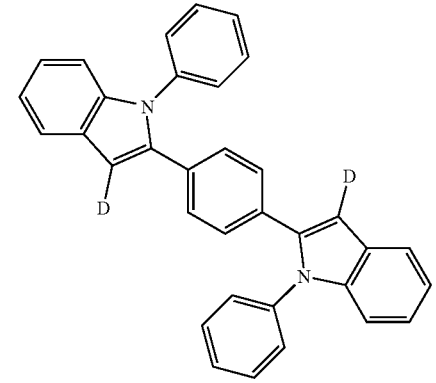
3-12
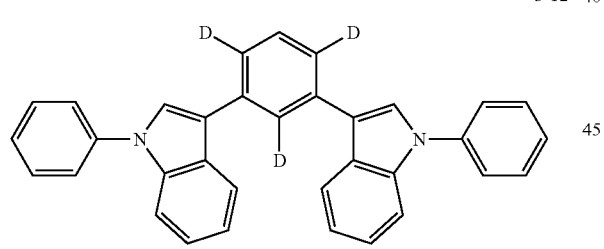
3-13
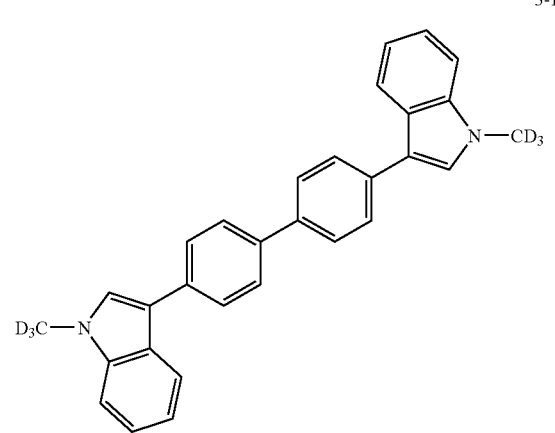
3-14
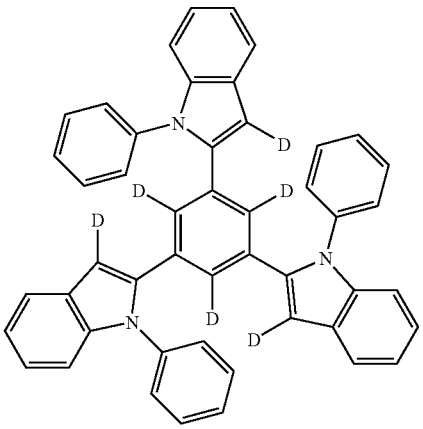
3-15
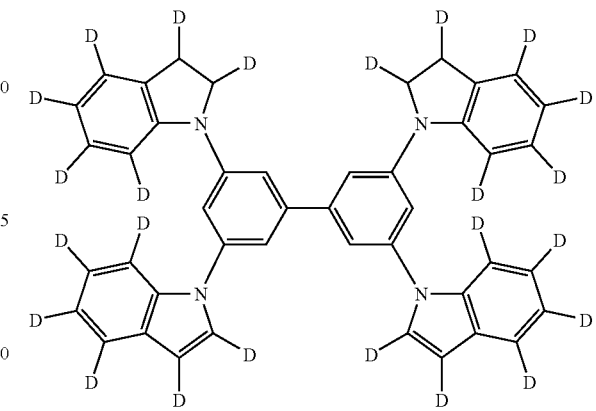
3-16
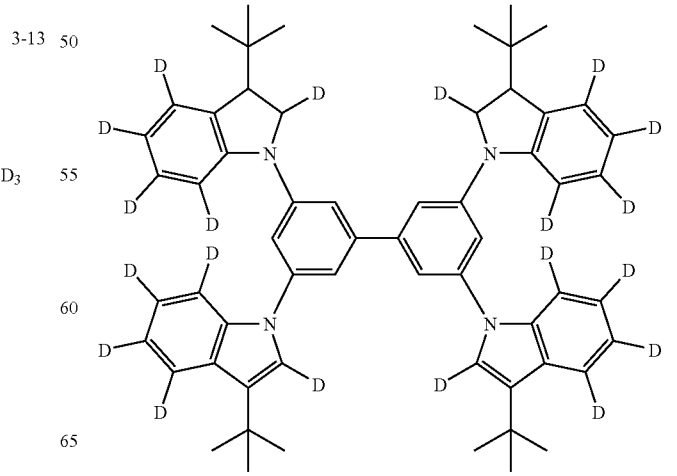

3-17
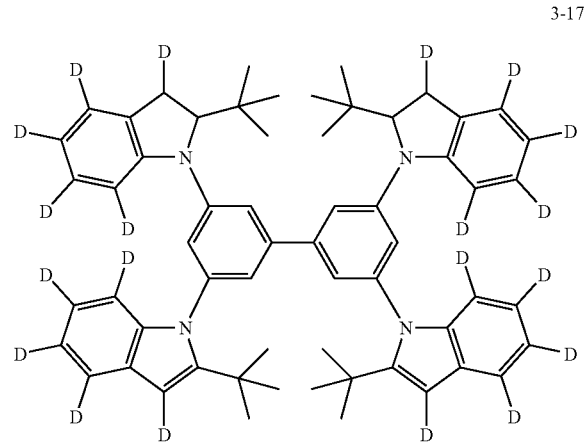
3-20
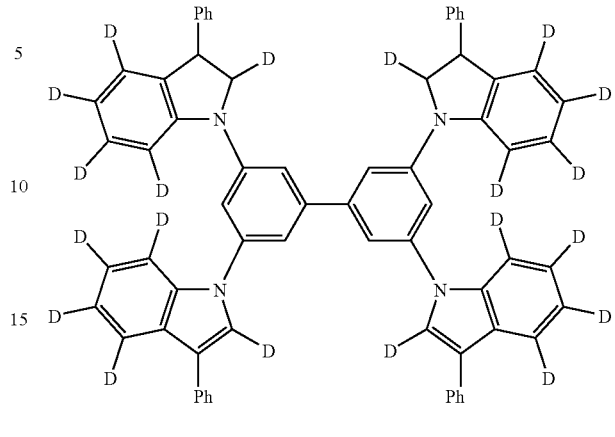
3-18
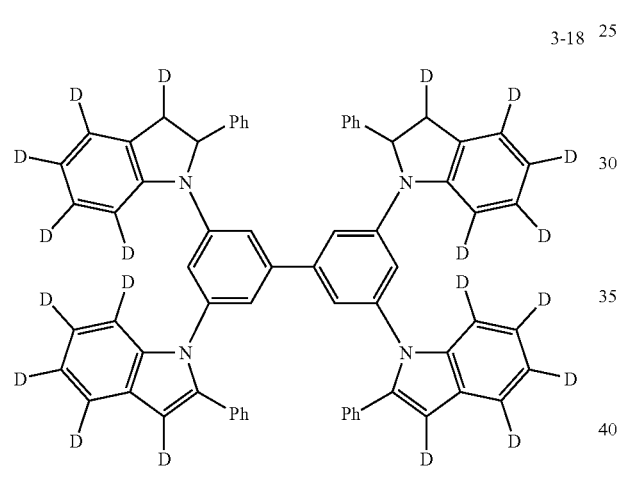
3-21
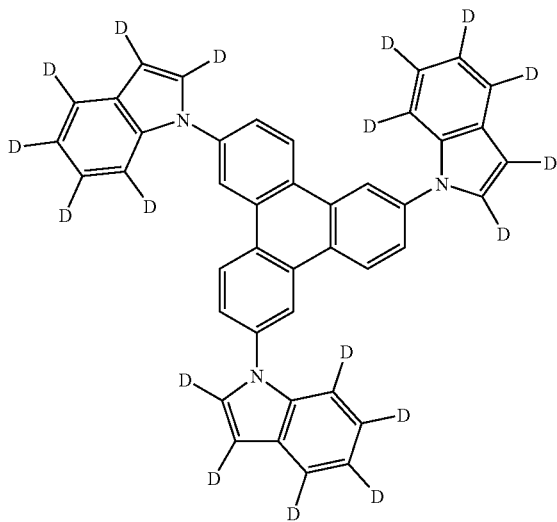
3-19
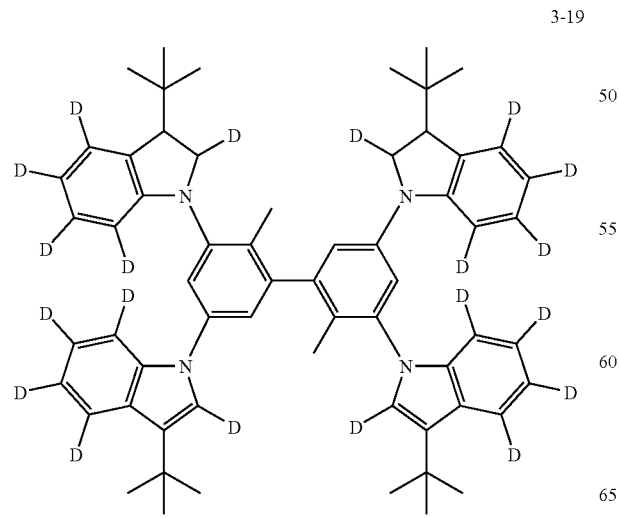
3-22
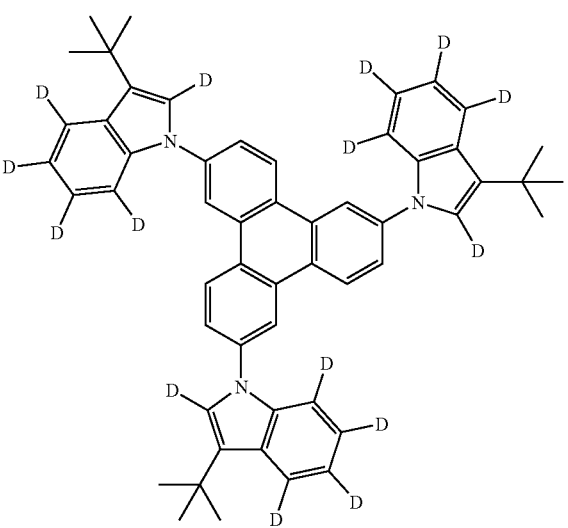

3-23
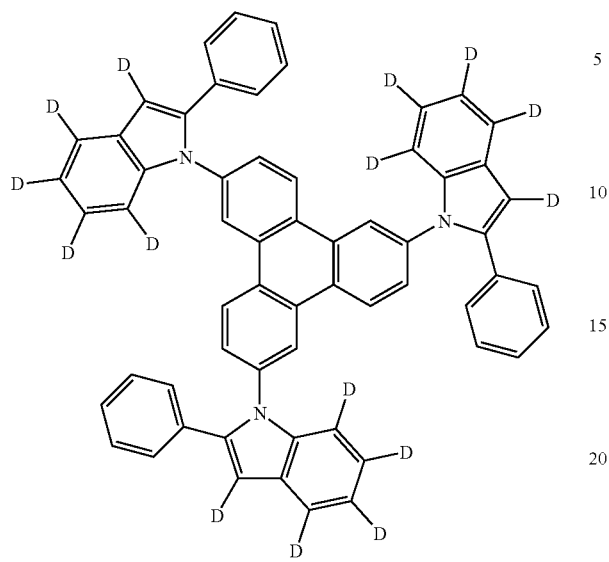
4-1
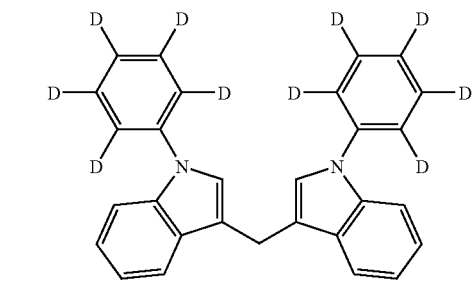
4-2
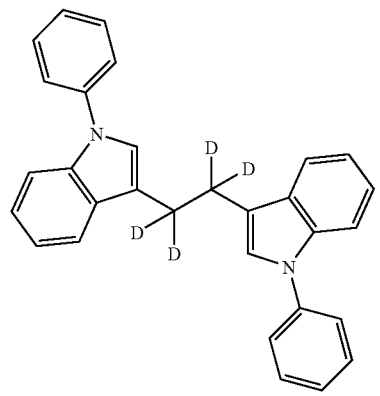
4-3
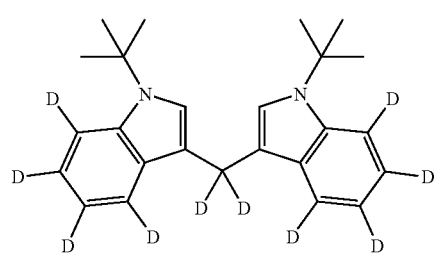
4-4
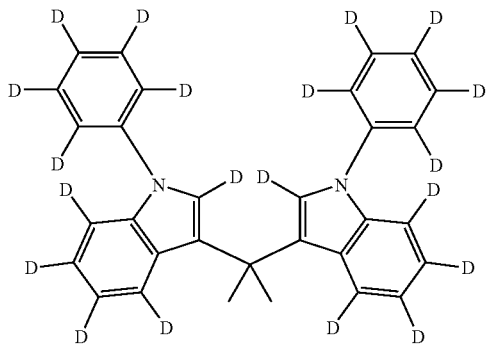
4-5
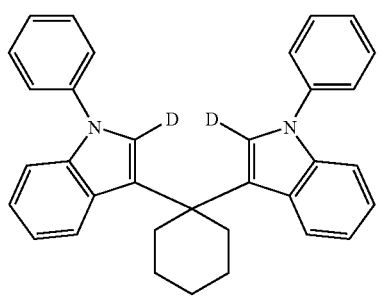
4-6
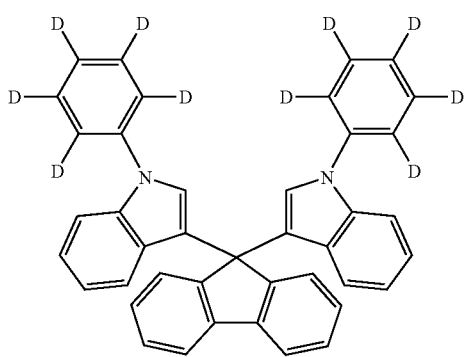
4-7
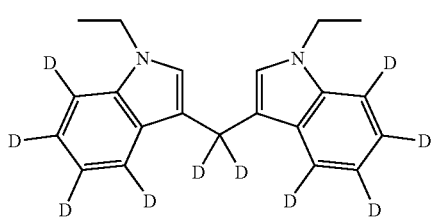
4-8
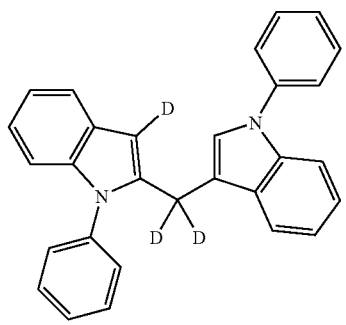

4-9
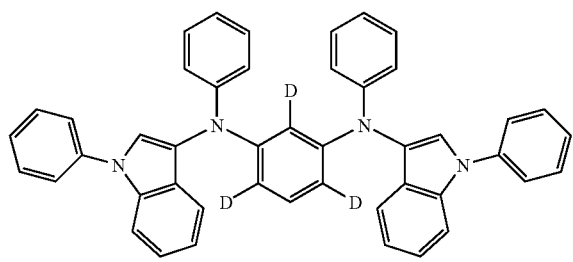
4-10
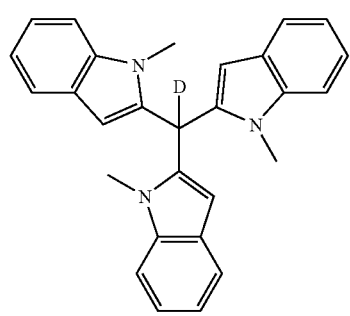
4-11
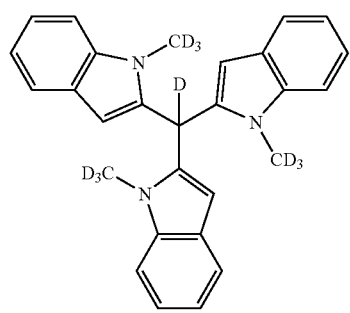
4-12
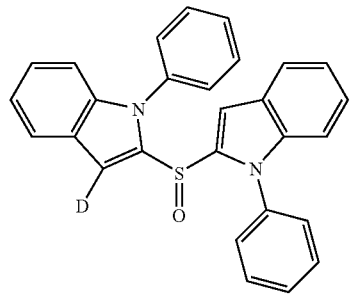
4-13
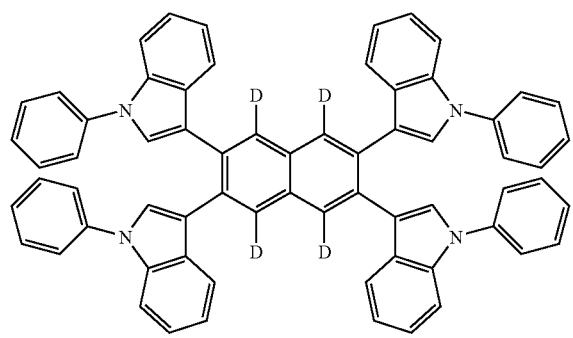
4-14
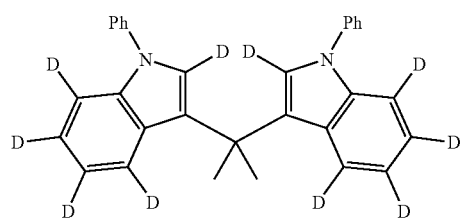
4-15
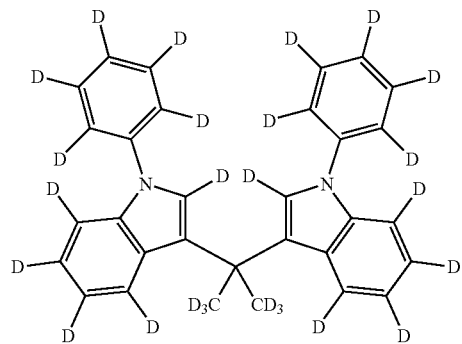
4-16
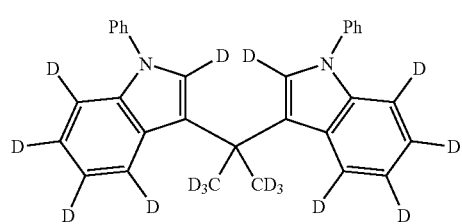
4-17
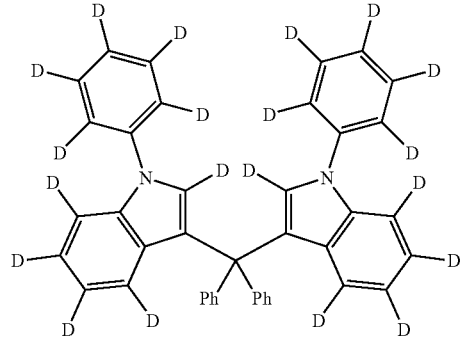
4-18
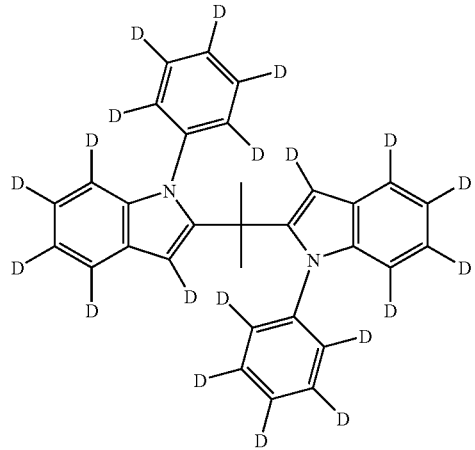

4-19
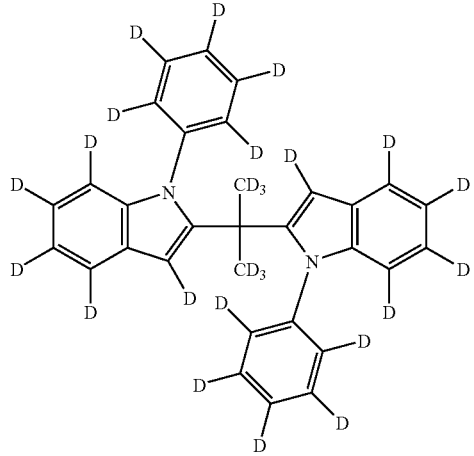
4-20
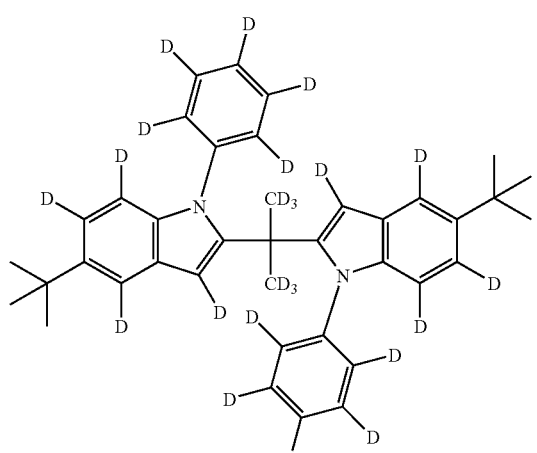
4-21
4-22
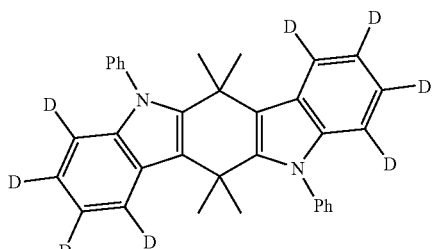
4-23
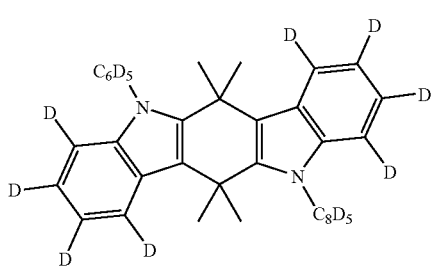
4-24
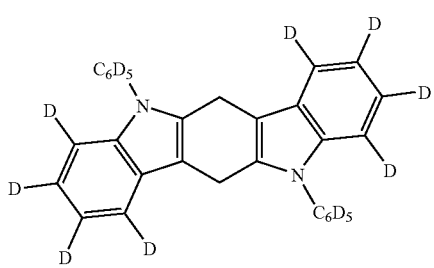
4-25
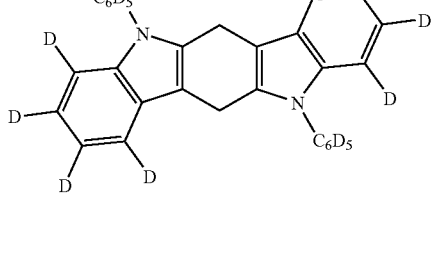
4-26
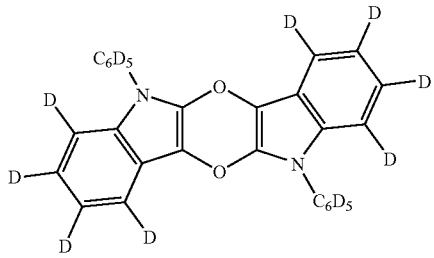
4-27
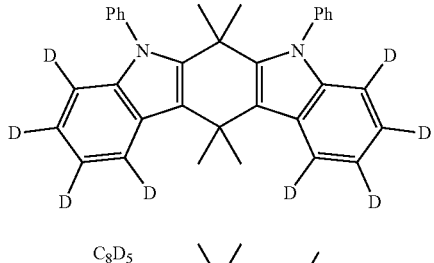
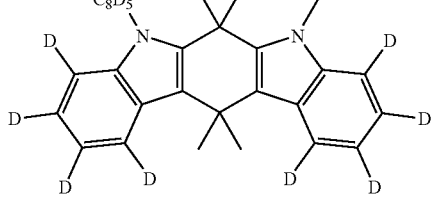

4-28

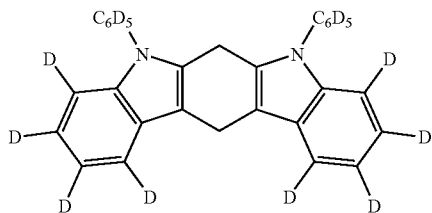

4-29

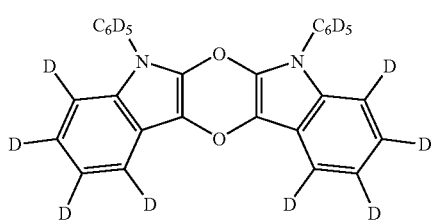

Specific examples of the polymer compound and the oligomer compound each containing the compound represented by the formula (I) will be shown below but the invention is not limited to these compounds. The polymer compound may be either a homopolymer compound or a copolymer. The copolymer may be any of a random copolymer, an alternate copolymer, and a block copolymer. In the formulas, m:n represents a molar ratio of monomers contained in the polymer, m stands for from 1 to 100, and n stands for from 0 to 99, with the proviso that m+n=100.

5-1

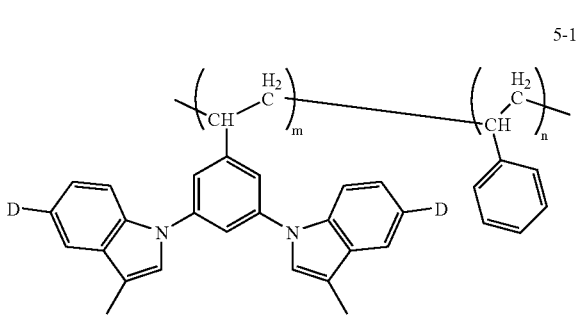

5-2

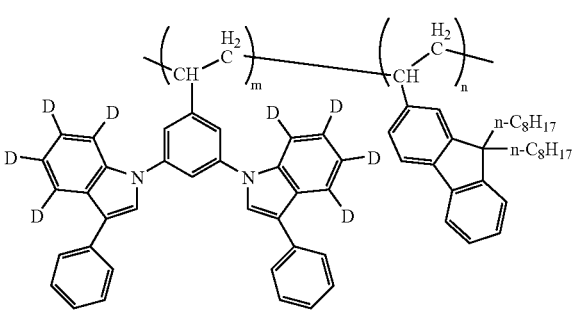

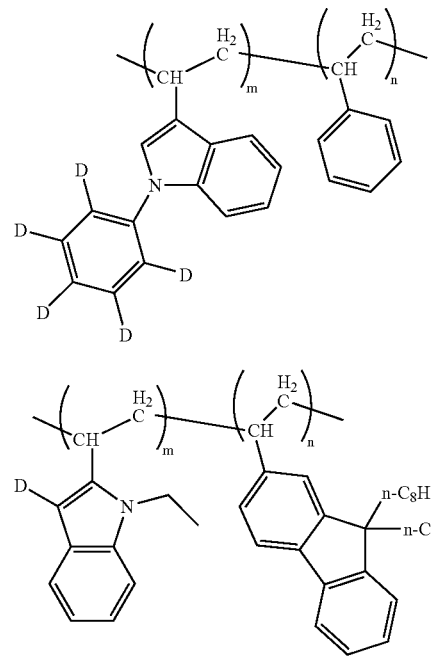

The compounds represented by the formula (I) can be synthesized by using known methods in combination. For syntheses of compounds having deuterium-free indole structures, the methods described, e.g., in *Shinpen Heterokan Kagobutsu Kisohen* (which might be translated "Newly-edited Basics of Heterocyclic Compounds"), pp. 15-60 and pp. 149-175, published by Kodansha Ltd., can be referred to. And the substitution of deuterium atom(s) for part or all of hydrogen atoms in each of those compounds can be performed by using the methods disclosed in JP-A-2004-11400 and JP-A-2004-46066. Alternatively, the deuterium-containing compounds represented by the formula (I) for use in the invention can be synthesized from deuterium-containing ingredients. Examples of a deuterium-containing ingredient include deuterobromobenzene-d5 (CAS No. 4165-57-5), deuteromethyl-d3 iodide (CAS No. 865-50-9), resorcinol-d6 which can be synthesized by the method described in *J. Am. Chem. Soc.*, vol. 126, No. 40, 13033-03043 (2004), and its sulfonate derivatives.

[Organic Electroluminescence Device]

The device of the invention will hereinafter be described specifically.

The device of the invention has a cathode and an anode on a substrate and has, between these electrodes, organic layers including a light emitting layer.

At least one of the anode and the cathode is preferably transparent judging from the nature of a luminescence device.

As a preferable stack mode of the organic layers in the invention, a hole transport layer, a light emitting layer, and an electron transport layer are stacked successively from the side of the anode. Further, the device has a hole injection layer between the hole transport layer and the anode and/or an electron transport intermediate layer between the light emitting layer and the electron transport layer. The device may have a hole transport intermediate layer between the light emitting layer and the hole transport layer. Similarly, it may have an electron injection layer between the cathode and the electron transport layer.

Each layer may be divided into a plurality of secondary layers.

Each of the organic layers can be formed desirably by any one of dry film-forming processes such as vapor deposition or sputtering, transfer process, printing process, coating process, inkjet process and spray process.

Elements constituting the device of the invention will next be described specifically.

(Substrate)

The substrate to be used in the invention preferably does not scatter or attenuate light emitted from the organic layers. Specific examples include inorganic materials such as yttria-stabilized zirconia (YSZ) and glass; and organic materials, e.g., polyesters such as polyethylene terephthalate, polybutylene terephthalate, and polyethylene naphthalate, polystyrenes, polycarbonates, polyethersulfones, polyarylates, polyimides, polycycloolefins, norbornene resins, and poly (chlorotrifluoroethylene).

When glass is used as the substrate, use of an alkali-free glass is preferred in order to minimize elution of ions from the glass. When soda lime glass is used, a barrier coated one with, for example, silica is preferred. Substrates made of the organic materials are preferred because they are excellent in heat resistance, dimensional stability, solvent resistance, electrical insulating properties, and processability.

The shape, structure, and size of the substrate are not particularly limited and can be selected as needed according to the intended use or purpose of the luminescence device. In general, the substrate is preferably in the form of a plate and may have either a single layer structure or a stacked structure. It may be made of a single member or two or more members.

Although the substrate may be either colorless and transparent or colored and transparent, a colorless and transparent substrate is preferred because such a substrate causes neither scattering nor attenuation of light emitted from the organic light emitting layer.

The substrate can have, on the surface or backside surface thereof, a moisture penetration preventing layer (gas barrier layer). As materials for the moisture penetration preventing layer (gas barrier layer), inorganic substances such as silicon nitride and silicon oxide are suited. The moisture penetration preventing layer (gas barrier layer) can be formed, for example, by RF sputtering.

When a thermoplastic substrate is used, it may have a hard coat layer or an undercoat layer further if necessary.

(Anode)

The anode is usually not particularly limited in shape, structure, or size insofar as it has a function as an electrode supplying holes to the organic layers. Materials of the anode can be selected as needed from known electrode materials, depending on the intended use or purpose of the luminescence device. As described above, the anode is usually formed as a transparent anode.

Examples of the materials of the anode include metals, alloys, metal oxides, and electroconductive compounds, and mixtures thereof. Specific examples of the anode material include electroconductive metal oxides such as tin oxides doped with antimony and fluorine (e.g., ATO and FTO), tin oxide, zinc oxide, indium oxide, indium tin oxide (ITO) and indium zinc oxide (IZO), metals such as gold, silver, chromium, and nickel, mixtures or stacks of these metals and electroconductive metal oxides; inorganic electroconductive substances such as copper iodide and copper sulfide, organic electroconductive materials such as polyaniline, polythiophene, and polypyrrole; and stacks of these materials with ITO. Among these materials, electroconductive metal oxides are preferred, with ITO being especially preferred from the viewpoint of productivity, and high conductivity, transparency.

The anode can be formed over the substrate by a process selected as needed from the wet processes such as printing and coating, physical processes such as vacuum deposition, sputtering and ion plating, and chemical processes such as CVD and plasma CVD in consideration of its suitability to the material constituting the anode. When ITO is selected as the anode material, the anode can be formed by DC sputtering, RF sputtering, vacuum deposition, or ion plating.

In the organic electroluminescence device of the invention, the formation position of the anode is not particularly limited and it can be selected as needed depending on the intended use or purpose of the luminescence device. It is however preferably formed on the substrate. In this case, the anode may be formed all over the one surface of the substrate or may be formed in a part thereof.

When the anode is formed, patterning may be performed by chemical etching using photolithography or physical etching with laser exposure. The anode may also be formed by vacuum deposition or sputtering through stacked masks, a lift-off process, or a printing process.

Although the thickness of the anode can be selected as needed, depending on the material constituting the anode and it cannot be specified in a wholesale manner, the thickness is usually from approximately 10 nm to 50 μm, preferably from 50 nm to 20 μm.

The resistivity of the anode is preferably $10^3$ Ω/sq or less, more preferably $10^2$ Ω/sq. The anode may be either colorless or colored insofar as it is transparent. The transmittance of the anode is preferably 60% or greater, more preferably 70% or greater in order to obtain luminescence from the side of the transparent anode.

Detailed description on transparent anodes is given in *Development of Transparent Conductive Films*, supervised by Yutaka Sawada, published by CMC (1999) and it can be applied to the invention. When a plastic base material having low heat resistance is used, a transparent anode formed using ITO or IZO at a temperature as low as 150° C. or less is preferred.

(Cathode)

The shape, structure or size of the cathode is usually not particularly limited insofar as it has a function as an electrode charging electrons into the organic layers. The material of it can be selected as needed from known electrode materials, depending on the intended use or purpose of the luminescence device.

Materials making up the cathode are, for example, metals, alloys, metal oxides, and electroconductive compounds, and mixtures thereof. Specific examples include alkali metals (such as Li, Na, K, and Cs), alkaline earth metals (such as Mg and Ca), gold, silver, lead, aluminum, sodium-potassium alloy, lithium-aluminum alloy, magnesium-silver alloy, and rare earth metals such as indium and ytterbium. These materials may be used alone. From the viewpoint of satisfying both stability and electron injection property, however, two or more of them can be used preferably in combination.

Of these, alkali metals and alkaline earth metals are preferred as the material constituting the cathode from the viewpoint of electron injection property, while materials composed mainly of aluminum are preferred because of their excellent storage stability.

The term "materials composed mainly of aluminum" means a single substance of aluminum and mixtures or alloys composed of aluminum and from 0.01 to 10 mass % of an alkali metal or an alkaline earth metal (such as a lithium-aluminum alloy and a magnesium-aluminum alloy).

The materials of the cathode are described in detail in JP-A-2-15595 and JP-A-5-121172 and the materials described therein can also be employed in the invention.

The process of forming the cathode is not particularly limited and it can be formed in a known manner. It can be formed in accordance with a process selected as needed from wet processes such as printing and coating, physical processes such as vacuum deposition, sputtering and ion plating, and chemical processes such as CVD and plasma CVD in consideration of the suitability to the above-described material making up the cathode. When a metal is selected as the material for the cathode, the cathode may be formed by simultaneously or successively sputtering one or more of the metals.

When the cathode is formed, patterning may be performed by chemical etching using photolithography or physical etching with laser exposure. The cathode may also be formed by vacuum deposition or sputtering through stacked masks, or by a lift-off process or a printing process.

In the invention, the forming position of the cathode is not particularly limited and it may be formed all over the organic layer or may be formed over a part thereof.

A dielectric layer made of, for example, a fluoride or oxide of an alkali metal or an alkaline earth metal and having a thickness of from 0.1 nm to 5 nm may be inserted between the cathode and the organic layer. This dielectric layer can also be regarded as a kind of an electron injection layer. It may be formed, for example, by vacuum deposition, sputtering or ion plating.

The thickness of the cathode can be selected as needed, depending on the material constituting the cathode and it cannot be determined in a wholesale manner. The thickness is usually from 10 nm to 5 µm, preferably from 50 nm to 1 µm.

The cathode may be either transparent or opaque. A transparent cathode can be obtained by forming the material of the cathode into a thin film with a thickness of from 1 to 10 nm and then stacking thereover a transparent conductive material such as ITO or IZO.

(Organic Layer)

The organic layer in the invention will next be described.

The organic EL device of the invention has at least one organic layer including a light emitting layer. An organic layer other than the light emitting layer is, for example, a hole transport layer, an electron transport layer, a charge blocking layer, a hole injection layer, and an electron injection layer as described above.

In the organic EL device of the invention, these layers constituting the organic layers can be formed preferably by any of dry film forming processes such as vapor deposition and sputtering, wet coating process, transfer process, printing process, and inkjet process.

(Light Emitting Layer)

The organic light emitting layer is a layer which, when voltage is applied thereto, has a function of receiving holes from the anode, the hole injection layer or the hole transport layer, also receiving electrons from the cathode, the electron injection layer or the electron transport layer, providing a site for recombination of the holes and the electrons, and thereby allowing light emission. The light emitting layer may be either a single layer or a multiple layer made up of two or more layers, which each may emit light of a different color.

The light emitting layer used in the invention may contain only a light emitting material, or it may be a layer containing a mixture of a host material and a light emitting material.

The host material is preferably a charge transport material. The host material may be constituted of either one kind or more than one kind. One example of the case where the host material is constituted of more than one kind is a case where the host material contains a mixture of an electron-transporting host material and a hole-transporting host material. Further, the light emitting layer may contain a material which neither has a charge transporting capability nor gives off light emission.

The host material is preferably the compound represented by the formula (I) for use in the invention, but other compounds may be used either alone or in combination with the compounds represented by the formula (I). These are described in detail in the later section <Host material>.

<Light Emitting Material>

The light emitting material may be either a fluorescent material or phosphorescent material. For the material, either one kind alone or two or more kinds may be used.

For the purposes of enhancing the color purity and extending a wavelength range of light emission, the light emitting layer used in the invention can contain two or more kinds of light emitting materials.

<<Fluorescent Material>>

Examples of the fluorescent material generally include benzoxazole, benzimidazole, benzothiazole, styrylbenzene, polyphenyl, diphenylbutadiene, tetraphenylbutadiene, naphthalimide, coumarin, pyran, perinone, oxadiazole, aldazine, pyralizine, cyclopentadiene, bisstyrylanthracene, quinacridone, pyrrolopyridine, thiadiazolopyridine, styrylamine, aromatic dimethylidene compounds, fused polycyclic aromatic compounds (e.g., anthracene, phenanthroline, pyrene, perylene, rubrene, pentacene), various kinds of metal complexes, typified by metal complexes of 8-quinolinol, pyrromethene complexes and rare-earth complexes, polymer compounds such as polythiophene, polyphenylene and polyphenylenevinylene, organic silanes, and derivatives of the compounds recited above.

<<Phosphorescent Material>>

Examples of the phosphorescent material generally include complexes containing a transition metal atom and a lanthanoid atom.

Preferred examples of the transition metal atom include, but not limited particularly to, ruthenium, rhodium, palladium, tungsten, rhenium, osmium, iridium, gold, silver, copper, and platinum. Of these, rhenium, iridium, and platinum are more preferred, with iridium and platinum being still more preferred.

Examples of the lanthanoid atom include lanthanum, cerium, praseodymium, neodymium, samarium, europium, gadolinium, terbium, dysprosium, holmium, erbium, thulium, ytterbium, and lutecium. Of these, neodium, europium, and gadolinium are preferred.

As the ligand of the; complex, ligands described in, for example, G Wilkinson et al., *Comprehensive Coordination Chemistry*, published by Pergamon Press in 1987; H. Yersin, *Photochemistry and Photophysics of Coordination Compounds*, published by Springer-Verlag in 1987; and Yamamoto Akio, *Organometallic Chemistry—Principles and Applications*, published by Shokabo Publishing in 1982, can be used.

Specific examples of the ligands include preferably halogen ligands (preferably chlorine ligand), aromatic carbocyclic ligands (e.g., preferably $C_{5-30}$, more preferably $C_{6-30}$, still more preferably $C_{6-20}$, especially preferably $C_{6-12}$ ligands such as cyclopentadienyl anions, benzene anions, and naphthyl anions), nitrogen-containing heterocyclic ligands (e.g., preferably $C_{5-30}$, more preferably $C_{6-30}$, still more preferably C$_{6-20}$, especially preferably C$_{6-12}$ ligands such as phenylpyridine, benzoquinoline, quinolinol, bipyridyl, and phenanthroline), diketone ligands (such as acetylacetone), carboxylic acid ligands (e.g., preferably C$_{2-30}$, more preferably C$_{2-20}$, still more preferably C$_{2-16}$ ligands such as acetic acid ligand), alcoholate ligands (e.g., preferably C$_{1-30}$, more preferably C$_{1-20}$, still more preferably C$_{6-20}$ ligands such as phenolate ligand), silyloxy ligands (e.g., preferably C$_{3-40}$, more preferably C$_{3-30}$, still more preferably C$_{3-20}$ ligands such as trimethylsilyloxy ligand, dimethyl-tert-butylsilyloxy ligand and triphenylsilyloxy ligand), carbon monoxide ligand, isonitrile ligand, cyano ligand, phosphorus ligands (e.g., preferably C$_{3-40}$, more preferably C$_{3-30}$, still more preferably C$_{3-20}$, especially preferably C$_{6-20}$ ligands such as triphenylphosphine ligand), thiolato ligands (e.g., preferably C$_{1-30}$, more preferably C$_{1-20}$, still more preferably C$_{6-20}$ such as phenylthiolato ligand), and phosphine oxide ligands (e.g., preferably C$_{3-30}$, more preferably C$_{8-30}$, still more preferably C$_{18-30}$ ligands such as triphenylphosphine oxide ligand). Of these, the nitrogen-containing heterocyclic ligands are more preferred.

The above-described complexes may be either a complex containing one transition metal atom in the compound, or a so-called polynuclear complex containing two or more transition metal atoms. They may contain different metal atoms at the same time.

Examples of the phosphorescent material include the phosphorescent compounds disclosed in the patent documents, such as U.S. Pat. Nos. 6,303,238B1 and 6,097,147, International Patent Publication Nos. 00/57676, 00/70655, 01/08230, 01/39234, 01/41512, 02/02714, 02/15645, 02/44189 and 05/19373, JP-A-2001-247859, JP-A-2002-302671, JP-A-2002-117978, JP-A-2003-133074, JP-A-2002-235076, JP-A-2003-123982 and JP-A-2002-170684, EP1211257, and JP-A-2002-226495, JP-A-2002-234894, JP-A-2001-247859, JP-A-2001-298470, JP-A-2002-173674, JP-A-2002-203678, JP-A-2002-203679, JP-A-2004-357791, JP-A-2006-256999, JP-A-2007-19462, JP-A-2007-84635 and JP-A-2007-96259.

Among these compounds, Ir complexes, Pt complexes, Cu complexes, Re complexes, W complexes, Rh complexes, Ru complexes, Pd complexes, Os complexes, Eu complexes, Tb complexes, Gd complexes, Dy complexes and Ce complexes are preferred examples of the light emitting material. Of these complexes, Ir complexes, Pt complexes and Re complexes are especially preferred. As to Ir, Pt and Re complexes each, the complex having at least one coordination mode of metal-carbon bonding, metal-nitrogen bonding, metal-oxygen bonding or metal-sulfur bonding is preferable. From the viewpoints of luminous efficiency, running durability and chromaticity, Ir complexes, Pt complexes and Re complexes each containing a tridentate or higher-dentate ligand are especially preferred. Of these complexes, the Ir complexes and the Pt complexes are preferable to the Re complexes, and the Pt complexes are preferable to the Ir complexes. Among the Pt complexes, the Pt complexes having tetradentate ligands are the best.

Of the complexes as mentioned above, the following complexes are recited as examples of preferably-used light emitting materials, but the materials should not be construed as being limited to these complexes.

Additionally, in each of the following structural formulae, the dotted lines between the metal atom and the ligands stand for coordinate bonds, and the real lines stand for covalent bonds. Further, although some of the following structures can have stereoisomers, they are regarded as representing all of the stereoisomers that they can have.

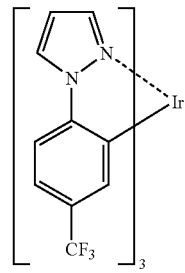

D-1

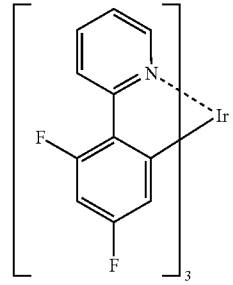

D-2

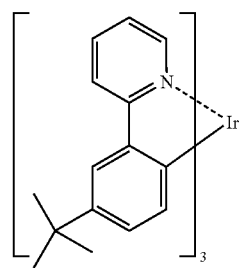

D-3

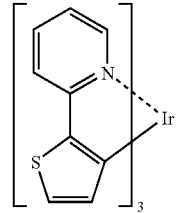

D-4

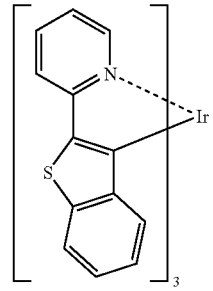

D-5

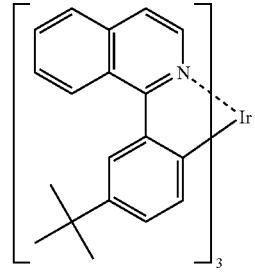

D-6

-continued
D-7
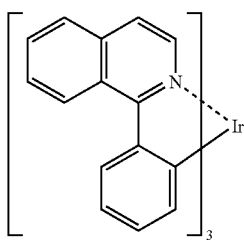
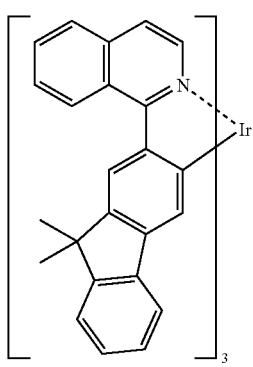
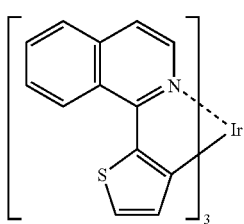
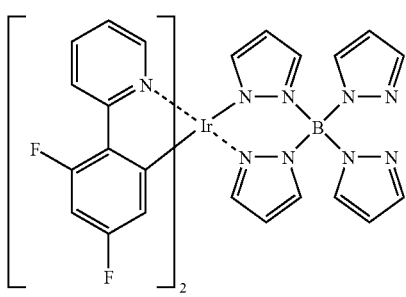
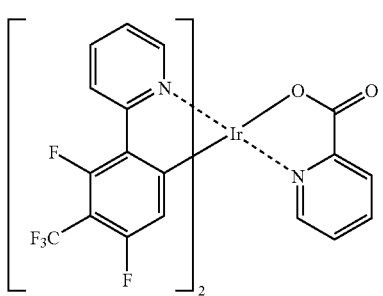
-continued
D-12
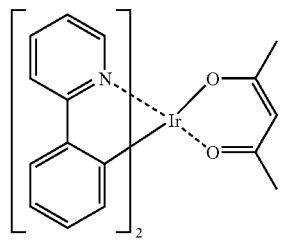
D-13
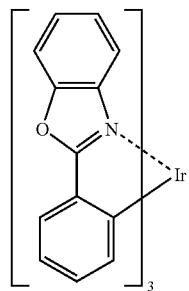
D-14
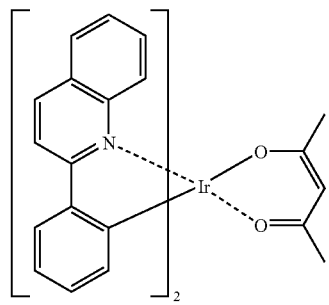
D-15
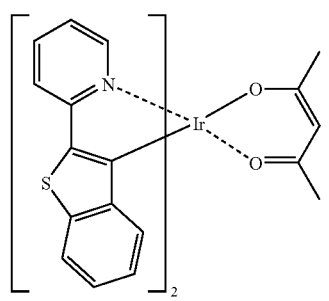
D-16
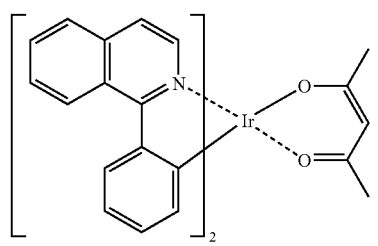
D-17
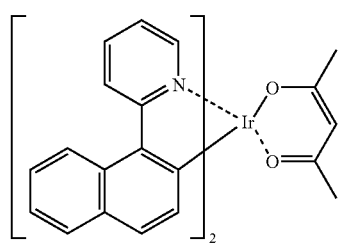

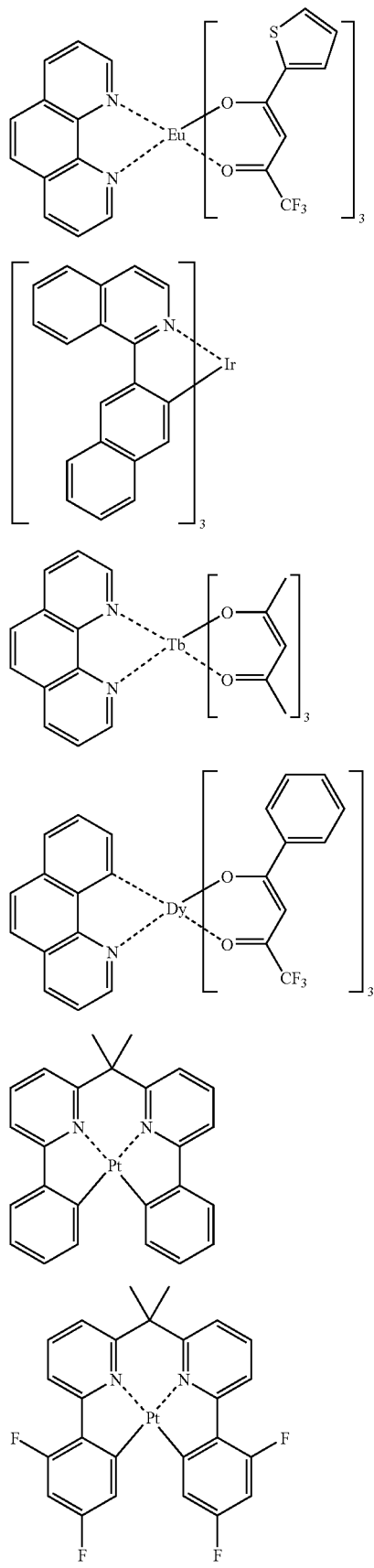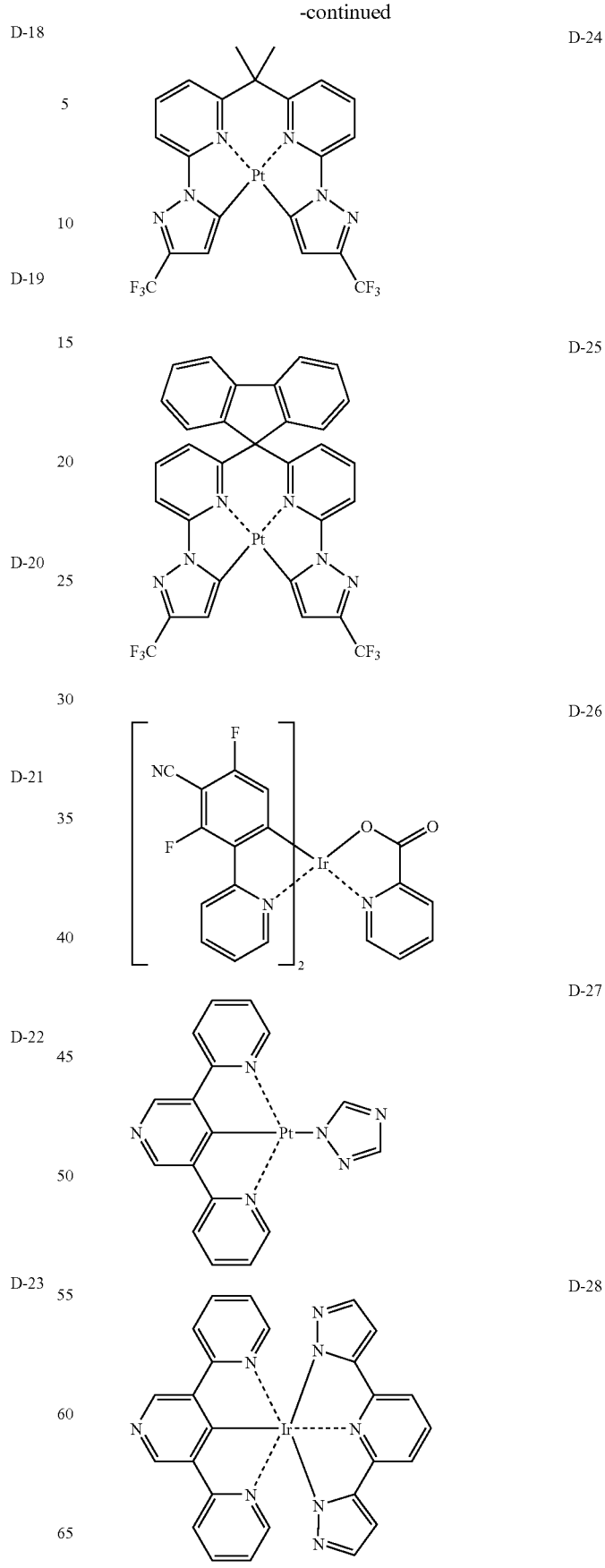

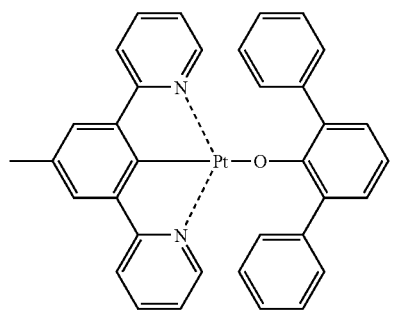
D-29
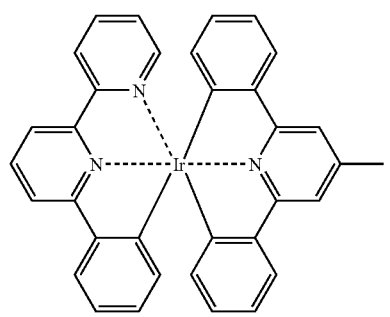
D-30
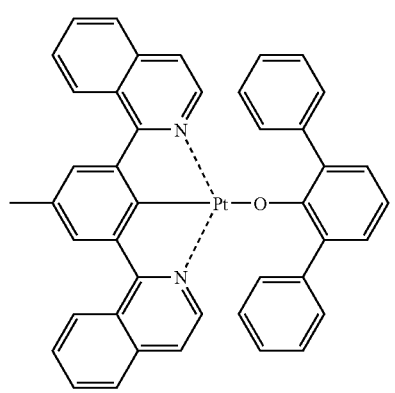
D-31
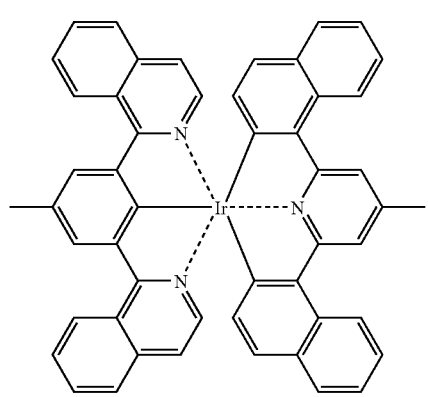
D-32
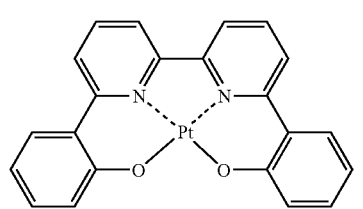
D-33
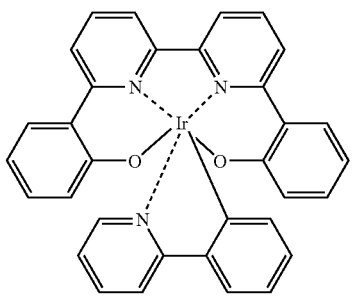
D-34
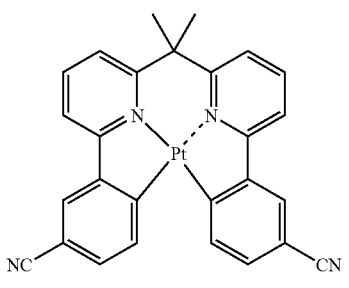
D-35
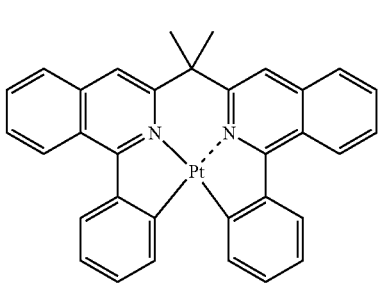
D-36
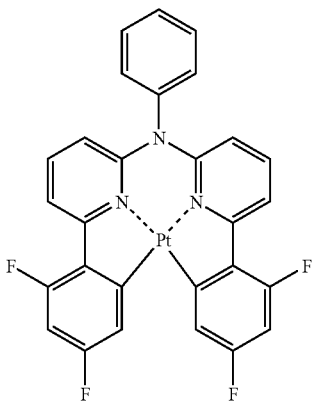
D-37

D-38 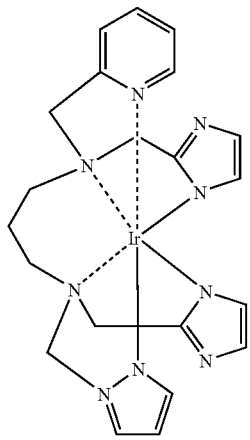

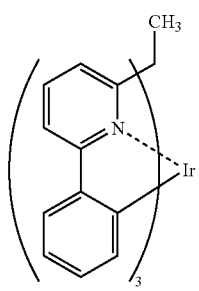

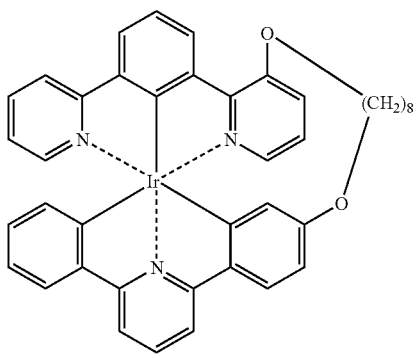

D-40

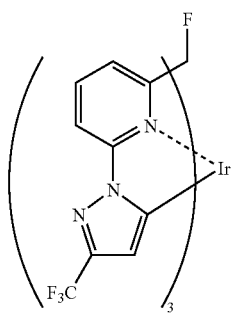

D-41

D-42 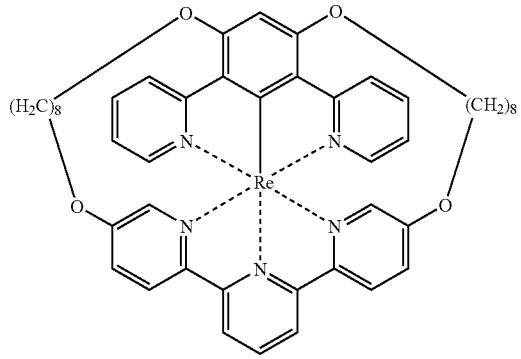

D-43 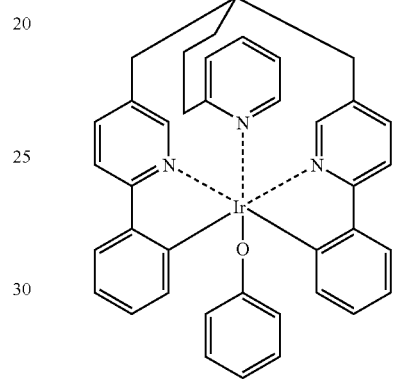

Examples of the platinum complex phosphorescent material having a tetradentate ligand include the compounds disclosed in International Patent Publication No. 04/108857.

More specifically, the compounds disclosed in U.S. Pat. No. 6,653,654, International Patent Publication Nos. 04/099339 and 04/108857, JP-A-2005-310733, JP-A-2005-317516, JP-A-2006-261623, JP-A-2006-93542 and JP-A-2006-256999, International Patent Publication No. 06/098505, JP-A-2007-19462, JP-A-2007-96255 and JP-A-2007-96259, International Patent Publication No. 05/042444, JP-A-2006-232784, U.S. Pat. No. 0,134,461 and International Patent Publication No. are preferred as the platinum complex phosphorescent materials having tetradentate ligands.

The platinum complex phosphorescent materials having tetradentate ligands are preferably those containing 2-arylpyridine derivatives, 2-(1-pyrazolyl)pyridine derivatives or 1-arylpyrazole derivatives as partial structures of their respective ligands, more preferably those containing 2-arylpyridine derivatives or 2-(1-pyrazolyl)pyridine derivatives as partial structures of their respective ligands, especially preferably those containing 2-arylpyridine derivatives as partial structures of their respective ligands.

The partial structures of ligands (e.g., 2-arylpyridine derivatives, 2-(1-pyrazolyl)pyridine derivatives, 1-arylpyrazole derivatives) are linked together at their appropriate sites and form a tetradentate ligand.

In the case of containing 2-arylpyridine derivatives as partial structures of a tetradentate ligand, it is preferable that the linking site of each derivative is the 6-position of the pyridine ring or the aryl carbon in the position meta to the pyridine ring, it is more preferable that their pyridine rings are interlinked at each other's 6-positions or their aryl carbons in the positions meta to the pyridine rings are interlinked, and it is especially preferable that their pyridine rings are interlinked at each other's 6-positions.

In the case of containing 2-(1-pyrazolyl)pyridine derivatives as partial structures of a tetradentate ligand, it is preferable that the linking site of each derivative is the 6-position of the pyridine or the 4-position of the 1-pyrazolyl group, it is more preferable that their pyridine rings are interlinked at each other's 6-positions or their 1-pyrazolyl groups are interlinked at each other's 4-positions, and it is especially preferable that their pyridine rings are interlinked at each other's 6-positions.

In the case of containing 1-arylpyrazole derivatives as partial structures of a tetradentate ligand, it is preferable that the linking site of each derivative is the 3-position of the pyrazole ring or the aryl carbon in the position meta to the pyrazole ring, it is more preferable that their pyrazole rings are interlinked at each other's 3-positions or their aryl carbons in the positions meta to the pyrazole rings are interlinked, and it is especially preferable that their pyrazole rings are interlinked at each other's 3-positions.

A structural unit for interlinking one partial structure of the ligand with another may be either a single bond or a divalent linking group, but it is preferably a divalent linking group. Examples of a divalent linking group preferably used herein include a methylene linkage, an ethylene linkage, a phenylene linkage, a nitrogen linkage, an oxygen linkage, a sulfur linkage and a silicon linkage. Of these linkages, a methylene linkage, a nitrogen linkage and a silicon linkage are preferable to the others, and a methylene linkage is especially preferred. Examples of a methylene linkage include a methylene group (—CH$_2$—), a methylmethylene group (—CHMe-), a fluoromethylmethylene group (—CFMe-), a dimethylmethylene group (—CMe$_2$-), a methylphenylmethylene group (—CMePh-), a diphenylmethylene group (—CPh$_2$-), a 9,9-fluorenediyl group, a 1,1-cyclopentadiyl group and a 1,1-cyclohexanediyl group. Of these groups, a dimethylmethylene group, a diphenylmethylene group, a 9,9-fluorenediyl group, a 1,1-cyclopentanediyl group and a 1,1-cyclohexanediyl group are preferable to the others, a dimethylmethylene group, a diphenylmethylene group and a 1,1-cyclohexanediyl group are more preferred, and a dimethylmethylene group is especially preferred.

A group of compounds preferred as the platinum complex phosphorescent materials having tetradentate ligands are Pt complexes represented by the following formula (A).

Formula (A)

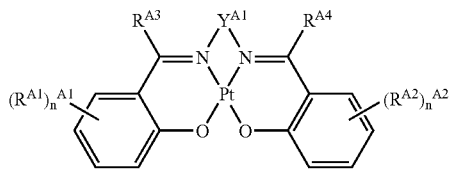

In the formula (A), each of $R^{A3}$ and $R^{A4}$ independently represents a hydrogen atom or a substituent, and each of $R^{A1}$ and $R^{A2}$ independently represents a substituent. When there are two or more $R^{A1}$s or two or more $R^{A2}$s in the formula (A), the $R^{A1}$s or the $R^{A2}$s may be the same or different, and may combine with each other to form a ring. Each of $n^{A1}$ and $n^{A2}$ independently stands for an integer of 0 to 4. $Y^{A1}$ represents a linking group.

The substituents represented by $R^{A1}$, $R^{A2}$, $R^{A3}$ and $R^{A4}$ respectively can be selected arbitrarily from the following Group A substituents.

Group A Substituents:

Alkyl groups (preferably $C_{1-30}$, more preferably $C_{1-20}$, especially preferably $C_{1-10}$, alkyl groups, with examples including a methyl group, an ethyl group, an isopropyl group, a tert-butyl group, an n-octyl group, an n-decyl group, an n-hexadecyl group, a cyclopropyl group, a cyclopentyl group and a cyclohexyl group), alkenyl groups (preferably $C_{2-30}$, more preferably $C_{2-20}$, especially preferably $C_{2-10}$, alkenyl groups, with examples including a vinyl group, an allyl group, a 2-butenyl group and a 3-pentenyl group), alkynyl groups (preferably $C_{2-30}$, more preferably $C_{2-20}$, especially preferably $C_{2-10}$, alkynyl groups, with examples including a propargyl group and a 3-pentynyl group), aryl groups (preferably $C_{6-30}$, more preferably $C_{6-20}$, especially preferably $C_{6-12}$, aryl groups, with examples including a phenyl group, a p-methylphenyl group, a naphthyl group and an anthranyl group), amino groups (preferably $C_{0-30}$, more preferably $C_{0-20}$, especially preferably $C_{0-10}$, amino groups, with examples including an amino group, a methylamino group, a dimethylamino group, a diethylamino group, a dibenzylamino group, diphenylamino group and ditolylamino group), alkoxy groups (preferably $C_{1-30}$, more preferably $C_{1-20}$, especially preferably $C_{1-10}$, alkoxy groups, with examples including a methoxy group, an ethoxy group, a butoxy group and a 2-ethylhexyloxy group), aryloxy groups (preferably $C_{6-30}$, more preferably $C_{6-20}$, especially preferably $C_{6-12}$, aryloxy groups, with examples including a phenyloxy group, a 1-napthyloxy group and a 2-naphthyloxy group), heterocyclic oxy groups (preferably $C_{1-30}$, more preferably $C_{1-20}$, especially preferably $C_{1-12}$, heterocyclic oxy groups, with examples including a pyridyloxy group, a pyrazyloxy group, a pyrimidyloxy group and a quinolyloxy group), acyl groups (preferably $C_{1-30}$, more preferably $C_{1-20}$, especially preferably $C_{1-12}$, acyl groups, with examples including an acetyl group, a benzoyl group, a formyl group and a pivaroyl group), alkoxycarbonyl groups (preferably $C_{2-30}$, more preferably $C_{2-20}$, especially preferably $C_{2-12}$, alkoxycarbonyl groups, with examples including a methoxycarbonyl group and an ethoxycarbonyl group), aryloxycarbonyl groups (preferably $C_{7-30}$, more preferably $C_{7-20}$, especially preferably $C_{7-12}$, aryloxycarbonyl groups, with examples including a phenyloxycarbonyl group), acyloxy groups (preferably $C_{2-30}$, more preferably $C_{2-20}$, especially preferably $C_{1-10}$, acyloxy groups, with examples including an acetoxy group and a benzoyloxy group), acylamino groups (preferably $C_{2-30}$, more preferably $C_{2-20}$, especially preferably $C_{2-10}$, acylamino groups, with examples including an acetylamino group and a benzoylamino group), alkoxycarbonylamino groups (preferably $C_{2-30}$, more preferably $C_{2-20}$, especially preferably $C_{2-12}$, alkoxycarbonylamino groups, with examples including a methoxycarbonylamino group), aryloxycarbonylamino groups (preferably $C_{7-30}$, more preferably $C_{7-20}$, especially preferably $C_{7-12}$, aryloxycarbonylamino groups, with examples including a phenyloxycarbonylamino group), sulfonylamino groups (preferably $C_{1-30}$, more preferably $C_{1-20}$, especially preferably $C_{1-12}$, sulfonylamino groups, with examples including a methanesulfonylamino group and a benzenesulfonylamino group), sulfamoyl groups (preferably $C_{0-30}$, more preferably $C_{0-20}$, especially preferably $C_{0-12}$, sulfamoyl groups, with examples including a sulfamoyl group, a methylsulfamoyl group, a dimethylsulfamoyl group and a phenylsulfamoyl group), carbamoyl groups (preferably $C_{1-30}$, more preferably $C_{1-20}$, especially preferably $C_{1-12}$, carbamoyl groups, with examples including a carbamoyl group, a methylcarbamoyl group, a dimethylcarbamoyl group and a phenylcarbamoyl group), alkylthio groups (preferably $C_{1-30}$, more preferably $C_{1-20}$, especially preferably $C_{1-12}$, alkylthio groups, with examples including a methylthio group and an ethylthio group), arylthio groups (preferably C6-30, more preferably C6-20, especially preferably C6-12, arylthio groups, with examples including a phenylthio group), heterocyclic thio groups (preferably C1-30, more preferably C1-20, especially preferably C1-12, heterocyclic thio groups, with examples including a pyridylthio group, a 2-benzimidazolylthio group, a 2-benzoxazolylthio group and a 2-benzothiazolylthio group), sulfonyl groups (preferably $C_{1-30}$, more preferably $C_{1-20}$, especially preferably $C_{1-12}$, sulfonyl groups, with examples including a mesyl group and a tosyl group), sulfinyl groups (preferably $C_{1-30}$, more preferably $C_{1-20}$, especially preferably $C_{1-12}$, sulfinyl groups, with examples including a methanesulfinyl group and a benzenesulfinyl group), ureido groups (preferably $C_{1-30}$, more preferably $C_{1-20}$, especially preferably $C_{1-12}$, ureido groups, with examples including a ureido group, a methylureido group and a phenylureido group), phosphoric acid amide groups (preferably $C_{1-30}$, more preferably $C_{1-20}$, especially preferably $C_{1-12}$, phosphoric acid amide groups, with examples including a diethylphosphoric acid amide group and a phenylphosphoric acid amide group), a hydroxyl group, a mercapto group, halogen atoms (e.g., a fluorine atom, a chlorine atom, a bromine atom, an iodine atom), a cyano group, a sulfo group, a carboxyl group, a nitro group, a hydroxamic acid group, a sulfino group, a hydrazino group, an imino group, heterocyclic groups (preferably $C_{1-30}$, more preferably $C_{1-12}$, heterocyclic groups each containing a nitrogen, oxygen or sulfur atom as a hetero atom, with examples including an imidazolyl group, a pyridyl group, a quinolyl group, a furyl group, a thienyl group, a piperidyl group, a morpholino group, a benzoxazolyl group, a benzimidazolyl group, a benzothiazolyl group, a carbazolyl group and an azepinyl group), silyl groups (preferably $C_{3-40}$, more preferably $C_{3-30}$, especially preferably $C_{3-24}$, silyl groups, with examples including a trimethylsilyl group and a triphenylsilyl group), silyloxy groups (preferably $C_{3-40}$, more preferably $C_{3-30}$, especially preferably $C_{3-24}$, silyloxy groups, with examples including a trimethylsilyloxy group and a triphenylsilyloxy group), and phosphoryl groups (with examples including diphenylphosphoryl group and a dimethylphosphoryl group).

The linking group represented by $Y^{41}$ can be selected arbitrarily from the following Group A linking groups.

Group A Linking Groups:

Alkylene groups (e.g., methylene, ethylene, propylene), arylene groups (e.g., phenylene, naphthalenediyl), heteroarylene groups (e.g., pyridinediyl, thiophenediyl), imino groups (—NR—) (e.g., phenylimino), an oxy group (—O—), a thio group (—S—), phosphinidene groups (—PR—) (e.g., phenylphosphonidene), silylene groups (—SiRR'—) (e.g., dimethylsilylene, diphenylsilylene) and combinations of two or more of the groups recited above. These linking groups each may further have a substituent.

The substituent represented by each of $R^{41}$, $R^{42}$, $R^{43}$ and $R^{44}$ is preferably an alkyl group, an aryl group or a heterocyclic group, more preferably an aryl group or a heterocyclic group, especially preferably an aryl group.

The linking group represented by $Y^{41}$ is preferably a vinylene group substituted at the 1- and 2-positions, a phenylene group, a pyridinediyl group, a pyrazinediyl group, a pyrimidinediyl group or a $C_{1-8}$ alkylene group, more preferably a vinylene group substituted at the 1- and 2-positions, a phenylene group or a $C_{1-6}$ alkylene group, especially preferably a phenylene group.

The substituent represented by each of $R^{43}$ and $R^{44}$ may combine with the linking group represented by $Y^{41}$ to form a ring. For example, when $Y^{41}$ is 1,2-phenylene, $R^{43}$ and $R^{44}$ may be linked to the 3-position and the 6-position of the phenylene, respectively, to form a 1,10-phenanthroline ring, which may further have substituents.

Another group of compounds preferred as the platinum complex phosphorescent materials having tetradentate ligands are Pt complexes represented by the following formula (B).

Formula (B)

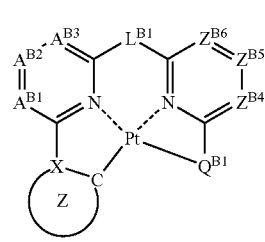

In the formula (B), each of $A^{B1}$ to $A^{B6}$ independently represents C—R or N. R represents a hydrogen atom or a substituent. $L^{B1}$ represents a single bond or a divalent linking group. X represents C or N. Z represents a 5- or 6-membered aromatic ring or heteroaromatic ring formed in cooperation with X—C. $Q^{B1}$ represents an anionic group bonding to Pt.

The formula (B) is illustrated below.

Each of $A^{B1}$ to $A^{B6}$ independently represents C—R or N. R represents a hydrogen atom or a substituent. Examples of the substituent represented by R are the same ones as the Group A substituents include, and the preferred range of each example and that of the corresponding Group A substituent are the same.

Each of $A^{B1}$ to $A^{B6}$ is preferably C—R, and adjacent Rs may combine with each other to form a ring. When each of $A^{B1}$ to $A^{B6}$ is C—R, R in each of $A^{B2}$ and $A^{B5}$ is preferably a hydrogen atom, an alkyl group, an aryl group, an amino group, an alkoxy group, an aryloxy group, a fluoro group or a cyano group, more preferably a hydrogen atom, an amino group, an alkoxy group, an aryloxy group or a fluoro group, especially preferably a hydrogen atom or a fluoro group, and R in each of $A^{B1}$, $A^{B3}$, $A^{B4}$ and $A^{B6}$ is preferably a hydrogen atom, an alkyl group, an aryl group, an amino group, an alkoxy group, an aryloxy group, a fluoro group or a cyano group, more preferably a hydrogen atom, an amino group, an alkoxy group, an aryloxy group or a fluoro group, especially preferably a hydrogen atom.

$L^{B1}$ represents a single bond or a divalent linking group. Examples of the divalent linking group represented by $L^{B1}$ include alkylene groups (e.g., methylene, ethylene, propylene), arylene groups (e.g., phenylene, naphthalenediyl), heteroarylene groups (e.g., pyridinediyl, thiophenediyl), imino groups (—NR—) (e.g., phenylimino), an oxy group (—O—), a thio group (—S—), phosphinidene groups (—PR—) (e.g., phenylphosphonidene), silylene groups (—SiRR'—) (e.g., dimethylsilylene, diphenylsilylene) and combinations of two or more of the groups recited above. These linking groups each may further have a substituent.

Of those which are recited above as $L^{B1}$, a single bond, alkylene groups, arylene groups, heteroarylene groups, imino groups, an oxy group, a thio group and silylene groups are preferable to the others, a single bond, alkylene groups, arylene groups and imino groups are more preferable to the others, and alkylene groups are still more preferable to the others. Among alkylene groups, methylene groups are preferable to the others. Among methylene groups, disubstituted methylene groups are preferable, and dimethylmethylene, diethylmethylene, diisobutylmethylene, dibenzylmethylene, ethylmethylmethylene, methylpropylmethylene, isobutylmethylmethylene, diphenylmethylene, methylphenylmethylene, cyclohexanediyl, cyclopentanediyl, fluorenediyl and fluoromethylmethylene groups are more preferable. Of these groups, dimethylmethylene, diphenylmethylene and cyclohexanediyl groups are especially preferred over the others.

X represents C or N. Z represents a 5- or 6-membered aromatic hydrocarbon ring or aromatic heterocyclic ring formed in cooperation with X—C in the formula. Examples of an aromatic hydrocarbon ring or aromatic heterocyclic ring represented by Z include a benzene ring, a naphthalene ring, an anthracene ring, a pyrene ring, a phenanthrene ring, a perylene ring, a pyridine ring, a quinoline ring, an isoquinoline ring, a phenanthridine ring, a pyrimidine ring, a pyrazine ring, a pyridazine ring, a triazine ring, a cinnoline ring, an acridine ring, a phthalazine ring, a quinazoline ring, a quinoxaline ring, a naphthyridine ring, a pteridine ring, a pyrrole ring, a pyrazole ring, a triazole ring, an indole ring, a carbazole ring, an indazole ring, a benzimidazole ring, an oxazole ring, a thiazole ring, an oxadiazole ring, a thiadiazole ring, a benzoxazole ring, a benzothiazole ring, an imidazopyridine ring, a thiophene ring, a benzothiophene ring, a furan ring, a benzofuran ring, a phosphole ring, a phosphinine ring and a silole ring. Z may have a substituent. To the substituent, any one of the Group A substituents can be applied. In addition, Z may form a fused ring together with another ring.

Examples of a ring preferred as Z include a benzene ring, a naphthalene ring, a pyrazole ring, an imidazole ring, a triazole ring, a pyridine ring, an indole ring and a thiophene ring. Of these rings, a benzene ring, a pyrazole ring and a pyridine ring are preferred over the others.

$Q^{B1}$ represents an anionic group bound to Pt. Examples of the anionic group represented by $Q^{B1}$ include a vinyl ligand, aromatic hydrocarbon ring ligands (e.g., a benzene ligand, a naphthalene ligand, an anthracene ligand, a phenathracene ligand), heterocyclic ring ligands (e.g., a furan ligand, a thiophene ligand, a pyridine ligand, a pyrazine ligand, a pyrimidine ligand, a pyridazine ligand, a triazine ligand, a thiazole ligand, a thiazole ligand, an oxazole ligand, a pyrrole ligand, an imidazole ligand, a pyrazole ligand, a triazole ligand), and fused ring ligands containing the rings as recited above (e.g., a quinoline ligand, a benzothiazole ligand). Herein, the bond between $Q^{B1}$ and Pt may be either a covalent bond, or an ionic bond, or a coordinate bond. In the $Q^{B1}$, the atom bound to Pt is preferably a carbon atom, a nitrogen atom, an oxygen atom, a sulfur atom or a phosphorus atom, more preferably a carbon atom, an oxygen atom or a nitrogen atom, still more preferably a carbon atom.

The group represented by $Q^{B1}$ is preferably an aromatic hydrocarbon ring ligand which is bound to Pt via its carbon atom, an aromatic heterocyclic ring ligand which is bound to Pt via its carbon atom, a nitrogen-containing aromatic heterocyclic ring ligand which is bound to Pt via its nitrogen atom, or an acyloxy ligand, more preferably an aromatic hydrocarbon ring ligand which is bound to Pt via its carbon atom, or an aromatic heterocyclic ring ligand which is bound to Pt via its carbon atom. And it is especially preferred that the group represented by $Q^{B1}$ be the same group as derived from the ring Z formed in cooperation with C—X in the formula (B).

The Pt complexes represented by the formula (B) are preferably Pt complexes represented by the following formula (C).

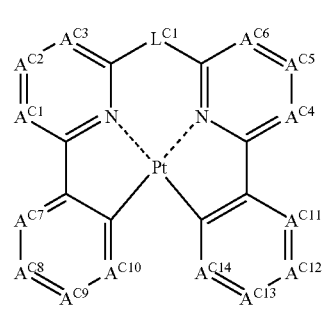

Formula (C)

In the formula (C), each of $A^{C1}$ to $A^{C14}$ independently represents C—R or N. R represents a hydrogen atom or a substituent. $L^{C1}$ represents a single bond or a divalent linking group.

The formula (C) is illustrated.

Each of $A^{C1}$ to $A^{C14}$ independently represents C—R or N. R represents a hydrogen atom or a substituent. $A^{C1}$ to $A^{C14}$ have the same meanings as $A^{B1}$ to $A^{B6}$ in the formula (B) have respectively, and preferred ranges thereof and those of $A^{B1}$ to $A^{B6}$ are the same respectively.

As to $A^{C1}$ to $A^{C14}$, the suitable number of Ns (nitrogen atoms) among the ring constituents $A^{C7}$ to $A^{C10}$ and that among $A^{C11}$ to $A^{C14}$ are each from 0 to 2, preferably from 0 or 1. The ring constituent N is chosen preferably from $A^{C8}$, $A^{C9}$ or $A^{C10}$ and from $A^{C12}$, $A^{C13}$ or $A^{C14}$, respectively, more preferably from $A^{C8}$, $A^{C9}$, $A^{C12}$ or $A^{C13}$, especially preferably from $A^{C8}$ or $A^{C12}$.

When each of $A^{C7}$ to $A^{C14}$ represents C—R, the R of $A^{C8}$ and $A^{C12}$ each is preferably a hydrogen atom, an alkyl group, a polyfluoroalkyl group, an aryl group, an amino group, an alkoxy group, an aryloxy group, a fluoro group or a cyano group, more preferably a hydrogen atom, a polyfluoroalkyl group, an alkyl group, an aryl group, a fluoro group or a cyano group, especially preferably a hydrogen atom, a polyfluoroalkyl group or a cyano group. The R of $A^{C7}$, $A^{C9}$, $A^{C11}$ and $A^{C13}$ each is preferably a hydrogen atom, an alkyl group, a polyfluoroalkyl group, an aryl group, an amino group, an alkoxy group, an aryloxy group, a fluoro group or a cyano group, more preferably a hydrogen atom, a polyfluoroalkyl group, a fluoro group or a cyano group, especially preferably a hydrogen atom or a fluoro group. The R of $A^{C10}$ and $A^{C14}$ each is preferably a hydrogen atom or a fluoro group, more preferably a hydrogen atom. When two of $A^{C7}$ to $A^{C9}$ or two of $A^{C11}$ to $A^{C13}$ are groups represented by C—R, the two Rs may combine with each other to form a ring.

The linking group represented by $L^{C1}$ has the same meaning as the linking group represented by $L^{B1}$ in the formula (B) has, and preferred ranges of these linking groups are also the same.

The Pt complexes represented by the formula (B) are preferably Pt complexes represented by the following formula (D) too.

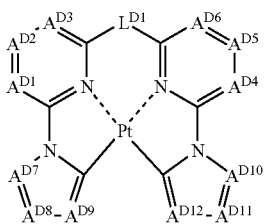

Formula (D)

In the formula (D), each of $A^{D1}$ to $A^{D12}$ independently represents C—R or N. R represents a hydrogen atom or a substituent. $L^{D1}$ represents a single bond or a divalent linking group.

The formula (D) is illustrated.

Each of $A^{D1}$ to $A^{D12}$ independently represents C—R or N. R represents a hydrogen atom or a substituent.

$A^{D1}$ to $A^{D6}$ have the same meanings as $A^{B1}$ to $A^{B6}$ in the formula (B) have respectively, and preferred ranges thereof and those of $A^{B1}$ to $A^{B6}$ are the same respectively.

As to $A^{D7}$ to $A^{D12}$, the suitable number of Ns (nitrogen atoms) among the ring constituents $A^{D7}$ to $A^{D9}$ and that among $A^{D10}$ to $A^{D12}$ are each from 0 to 2, preferably from 1 or 2, especially preferably 1. The ring constituent N is chosen preferably from $A^{D7}$, $A^{D8}$ or $A^{D9}$ and from $A^{D10}$, $A^{D11}$ or $A^{D12}$, respectively, more preferably from $A^{D7}$, $A^{D9}$, $A^{10}$ or $A^{D12}$, especially preferably from $A^{D7}$ or $A^{D10}$.

When each of $A^{D7}$ to $A^{D12}$ represents C—R, the R of $A^{D8}$ and $A^{D11}$ each is preferably a hydrogen atom, an alkyl group, a polyfluoroalkyl group, an aryl group, an amino group, an alkoxy group, an aryloxy group, a fluoro group or a cyano group, more preferably a hydrogen atom, a polyfluoroalkyl group, an alkyl group, an aryl group, a fluoro group or a cyano group, especially preferably a polyfluoroalkyl group (e.g., a trifluoromethyl group, a perfluoroethyl group) or a cyano group. The R of $A^{D7}$, $A^{D9}$, $A^{D10}$ and $A^{D12}$ each is preferably a hydrogen atom, an alkyl group, a polyfluoroalkyl group, an aryl group, an amino group, an alkoxy group, an aryloxy group, a fluoro group or a cyano group, more preferably a hydrogen atom or a fluoro group, especially preferably a hydrogen atom. When any adjacent two of $A^{D7}$ to $A^{D12}$ are groups represented by C—R, the two Rs may combine with each other to form a ring.

The linking group represented by $L^{D1}$ has the same meaning as the linking group represented by $L^{B1}$ in the formula (B) has, and preferred ranges of these linking groups are also the same.

Still another group of compounds preferred as the platinum complex phosphorescent materials having tetradentate ligands are Pt complexes represented by the following formula (E).

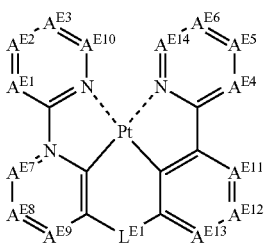

Formula (E)

In the formula (E), each of $A^{E1}$ to $A^{E14}$ independently represents C—R or N. R represents a hydrogen atom or a substituent. $L^{E1}$ represents a single bond or a divalent linking group.

The formula (E) is illustrated. Each of $A^{E1}$ to $A^{E14}$ independently represents C—R or N. R represents a hydrogen atom or a substituent. $A^{E1}$ to $A^{E6}$ have the same meanings as $A^{B1}$ to $A^{B6}$ in the formula (B) have respectively, and preferred ranges thereof and those of $A^{B1}$ to $A^{B6}$ are the same respectively. $A^{E7}$ to $A^{E14}$ have the same meanings as $A^{C7}$ to $A^{C14}$ in the formula (C) have respectively, and preferred ranges thereof and those of $A^{C7}$ to $A^{C14}$ are the same respectively.

The linking group represented by $L^{E1}$ has the same meaning as the linking group $L^{B1}$ in the formula (B) has.

$L^{E1}$ is preferably a single bond, an alkylene group, an arylene group, a heteroarylene group, an imino group, an oxy group, a thio group or a silylene group, more preferably an alkylene group, an imino group, an oxy group, a thio group or a silylene group. Of these groups, an alkylene group is preferred over the others. The alkylene group is preferably a methylene group, more preferably a substituted methylene group, especially preferably a disubstituted methylene group. Suitable examples of the disubstituted methylene group include a dimethylmethylene group, a diethylmethylene group, a diisobutylmethylene group, a dibenzylmethylene group, an ethylmethylmethylene group, a methylpropylmethylene group, an isobutylmethylmethylene group, a diphenylmethylene group, a methylphenylmethylene group, a cyclohezanediyl group, a cyclopentanediyl group, a fluorenediyl group and a fluoromethylmethylene group. Of these disubstituted methylene group, a dimethylmethylene group, a diphenylmethylene group and a cyclohexanediyl group are preferred over the others.

A further group of compounds preferred as the platinum complex phosphorescent materials having tetradentate ligands are Pt complexes represented by the following formula (F).

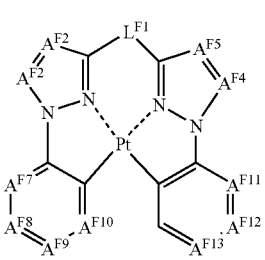

Formula (F)

In the formula (F), each of $A^{F1}$ to $A^{F14}$ independently represents C—R or N. R represents a hydrogen atom or a substituent. $L^{F1}$ represents a single bond or a divalent linking group.

The formula (F) is illustrated.

Each of $A^{F1}$ to $A^{F14}$ independently represents C—R or N. R represents a hydrogen atom or a substituent. $A^{F1}$ to $A^{F5}$ have the same meanings as $A^{B1}$ to $A^{B5}$ in the formula (B) have respectively. Each of $A^{F1}$ to $A^{F5}$ is preferably C—R, and two Rs may combine with each other to form a ring. When each of $A^{F1}$ to $A^{F5}$ is C—R, the R is preferably a hydrogen atom, an alkyl group, an aryl group, an amino group, an alkoxy group, an aryloxy group, a fluoro group or a cyano group, more preferably a hydrogen atom, an aryl group, a fluoro group or a cyano group, especially preferably a hydrogen atom.

$A^{F7}$ to $A^{F14}$ have the same meanings as $A^{C7}$ to $A^{C14}$ in the formula (C) have respectively, and the preferred ranges thereof and those of $A^{C7}$ to $A^{C14}$ are the same respectively. When two of $A^{F7}$ to $A^{F9}$ or two or $A^{F11}$ to $A^{F13}$ are groups represented by C—R, the two Rs may combine with each other to form a ring. The ring formed is preferably a furan ring, a benzofuran ring, a pyrrole ring, a benzopyrrole ring, a benzothiophene ring or a fluorene ring, which each may further has a substituent.

The linking group represented by $L^{F1}$ has the same meaning as the linking group represented by $L^{B1}$ in the formula (B) has, and preferred ranges of these linking groups are also the same.

Examples of the platinum complex phosphorescent materials having tetradentate ligands include the following, but they are not limited to these complexes.

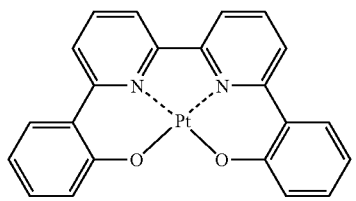

1-1

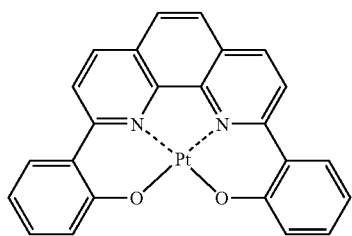

1-2

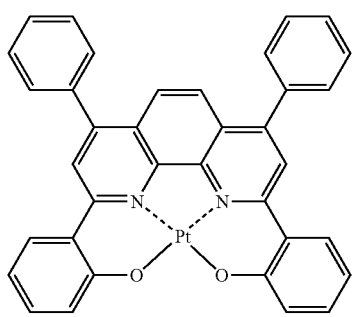

1-3

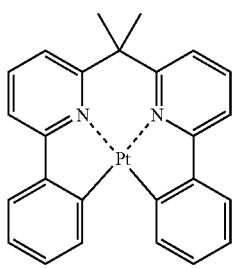

2-1

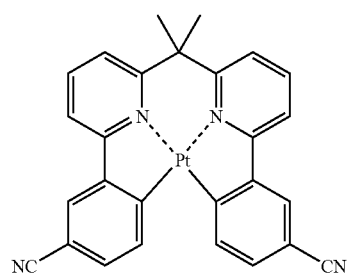

2-2

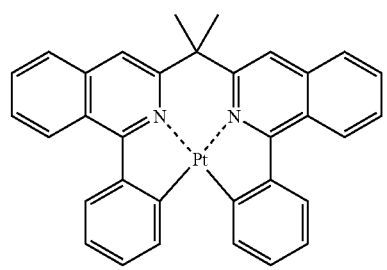

2-3

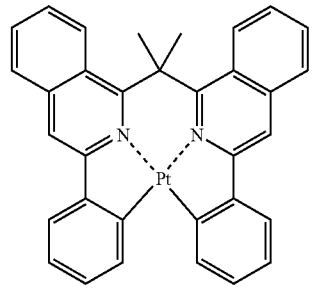

2-4

2-5

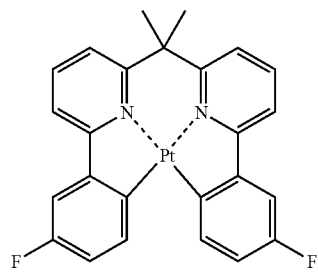

2-6

-continued
2-7
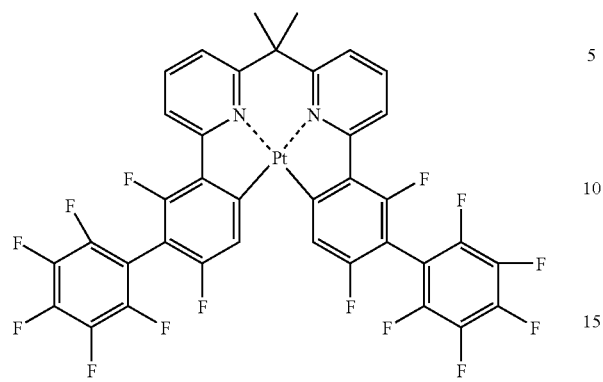
2-8
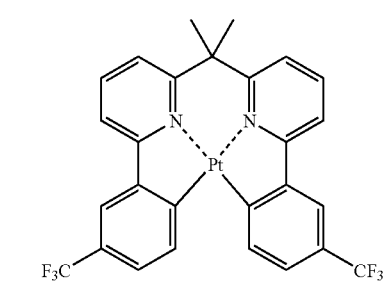
2-9
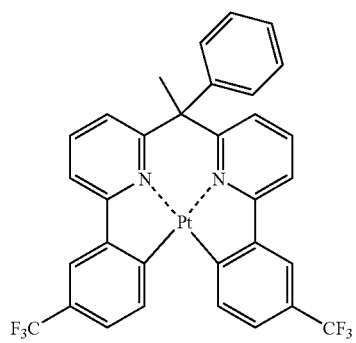
2-10
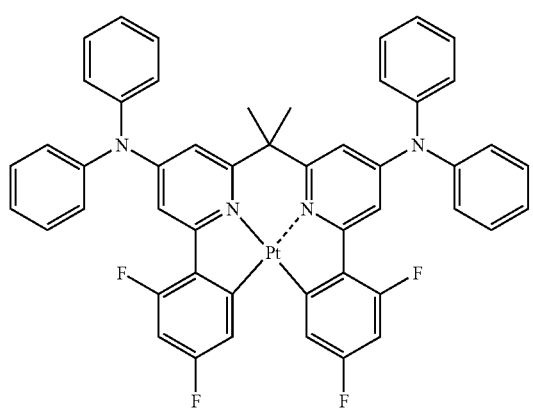
-continued
2-11
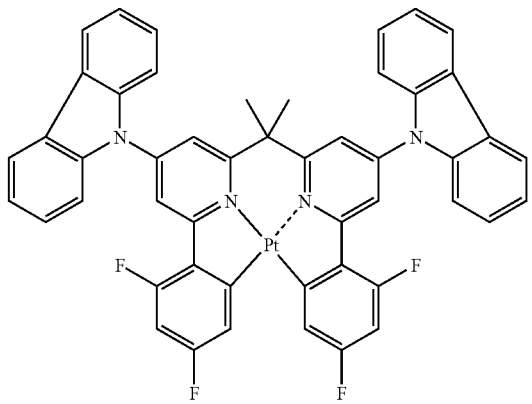
2-12
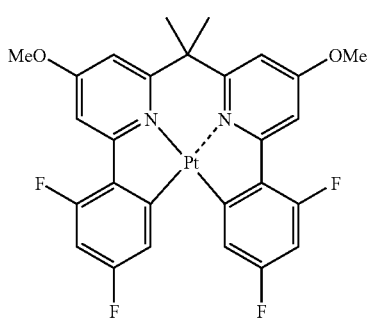
2-13
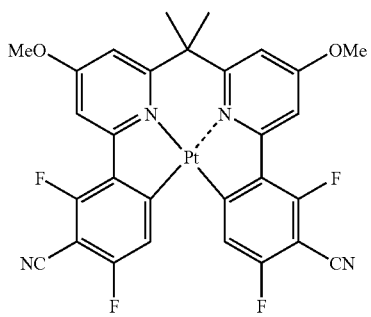
3-1
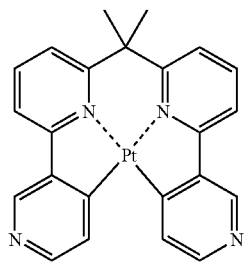
3-2
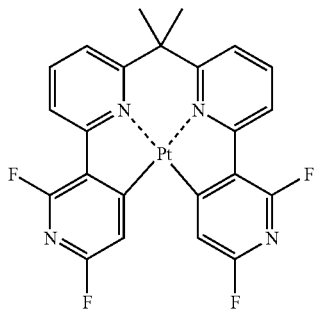

77
-continued
3-3
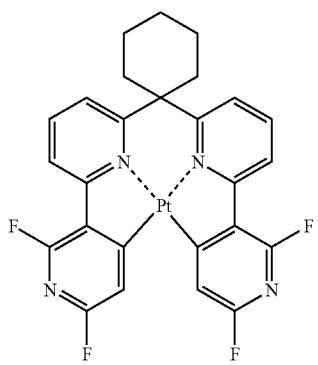
3-4
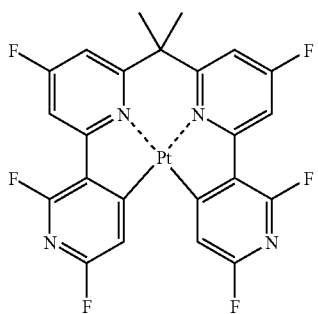
3-5
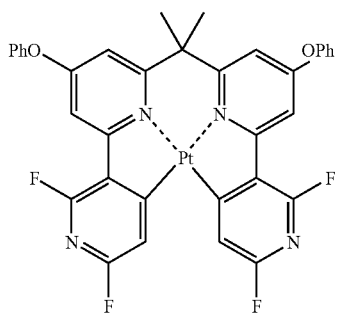
4-1
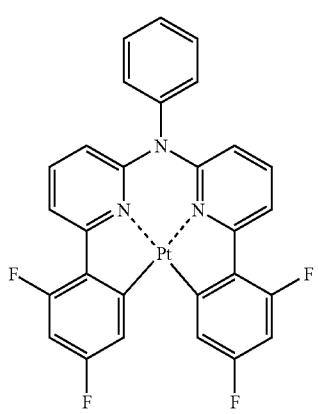
78
-continued
4-2
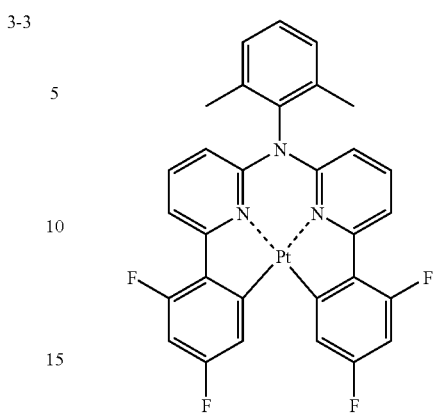
4-3
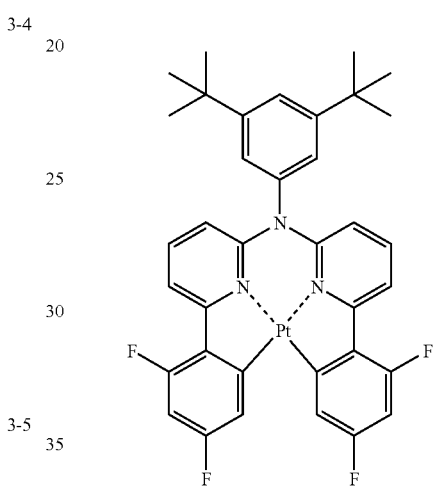
4-4
4-5
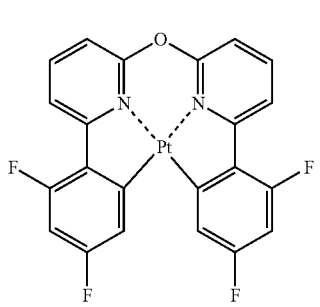

-continued
5-1
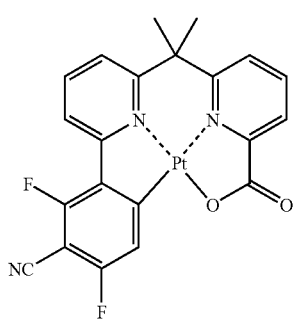
5-2
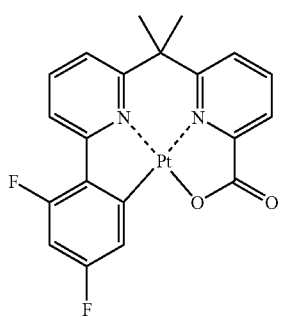
5-3
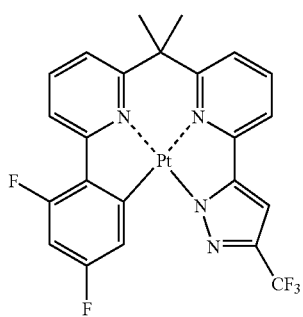
5-4
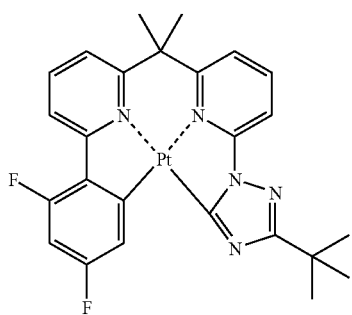
6-1
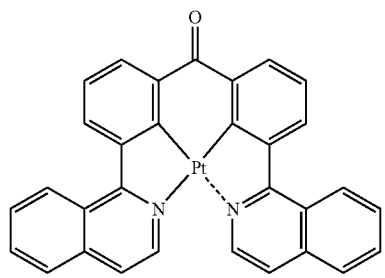
-continued
6-2
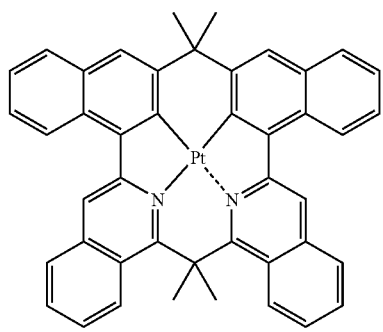
6-3
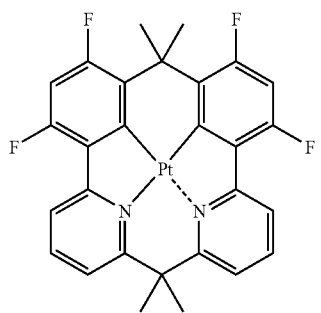
6-4
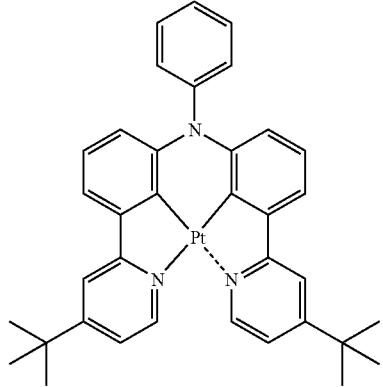
6-5
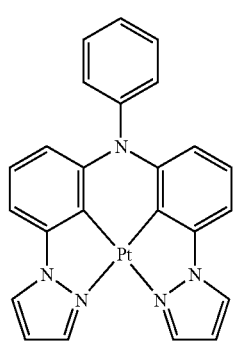

-continued
7-1
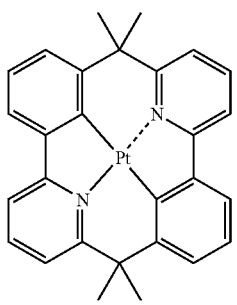
7-2
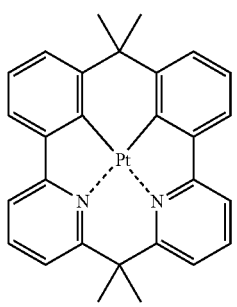
7-3
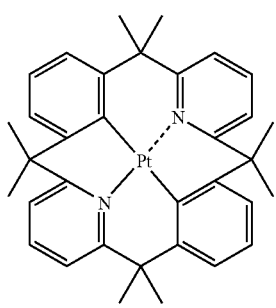
7-4
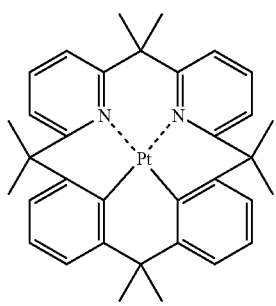
7-5
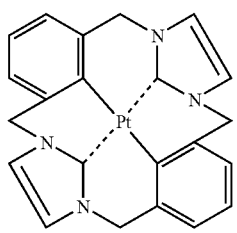
-continued
8-1
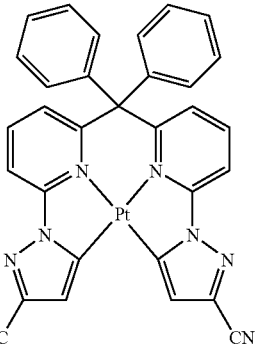
8-2
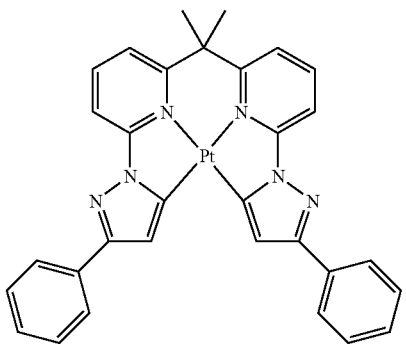
8-3
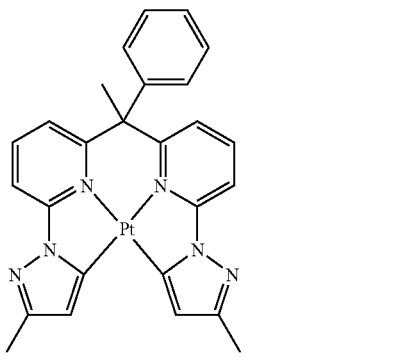
8-4
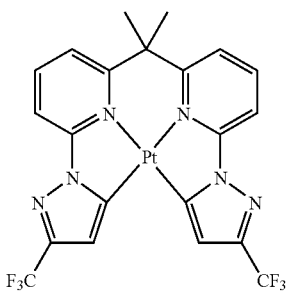
8-5
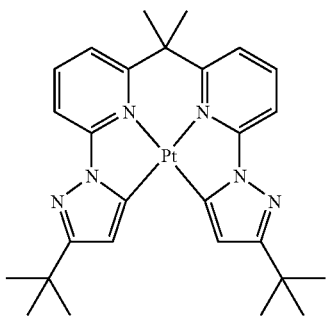

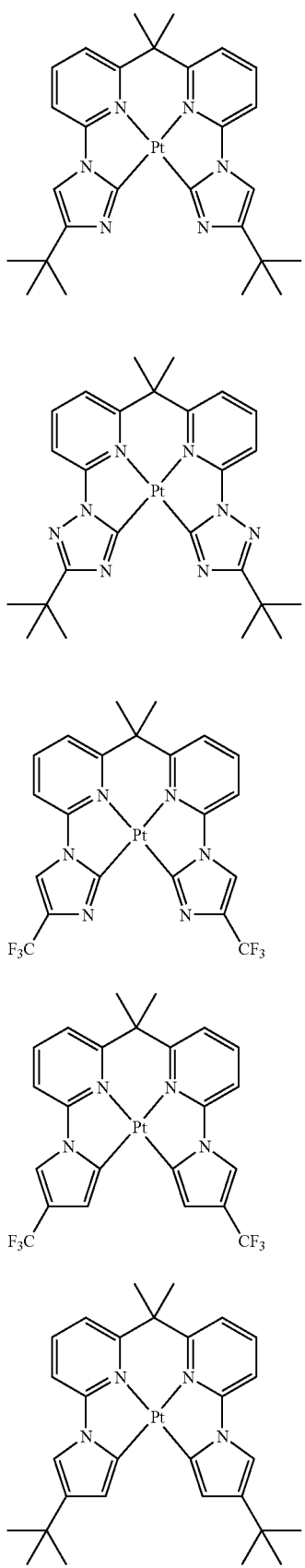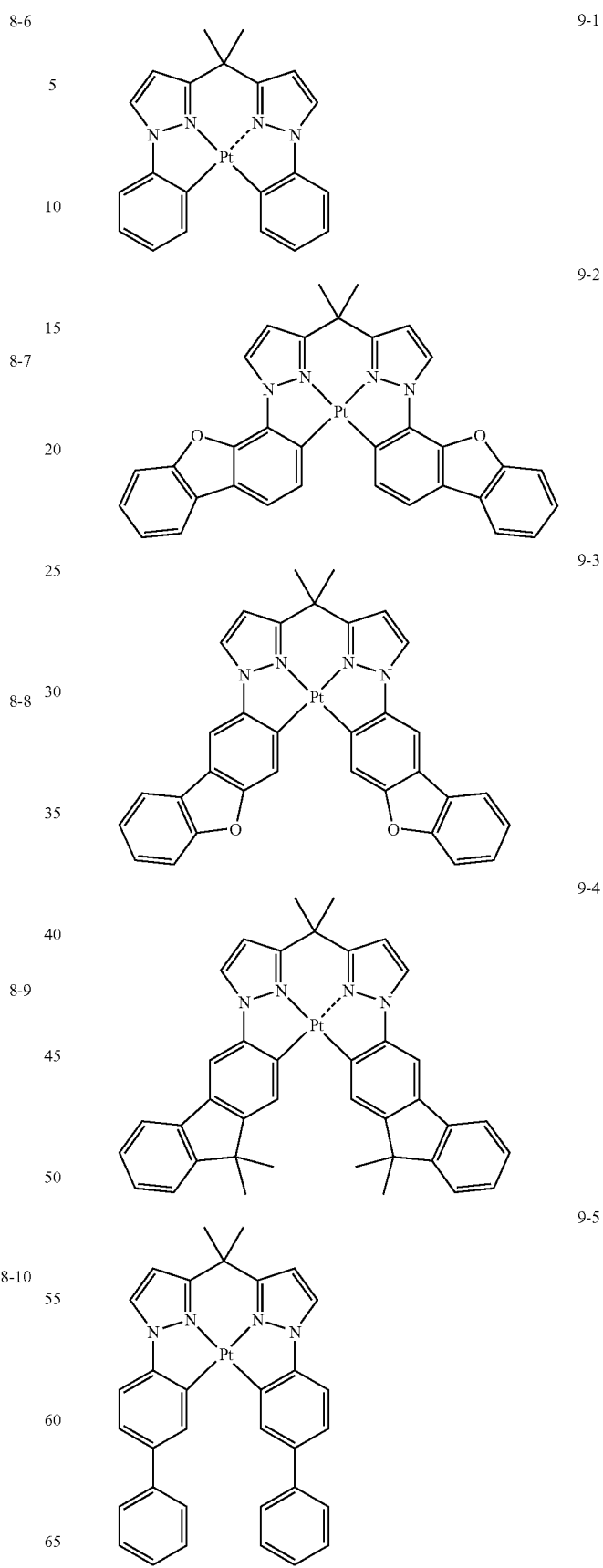

-continued
9-6
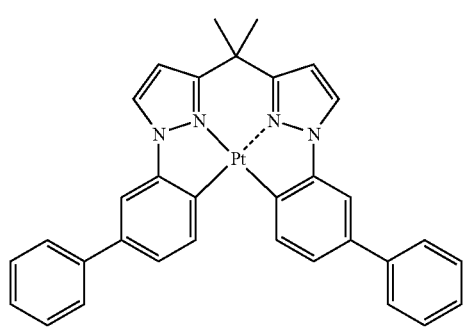
9-7
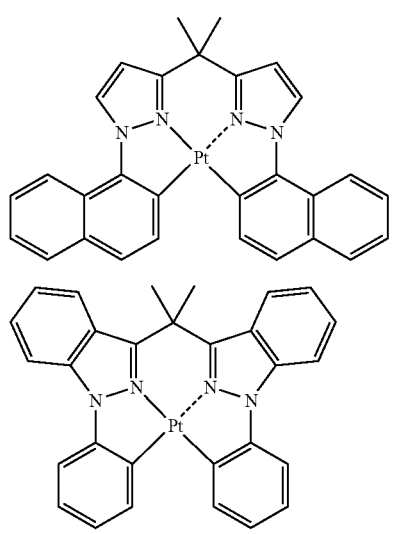
9-8
9-9
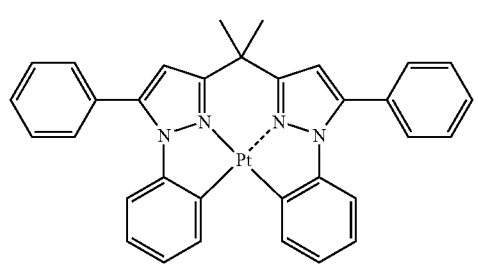
9-10
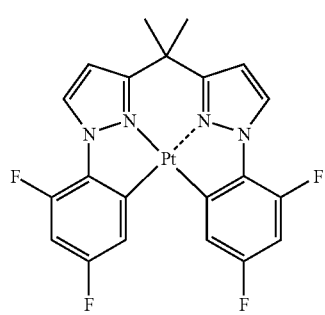
9-11
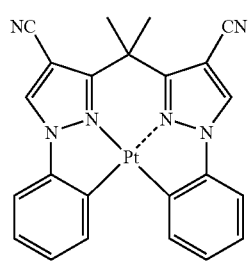
-continued
9-12
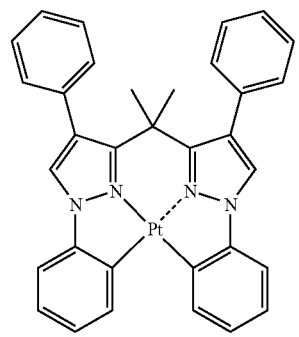
9-13
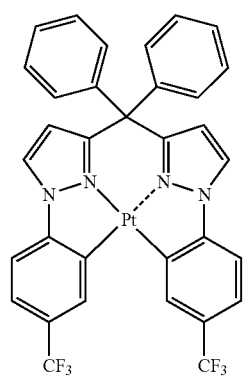
9-14
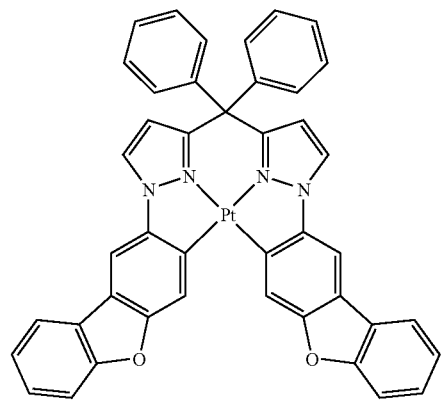
5-6
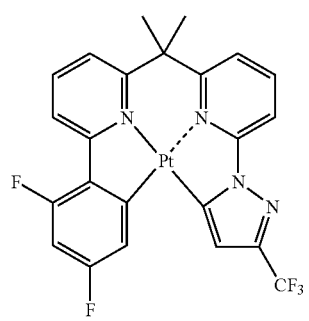

5-7 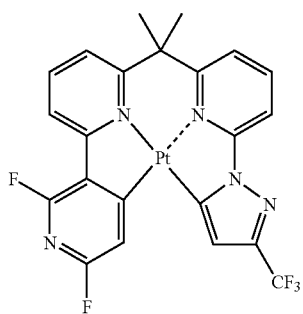
5-8 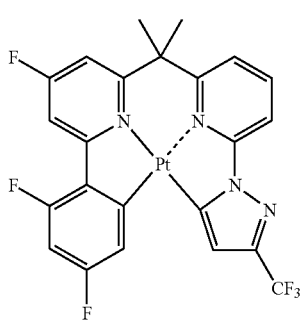
5-9 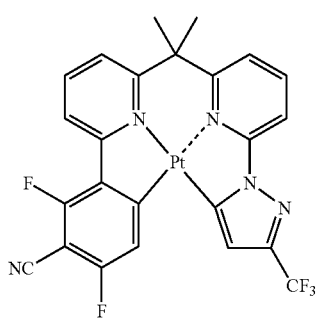
5-10 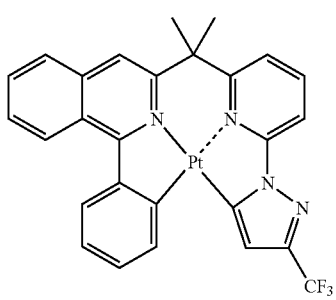
5-11 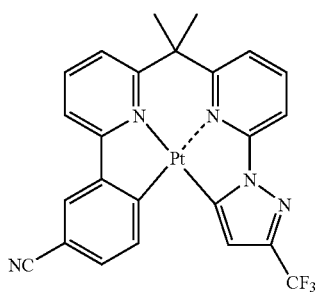
5-12 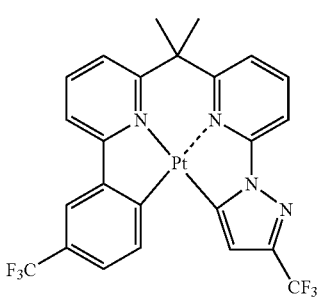
5-13 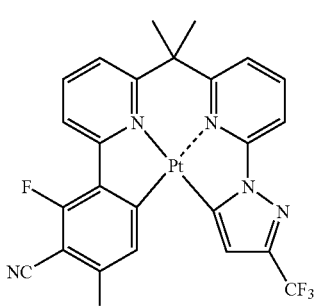
5-14 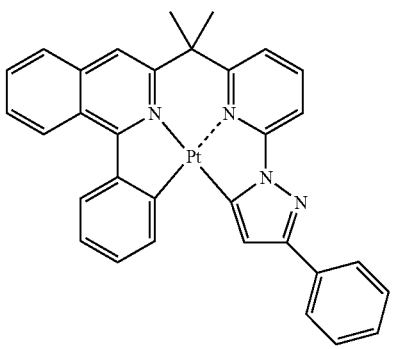
5-15 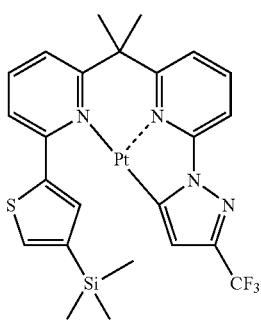
5-16 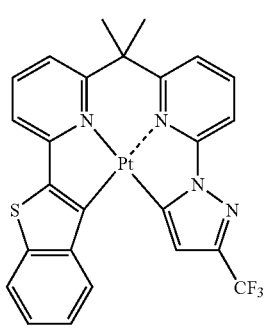

5-17
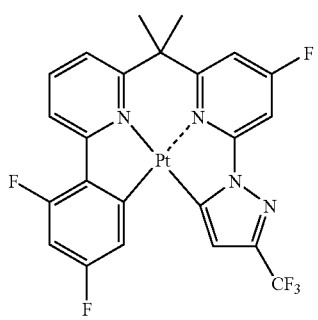
6-6
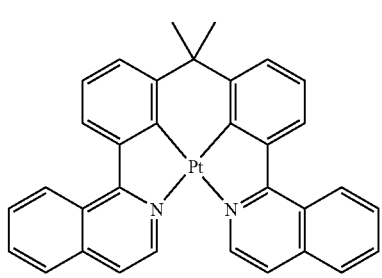
5-18
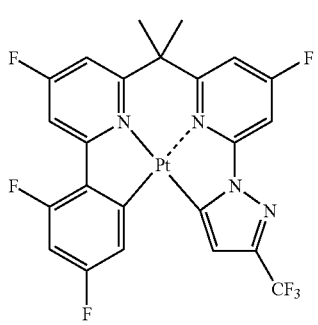
6-7
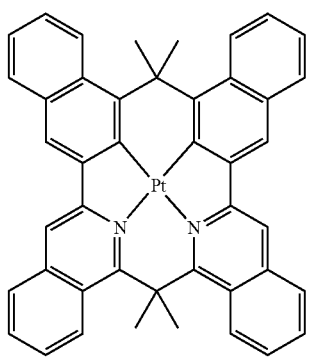
5-19
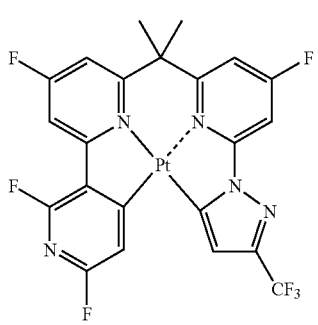
6-8
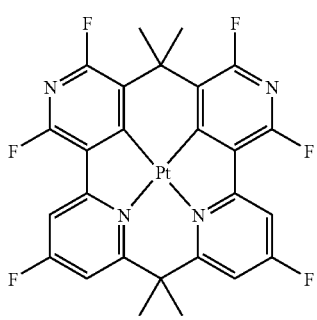
5-20
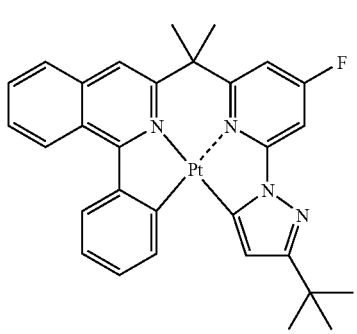
6-9
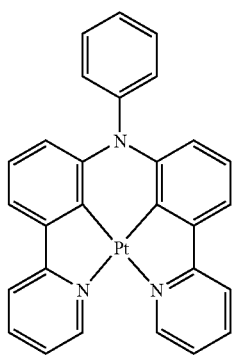
5-21

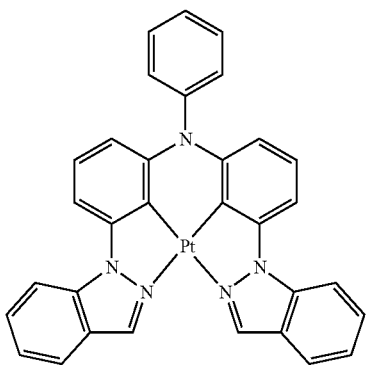

6-10

The metal complex compounds illustrated above can be synthesized according to various methods, such as the methods described in *Journal of Organic Chemistry*, 53, 786 (1988), and more specifically, G. R. Newkome et al., page 789, left column, line 53, to right column, line 7, page 790, left column, lines 18 to 38, and page 790, right column, lines 19 to 30, combinations of these methods, and the method described in *Chemische Berichte*, 113, 2749 (1980), and more specifically, H, Lexy et al., page 2752, lines 26 to 35.

For example, those compounds can be synthesized from metal compounds and ligands or dissociated ligands in the presence or absence of a solvent (e.g., a halogen-containing solvent, an alcohol solvent, an ether solvent, an ester solvent, a ketone solvent, a nitrile solvent, an amide solvent, a sulfone solvent, a sulfoxide solvent, water), in the presence or absence of a base (including inorganic and organic bases, such as sodium methoxide, potassium t-butoxide, triethylamine and potassium carbonate) under room temperature or application of heat (in the usual way or by means of a microwave device).

The platinum complexes having tetradentate ligands, though favorably used as light-emitting materials, may be used as materials other than light-emitting ones.

Each of the platinum complexes having tetradentate ligands is generally incorporated into a light-emitting layer in an amount of 0.1 to 50 mass % based on all the compounds forming the light-emitting layer. From the viewpoints of durability and external quantum efficiency, the platinum complex content in the light-emitting layer is preferably from 1 to 50 mass %, more preferably from 2 to 40 mass %.

Examples of an iridium complex phosphorescent material include the compounds disclosed in International Patent Publication Nos. 00/70655, 01/41512, and 02/5645, JP-A-2002-117978, and International Patent Publication Nos. 04/085450, 06/121811, 05/019373 and 05/113704.

Iridium complexes especially suitable as iridium complex phosphorescent materials are an iridium complex whose ligand is bound to an iridium atom via its carbene, an iridium complex whose ligand is bound to an iridium atom via the nitrogen atom of its pyrazole skeleton and an iridium complex whose ligand is bound to an iridium atom via the nitrogen atom of its pyridine skeleton. Of these iridium complexes, the iridium complex whose ligand is bound to an iridium atom via its carbene and the iridium complex whose ligand is bound to an iridium atom via the nitrogen atom of its pyrazole skeleton are preferable to the other. And the iridium complex whose ligand is bound to an iridium atom via the nitrogen atom of its pyrazole skeleton is especially preferred.

The expression of "ligand is bound to an iridium atom" signifies that the bond between a ligand and an iridium atom may be either a covalent bond, or a coordinate bond, or an ionic bond.

Examples of the carbene forming a coordinate bond together with an iridium atom include carbon monoxide, an isonitrile group and a carbon carbene stabilized with a hetero atom.

Suitable examples of an iridium complex phosphorescent material containing a ligand bound to an iridium atom via its carbene include iridium complexes represented by the following formula (II).

The formula (II) is illustrated.

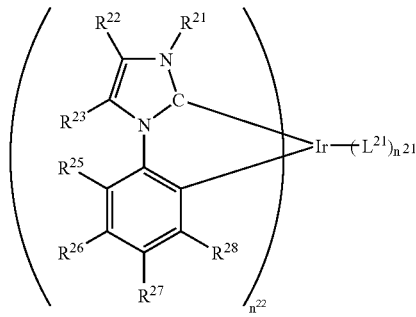

Formula (II)

In the formula (II), each of $R^{21}$ to $R^{23}$ and $R^{25}$ to $R^{28}$ independently represents a hydrogen atom or a substituent, $L^{21}$ represents a ligand, $n^{22}$ stand for an integer of 1 to 3, and $n^{21}$ stand for an integer of 0 to 4. C stands for the carbene carbon and forms a coordinate bond together with the iridium atom.

Each of $R^{21}$ to $R^{23}$ and $R^{25}$ to $R^{28}$ independently represents a hydrogen atom or a substituent.

Examples of the substituent include alkyl groups (preferably $C_{1-30}$, more preferably $C_{1-20}$, especially preferably $C_{1-10}$, alkyl groups, such as methyl, ethyl, isopropyl, tert-butyl, n-octyl, n-decyl, n-hexadecyl, cyclopropyl, cyclopentyl and cyclohexyl), alkenyl groups (preferably $C_{2-30}$, more preferably $C_{2-20}$, especially preferably $C_{2-10}$, alkenyl groups, such as vinyl, allyl, 2-butenyl and 3-pentenyl), alkynyl groups (preferably $C_{2-30}$, more preferably $C_{2-20}$, especially preferably $C_{2-10}$, alkynyl groups, such as propargyl and 3-pentynyl), aryl groups (preferably $C_{6-30}$, more preferably $C_{6-20}$, especially preferably $C_{6-12}$, aryl groups, such as phenyl, p-methylphenyl, naphthyl and anthranyl), amino groups (preferably $C_{0-30}$, more preferably $C_{0-20}$, especially preferably $C_{0-10}$, amino groups, such as amino, methylamino, dimethylamino, diethylamino, dibenzylamino, diphenylamino and ditolylamino), alkoxy groups (preferably $C_{1-30}$, more preferably $C_{1-20}$, especially preferably $C_{1-10}$, alkoxy groups, such as methoxy, ethoxy, butoxy and 2-ethylhexyloxy), aryloxy groups (preferably $C_{6-30}$, more preferably $C_{6-20}$, especially preferably $C_{6-12}$, aryloxy groups, such as phenyloxy, 1-naphthyloxy and 2-naphthyloxy), heterocyclic oxy groups (preferably $C_{1-30}$, more preferably $C_{1-20}$, especially preferably $C_{1-12}$, heterocyclic oxy groups, such as pyridyloxy, pyrazyloxy, pirimidyloxy and quinolyloxy), acyl groups (preferably $C_{2-30}$, more preferably $C_{2-20}$, especially preferably $C_{2-12}$, acyl groups, such as acetyl, benzoyl, formyl and pivaroyl), alkoxycarbonyl groups (preferably $C_{2-30}$, more preferably $C_{2-20}$, especially preferably $C_{2-12}$, alkoxycarbonyl groups, such as methoxycarbonyl and ethoxycarbonyl), aryloxycarbonyl groups (preferably $C_{7-30}$, more preferably $C_{7-20}$, especially preferably $C_{7-12}$, aryloxycarbonyl groups, such as phenyloxycarbonyl), acyloxy groups (preferably $C_{2-30}$, more preferably $C_{2-20}$, especially preferably $C_{2-10}$, acyloxy groups, such as acetoxy and benzoyloxy), acylamino groups (preferably $C_{2-30}$, more preferably $C_{2-20}$, especially preferably $C_{2-10}$, acylamino groups, such as acetylamino and benzoylamino), alkoxycarbonylamino groups (preferably $C_{2-30}$, more preferably $C_{2-20}$, especially preferably $C_{2-12}$, alkoxycarbonylamino groups, such as methoxycarbonylamino), aryloxycarbonylamino groups (preferably $C_{7-30}$, more preferably $C_{7-20}$, especially preferably $C_{7-12}$, aryloxycarbonylamino groups, such as phenyloxycarbonylamino), sulfonylamino groups (preferably $C_{1-30}$, more preferably $C_{1-20}$, especially preferably $C_{1-10}$, sulfonylamino groups, such as methanesulfonylamino and benzenesulfonylamino), sulfamoyl groups (preferably $C_{0-30}$, more preferably $C_{0-20}$, especially preferably $C_{0-12}$, sulfamoyl groups, such as sulfamoyl, methylsulfamoyl, dimethylsulfamoyl and phenylsulfamoyl), carbamoyl groups (preferably $C_{1-30}$, more preferably $C_{1-20}$, especially preferably $C_{1-12}$, carbamoyl groups, such as carbamoyl, methylcarbamoyl, diethylcarbamoyl and phenylcarbamoyl), alkylthio groups (preferably $C_{1-30}$, more preferably $C_{1-20}$, especially preferably $C_{1-12}$, alkylthio groups, such as methylthio and ethylthio), arylthio groups (preferably $C_{6-30}$, more preferably $C_{6-20}$, especially preferably $C_{6-12}$, arylthio groups, such as phenylthio), heterocyclic thio groups (preferably $C_{1-30}$, more preferably $C_{1-20}$, especially preferably $C_{1-12}$, heterocyclic thio groups, such as pyridylthio, 2-benzimidazolylthio, 2-benzoxazolylthio and 2-benzthiazolylthio), sulfonyl groups (preferably $C_{1-30}$, more preferably $C_{1-20}$, especially preferably $C_{1-12}$, sulfonyl groups, such as mesyl and tosyl), sulfinyl groups (preferably $C_{1-30}$, more preferably $C_{1-20}$, especially preferably $C_{1-12}$, sulfinyl groups, such as methanesulfinyl and benzenesulfinyl), ureido groups (preferably $C_{1-30}$, more preferably $C_{1-20}$, especially preferably $C_{1-12}$, ureido groups, such as ureido, methylureido and phenylureido), phosphoric acid amide groups (preferably $C_{1-30}$, more preferably $C_{1-20}$, especially preferably $C_{1-12}$, phosphoric acid amide groups, such as diethylphosphoric acid amido and phenylphosphoric acid amido), a hydroxy group, a mercapto group, halogen atoms (e.g., a fluorine atom, a chlorine atom, a bromine atom, an iodine atom), a cyano group, a sulfo group, a carboxyl group, a nitro group, a hydroxamic acid group, a sulfino group, a hydrazino group, an imino group, heterocyclic groups (preferably $C_{1-30}$, more preferably $C_{1-12}$, heterocyclic groups each containing a nitrogen, oxygen or sulfur atom as a hetero atom, with examples including imidazolyl, pyridyl, quinolyl, furyl, thienyl, piperidyl, morpholino, benzoxazolyl, benzimidazolyl, benzothiazolyl, carbazolyl and azepinyl), silyl groups (preferably $C_{3-40}$, more preferably $C_{3-30}$, especially preferably $C_{3-24}$, silyl groups, such as trimethylsilyl and triphenylsilyl), and silyloxy groups (preferably $C_{3-40}$, more preferably $C_{3-30}$, especially preferably $C_{3-24}$, silyloxy groups, such as trimethylsilyloxy and triphenylsilyloxy). These substituents each may further be substituted.

$R^{21}$ and $R^{22}$, or $R^{22}$ and $R^{23}$, may combine with each other to form a ring structure.

The substituent as $R^{21}$ is preferably an alkyl group, an aryl group or a heteroaryl group, more preferably an alkyl group or an aryl group, especially preferably a methyl group, a tert-butyl group, a phenyl group, a mesityl group or a 2-o-xylyl group.

The substituent as $R^{22}$ and $R^{23}$ each is preferably an alkyl group, an aryl group or a heteroaryl group, more preferably an alkyl group or an aryl group, especially preferably a methyl group, a tert-butyl group or a phenyl group.

The substituent as $R^{25}$ to $R^{27}$ each is preferably an alkyl group, an aryl group, a heteroaryl group, a halogen atom or a cyano group, more preferably an alkyl group, an aryl group, a halogen atom or a cyano group, especially preferably a methyl group, a tert-butyl group, a phenyl group, a fluorine atom or a cyano group.

$L^{21}$ represents a ligand. Examples of the ligand include the ligands described in, for example, H. Yersin, *Photochemistry and Photophysics of Coordination Compounds*, published by Springer-Verlag in 1987; and Yamamoto Akio, *Yuki Kinzoku Kagaku Kiso to Oyo* (which might be translated "Organometallic Chemistry—Principles and Applications"), published by Shokabo Publishing in 1982. And more specifically, the ligand is preferably a halogen ligand (preferably a chlorine ligand or a bromine ligand), a nitrogen-containing heterocyclic ring ligand (such as bipyridyl, phenanthroline, phenylpyridine, pyrazolylpyridine, benzimidazolylpyridine, phenylpyrazole, picolinic acid or a dipicolinic acid), a diketone ligand (such as acetylacetone, 1,1,1,5,5,5-hexafluoropentane-2,3-dione or 2,2,6,6-tetramethylheptane-3,5-dione), a nitrile ligand, a CO ligand, an isonitrile ligand, a phosphorus-containing ligand (such as a phosphine derivative, a phosphorous ester derivative or a phosphinine derivative) or a carboxylic acid ligand (such as acetic acid ligand), more preferably a nitrogen-containing heterocyclic ring ligand or a diketone ligand, especially preferably a diketone ligand.

The nitrogen-containing heterocyclic ring in a nitrogen-containing heterocyclic ring ligand is preferably a pyridine ring, a pyrazine ring, a pyrimidine ring, a pyridazine ring, a pyrrole ring, a pyrazole ring, an imidazole ring, a triazole ring, a thiazole ring, an oxazole ring, an oxadiazole ring, a thiadiazole ring or an azaphosphinine ring, more preferably a pyridine ring, a pyrrole ring, a pyrazole ring or an imidazole ring, still more preferably a pyridine ring, a pyrazole ring or an imidazole ring.

Each of these nitrogen-containing heterocyclic ligands may have a substituent. Examples of the substituent include the groups recited as examples of the substituent represented by $R^{11}$. Of such groups, an alkyl group, an aryl group, an alkoxy group, a fluorine atom, a cyano group, a substituted amino group and the like are preferred over the others.

$n^{22}$ is preferably 2 or 3, especially preferably 3. When $n^{21}$ is 2 or 3, a plurality of $L^{21}$'s may be the same or different. When $n^{22}$ is 2 or 3, the ligands the number of which is determined by the $n^{22}$ may be the same or different.

Of the iridium complex phosphorescent materials which each contain a ligand bound to an iridium atom via its carbene and are represented by the formula (II), iridium complex phosphorescent materials represented by the following formula (III) are preferred.

The formula (III) are illustrated.

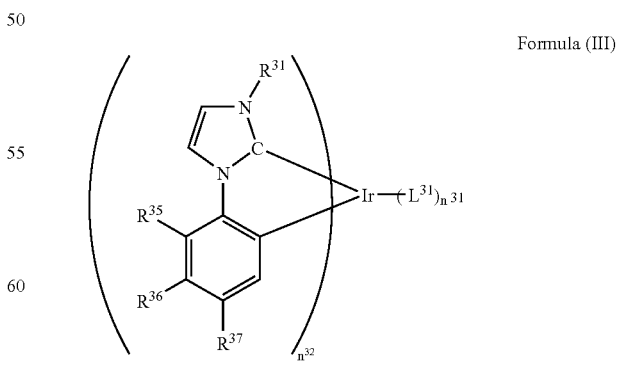

Formula (III)

In the formula (III), $R^{31}$ represents an alkyl group or an aryl group, each of $R^{35}$ to $R^{37}$ independently represents a hydrogen atom, a fluorine atom, an alkyl group or a cyano group.

Alternatively, $R^{35}$ and $R^{36}$, or $R^{36}$ and $R^{37}$, may combine with each other to form a fused ring structure. $L^{31}$ represents a ligand, $n^{32}$ stand for an integer of 1 to 3, and $n^{31}$ stands for an integer of 0 to 4. C stands for a carbene carbon and forms a coordinate bond together with an iridium atom.

$R^{31}$ represents an alkyl group or an aryl group, preferably an alkyl group.

The alkyl group of $R^{31}$ is preferably a methyl group, an ethyl group, a tert-butyl group or a cyclohexyl group, more preferably a methyl group or a tert-butyl group, especially preferably a methyl group.

The aryl group of $R^{31}$ is preferably a phenyl group, a p-methylphenyl group, a 2-xylyl group, a 5-xylyl group, a mesityl group, a 1-naphthyl group, a 2-naphthyl group. or an anthranyl group, more preferably a phenyl group, a p-methylphenyl group, a 2-xylyl group, a 5-xylyl group or a mesityl group, especially preferably a phenyl group.

$R^{35}$, $R^{36}$ and $R^{37}$ have the same meanings as the substituents $R^{25}$, $R^{26}$ and $R^{27}$ in the formula (II) have respectively.

$R^{35}$ is preferably a hydrogen atom, a fluorine atom, an alkyl group or a cyano group, more preferably a hydrogen atom, a fluorine atom or a cyano group, especially preferably a fluorine atom.

$R^{36}$ is preferably a hydrogen atom, a fluorine atom, an alkyl group or a cyano group, more preferably a hydrogen atom, a fluorine atom or a cyano group, especially preferably a cyano group.

$R^{37}$ is preferably a hydrogen atom, a fluorine atom, an alkyl group or a cyano group, more preferably a fluorine atom or a cyano group, especially preferably a cyano group.

The alkyl group of $R^{35}$, $R^{36}$ and $R^{37}$ each is preferably a methyl group, an ethyl group, a tert-butyl group, a cyclohexyl group, a trifluoromethyl group or a perfluorobutyl group, more preferably a methyl group, a tert-butyl group, a trifluoromethyl group or a perfluorobutyl group, especially preferably a trifluoromethyl group.

The benzene-fused ring structure formed by combining $R^{35}$ and $R^{36}$ or by combining $R^{36}$ and $R^{37}$ is preferably dibenzofuranyl, dibenzothiophenyl, N-phenylcarbazolyl, N-methylcarbazolyl, 9,9-dimethylfluorenyl, N-phenylindolyl, benzothienyl or 1,1-dimethylindenyl, more preferably dibenzofuryl, dibenzothiophenyl, N-phenylcarbazolyl, N-methylcarbazolyl or 9,9-dimethylfluorenyl, especially preferably a dibenzofranyl.

Each of the bonding positions of oxygen and sulfur atoms in the dibenzofuranyl and dibenzothiophenyl structures, respectively, which are each formed by combining $R^{35}$ and $R^{36}$ or by combining $R^{36}$ and $R^{37}$, is preferably in the position of $R^{35}$ or $R^{37}$, especially preferably in the position of $R^{35}$.

$L^{31}$ has the same meaning as the ligand $L^{21}$ in the formula (II) has, and preferred ranges of these ligands are also the same.

$n^{31}$ and $n^{32}$ have the same meanings as $n^{21}$ and $n^{22}$ in the formula (II) have respectively, and preferred ranges thereof and those of $n^{21}$ and $n^{22}$ are also the same respectively.

The iridium complex phosphorescent materials which each contain a ligand bound to the iridium atom via the nitrogen atom of its pyrazole skeleton are preferably iridium complexes represented by the following formula (IV).

The formula (IV) is illustrated.

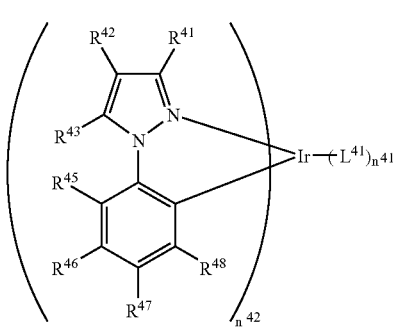

Formula (IV)

In the formula (IV), each of $R^{41}$ to $R^{43}$ and $R^{41}$ to $R^{48}$ independently represents a hydrogen atom or a substituent, $L^{41}$ represents a ligand, $n^{42}$ stands for an integer of 1 to 3, and $n^{41}$ stands for an integer of 0 to 4.

$R^{41}$ to $R^{43}$ and $R^{45}$ to $R^{48}$ have the same meanings as $R^{21}$ to $R^{23}$ and $R^{25}$ to $R^{28}$ in the formula (II) have respectively.

The substituent as $R^{41}$ to $R^{43}$ each is preferably an alkyl group, an aryl group or a heteroaryl group, more preferably an alkyl group or an aryl group, especially preferably a methyl group, a tert-butyl group or a phenyl group.

The substituent as $R^{45}$ to $R^{47}$ each is preferably an alkyl group, an aryl group, a heteroaryl group, a halo group or a cyano group, more preferably an alkyl group, an aryl group, a halo group or a cyano group, especially preferably a methyl group, a tert-butyl group, a phenyl group, a fluorine atom or a cyano group.

$R^{45}$ and $R^{46}$, or $R^{46}$ and $R^{47}$, may combine with each other to form a ring structure.

$L^{41}$ has the same meaning as the ligand $L^{21}$ in the formula (II) has, and preferred ranges of these ligands are also the same.

$n^{41}$ and $n^{42}$ have the same meanings as $n^{21}$ and $n^{22}$ in the formula (II) have respectively, and preferred ranges thereof and those of $n^{21}$ and $n^{22}$ are also the same respectively.

The iridium complex phosphorescent materials represented by the formula (IV), which each contain a ligand bound to the iridium atom via the nitrogen atom of its pyrazole skeleton, are more preferably iridium complex phosphorescent materials represented by the following formula (V).

The formula (V) is illustrated.

Formula (V)

In the formula (V), each of $R^{52}$ and $R^{53}$ independently represents a hydrogen atom, an alkyl group or an aryl group, and each of $R^{55}$ to $R^{57}$ independently represents a hydrogen atom, a fluorine atom, an alkyl group or a cyano group.

Alternatively, $R^{55}$ and $R^{56}$, or $R^{56}$ and $R^{57}$, may be groups forming a fused ring structure by combining with each other. $L^{51}$ represents a ligand, $n^{52}$ stands for an integer of 1 to 3, and $n^{51}$ stands for an integer of 0 to 4.

Each of $R^{52}$ and $R^{53}$ is preferably a hydrogen atom, an alkyl group or an aryl group, more preferably a hydrogen atom, a methyl group, a tert-butyl group or a phenyl group, especially preferably a hydrogen atom.

$R^{55}$, $R^{56}$ and $R^{57}$ have the same meanings as $R^{35}$, $R^{36}$ and $R^{37}$ in the formula (III) have respectively, and preferred ranges thereof and those of $R^{35}$, $R^{36}$ and $R^{37}$ are the same respectively.

$L^{51}$ has the same meaning as $L^{21}$ in the formula (II) has, and preferred ranges of these ligands are the same.

$n^{51}$ and $n^{52}$ have the same meanings as $n^{21}$ and $n^{22}$ in the formula (II) have respectively, and preferred ranges thereof and those of $n^{21}$ and $n^{22}$ are the same respectively.

The iridium complex phosphorescent materials which each contain a ligand bound to the iridium atom via the nitrogen atom of its pyridine skeleton are preferably iridium complexes represented by the following formula (VI).

The formula (VI) is illustrated.

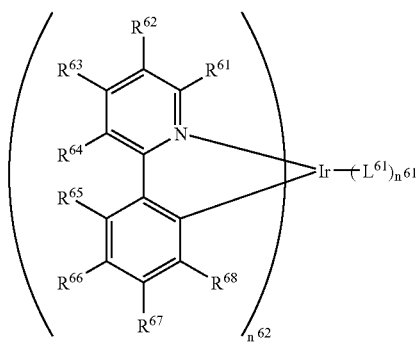

Formula (VI)

In the formula (VI), each of $R^{61}$ to $R^{68}$ independently represents a hydrogen atom or a substituent, $L^{61}$ represents a ligand, $n^{62}$ stands for an integer of 1 to 3, and $n^{61}$ stands for an integer of 0 to 4.

$R^{61}$ to $R^{63}$ and $R^{65}$ to $R^{68}$ have the same meanings as $R^{21}$ to $R^{23}$ and $R^{25}$ to $R^{28}$ in the formula (II) have respectively, and $R^{64}$ has the same meaning as $R^{23}$ in the formula (II) has.

The substituent as $R^{61}$ to $R^{64}$ each is preferably a fluorine atom, an alkyl group, an alkoxy group, an aryloxy group, a heteroaryloxy group or a substituted amino group, more preferably a fluorine atom, an alkyl group, an alkoxy group, an aryloxy group or a substituted amino group, still more preferably a fluorine atom, a methyl group, a tert-butyl group, a methoxy group, a phenoxy group, a dimethylamino group or a diphenylamino group, especially preferably a fluorine atom.

$R^{61}$ and $R^{62}$, or $R^{62}$ and $R^{63}$, or $R^{63}$ and $R^{64}$, may combine with each other to form a ring structure.

The substituent as $R^{65}$ to $R^{68}$ each is preferably an alkyl group, an aryl group, a heteroaryl group, a halo group or a cyano group, more preferably an alkyl group, an aryl group, a halo group or a cyano group, especially preferably a methyl group, a tert-butyl group, a phenyl group, a fluorine atom or a cyano group.

$R^{65}$ and $R^{66}$, or $R^{66}$ and $R^{67}$, or $R^{67}$ and $R^{68}$, may combine with each other to form a ring structure.

$L^{61}$ has the same meaning as $L^{21}$ in the formula (II) has, and preferred ranges of these ligands are also the same.

$n^{61}$ and $n^{62}$ have the same meanings as $n^{21}$ and $n^{22}$ in the formula (II) have respectively, and preferred ranges thereof and those of $n^{21}$ and $n^{22}$ are the same respectively.

The iridium complex phosphorescent materials represented by the formula (VI), which each contain a ligand bound to the iridium atom via the nitrogen atom of its pyridine skeleton, are more preferably iridium complex phosphorescent materials represented by the following formula (VII).

The formula (VII) is illustrated.

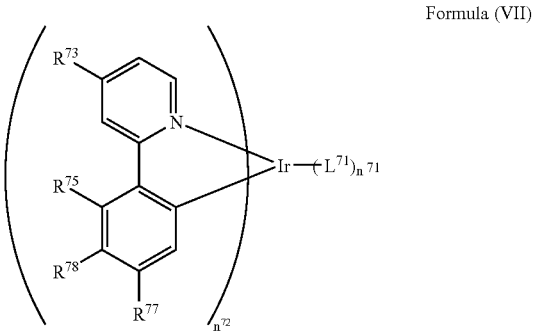

Formula (VII)

In the formula (VII), $R^{73}$ represents a hydrogen atom, an alkyl group, an amino group or an alkoxy group, each of $R^{75}$ to $R^{77}$ independently represents a hydrogen atom, a fluorine atom, a cyano group or an alkyl group, $L^{71}$ represents a ligand, $n^{72}$ represents an integer of 1 to 3, and $n^{71}$ represents an integer of 0 to 4.

$R^{73}$ is preferably a fluorine atom, an alkyl group, an amino group or an alkoxy group, more preferably a fluorine atom, a methyl group, a tert-butyl group, a dimethylamino group, a diphenylamino group, a methoxy group, a tert-butoxy group or a phenoxy group, still more preferably a fluorine atom or a methoxy group, especially preferably a fluorine atom.

$R^{75}$ is preferably a hydrogen atom, a fluorine atom, an alkyl group or a cyano group, more preferably a hydrogen atom, a fluorine atom or a cyano group, especially preferably a fluorine atom.

$R^{76}$ is preferably a hydrogen atom, a fluorine atom, an alkyl group or a cyano group, more preferably a hydrogen atom, a fluorine atom or a cyano group, especially preferably a cyano group.

$R^{77}$ is preferably a hydrogen atom, a fluorine atom, an alkyl group or a cyano group, more preferably a fluorine atom or a cyano group, especially preferably a fluorine atom.

The alkyl group of $R^{75}$, $R^{76}$ and $R^{77}$ each is preferably a methyl group, an ethyl group, a tert-butyl group, a cyclohexyl group, a trifluoromethyl group or a perfluorobutyl group, more preferably a methyl group, a tert-butyl group, a trifluoromethyl group or a perfluorobutyl group, especially preferably a trifluoromethyl group.

$L^{71}$ has the same meaning as $L^{21}$ in the formula (II) has, and preferred ranges of these ligands are also the same.

$n^{71}$ and $n^{72}$ have the same meanings as $n^{21}$ and $n^{22}$ in the formula (II) have respectively, and preferred ranges thereof and those of $n^{21}$ and $n^{22}$ are also the same respectively.

The term "maximum emission wavelength of an iridium complex phosphorescent material" refers to the wavelength at which the emission intensity is maximum of all maximal values in the emission spectrum of an iridium complex phosphorescent material. The maximum emission wavelength is preferably from 450 nm to 470 nm, more preferably from 450 nm to 465 nm, especially preferably from 450 nm to 460 nm.

Examples of the iridium complex phosphorescent materials include the compounds disclosed in International Patent Publication Nos. 00/70655, 01/41512 and 02/5645, JP-A-2002-117978, International Patent Publication Nos. 04/085450, 06/121811, 05/019373, 05/113704 and 04/016711, and *Coordination Chemistry Reviews,* 250, 2093-2126 (2006).

Examples of the iridium complex phosphorescent materials are illustrated below, but these examples should not be construed as limiting the scope of the invention.

Ir-1-1

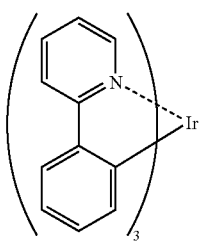

Ir-1-2

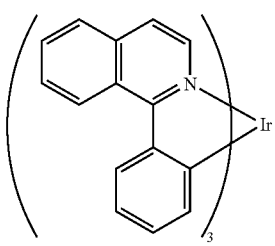

Ir-1-3

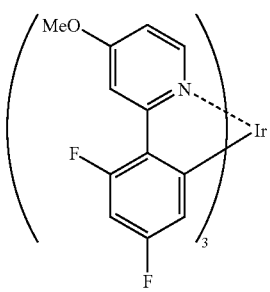

Ir-1-4

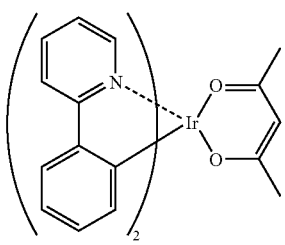

Ir-1-5

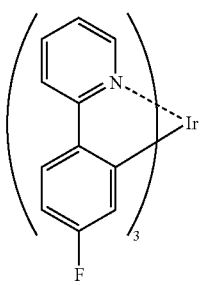

Ir-1-6

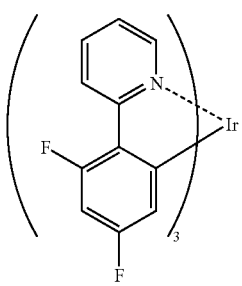

Ir-1-7

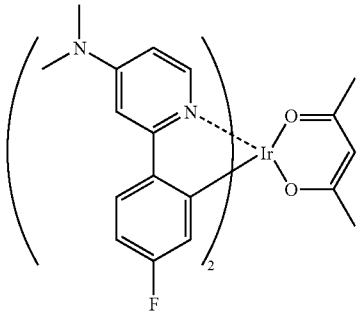

Ir-1-8

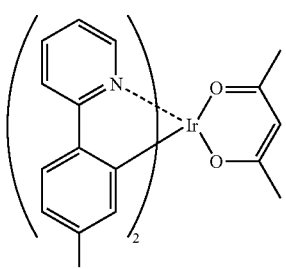

Ir-1-9

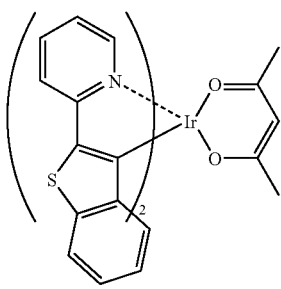

Ir-1-10

Ir-1-11
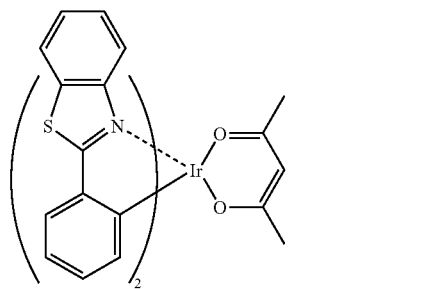
Ir-1-12
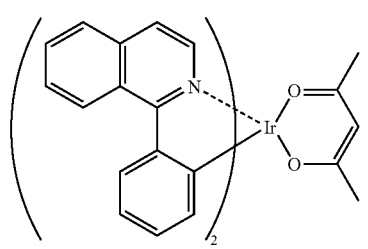
Ir-1-13
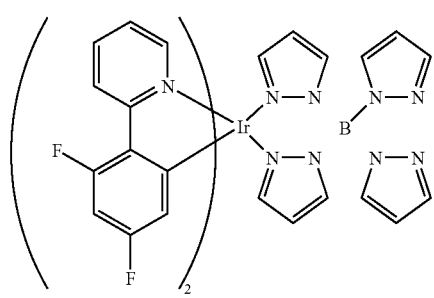
Ir-1-14
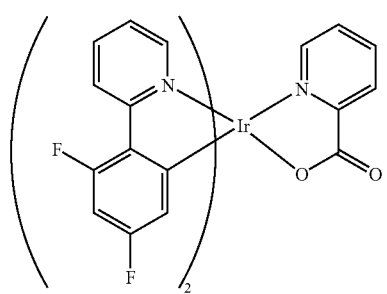
Ir-1-15
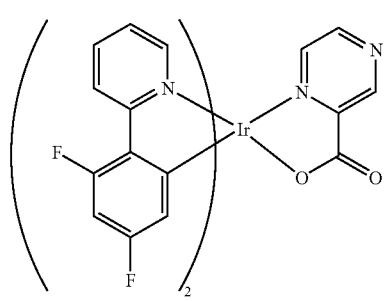
Ir-1-16
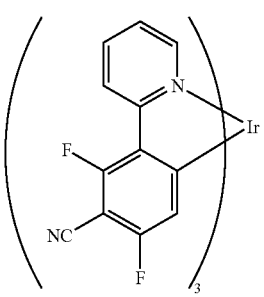
Ir-1-17
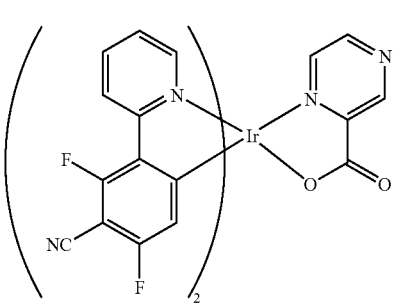
Ir-1-18
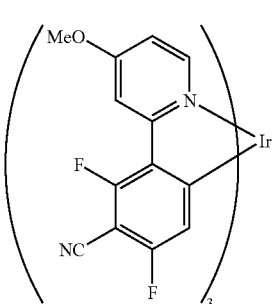
Ir-1-19
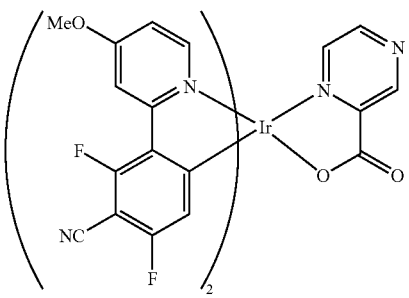
Ir-1-20
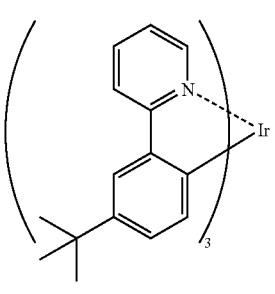

Ir-1-21
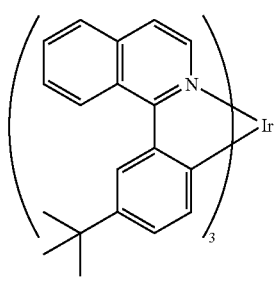
Ir-1-22
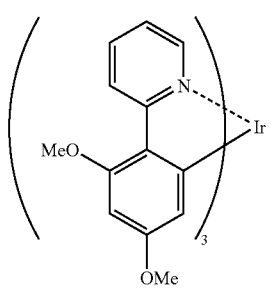
Ir-1-23
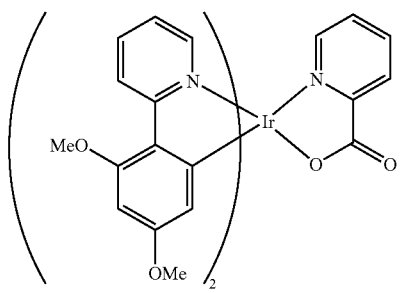
Ir-1-24
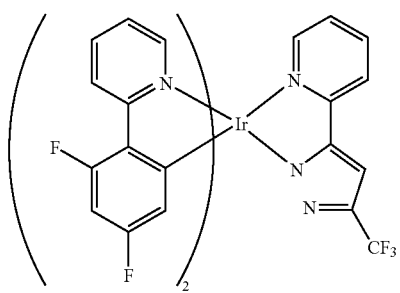
Ir-1-25
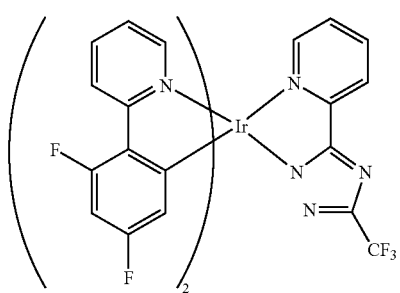
Ir-1-26
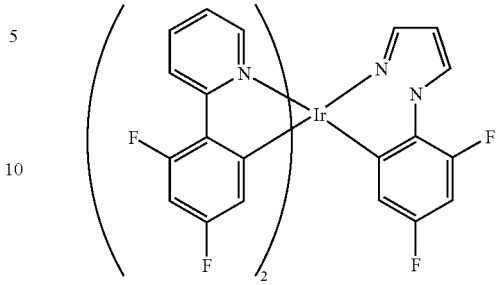
Ir-1-27
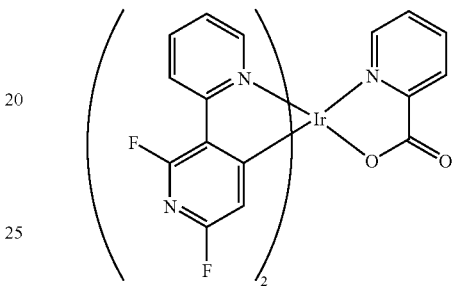
Ir-1-28
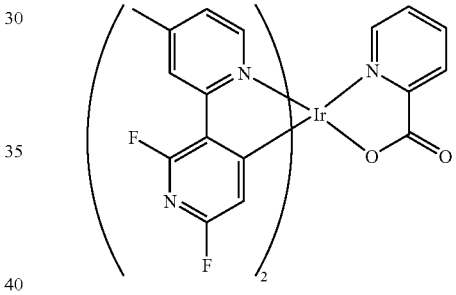
Ir-1-29
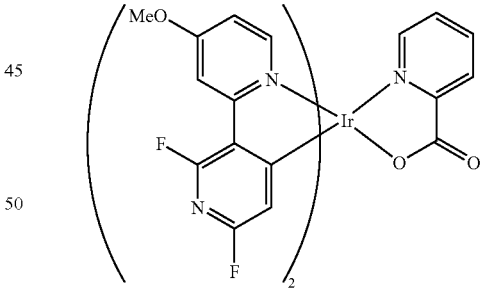
Ir-1-30
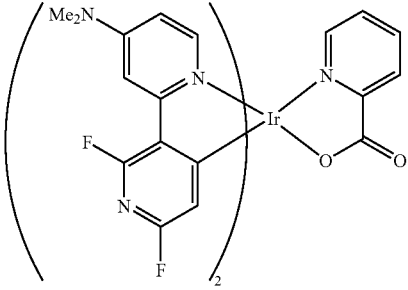

Ir-1-31
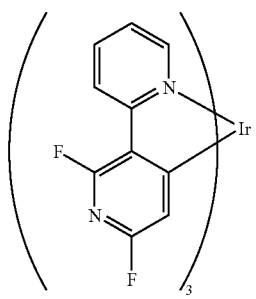
Ir-1-32
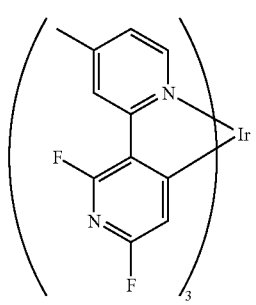
Ir-1-33
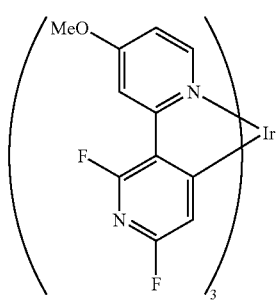
Ir-1-34
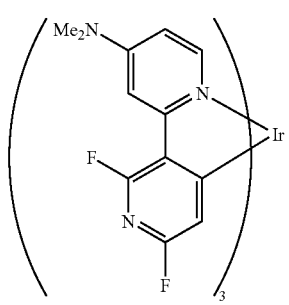
Ir-1-35
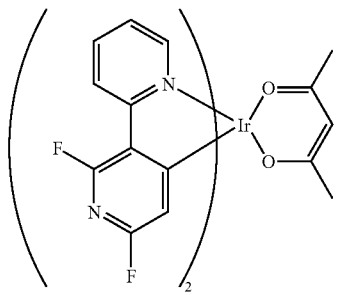
Ir-1-36
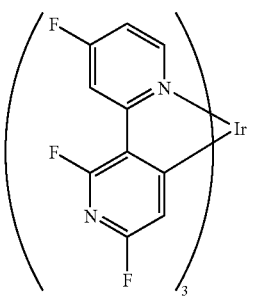
Ir-1-37
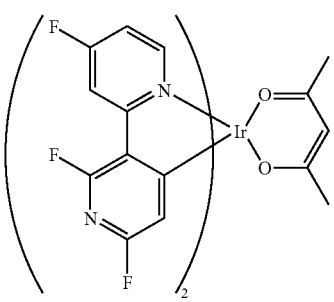
Ir-1-38
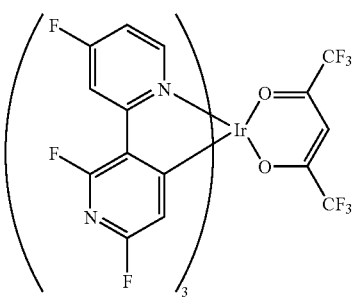
Ir-2-1
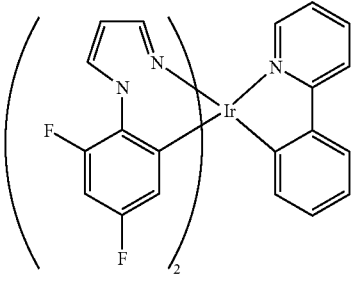
Ir-2-2
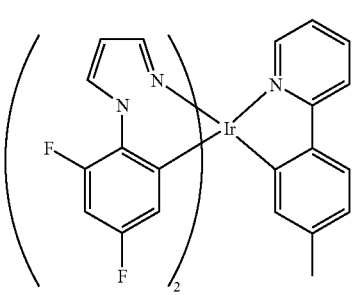

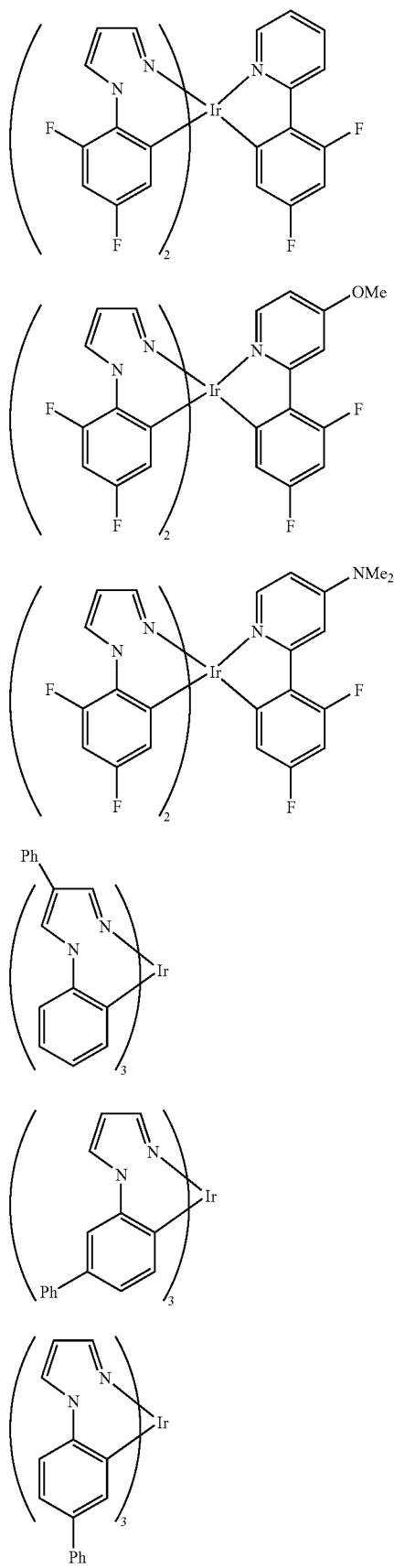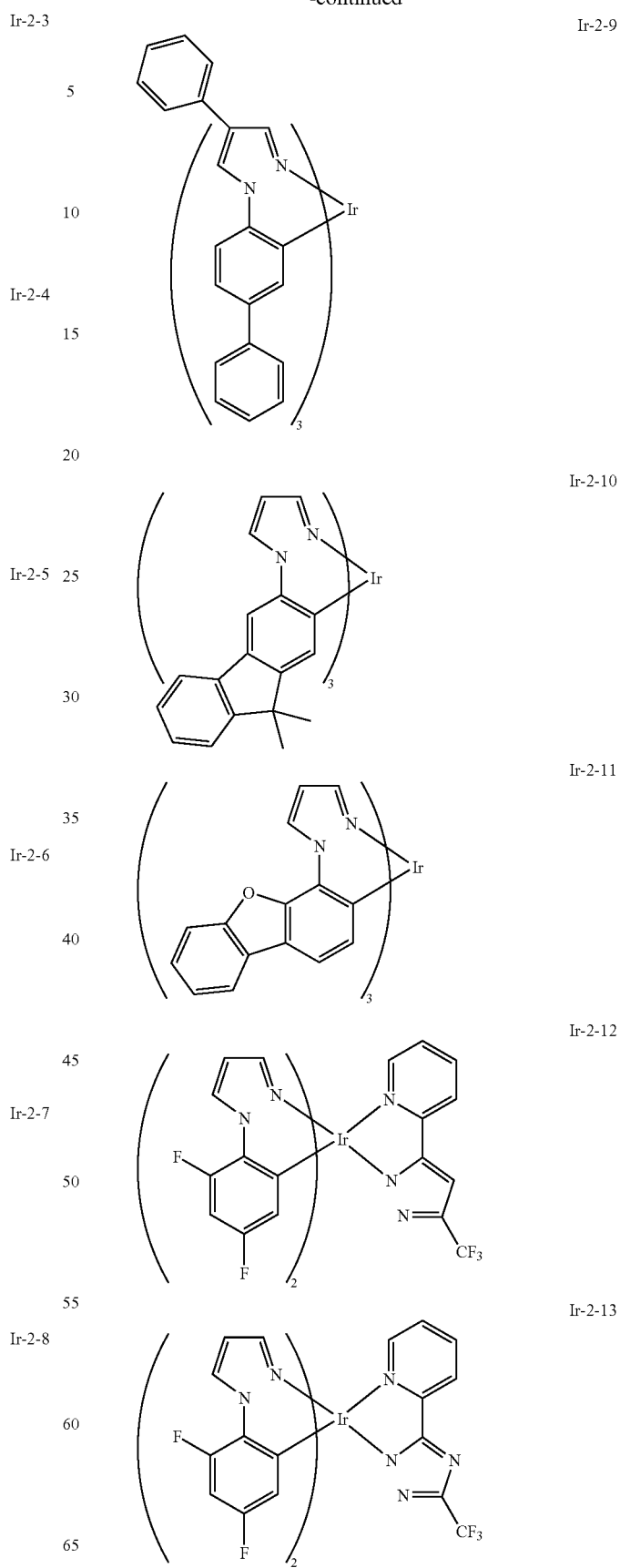

Ir-2-14
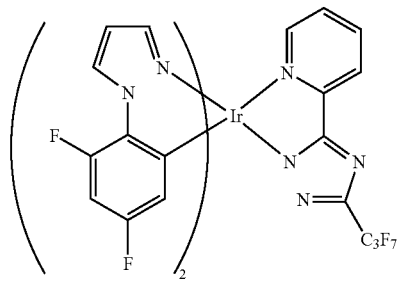
Ir-3-1
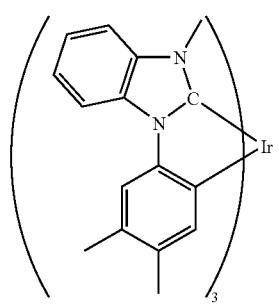
Ir-3-2
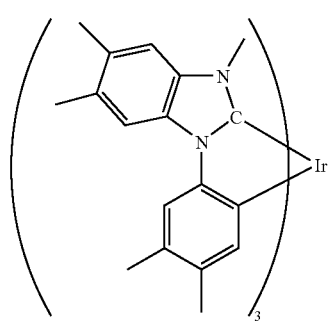
Ir-3-3
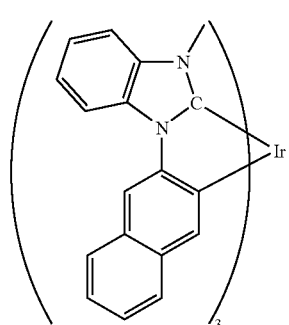
Ir-3-4
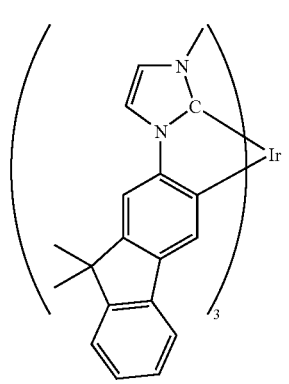
Ir-3-5
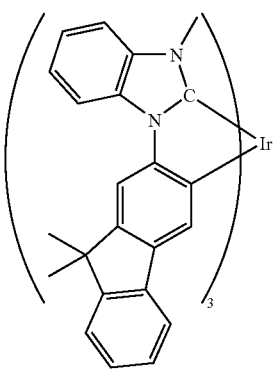
Ir-3-6
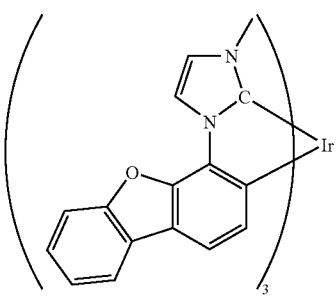
Ir-3-7
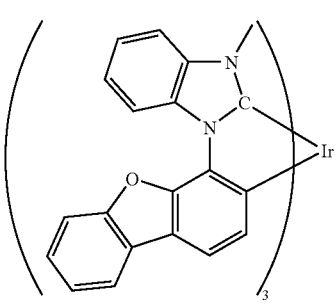
Ir-3-8
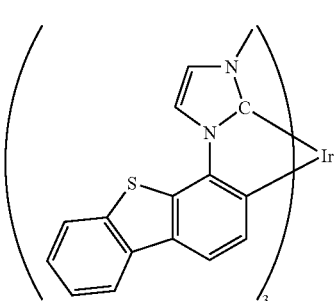
Ir-3-9
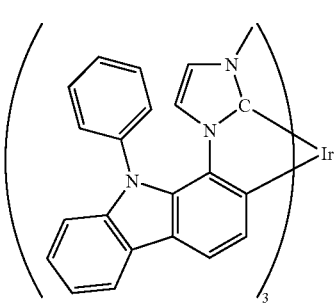

Ir-3-10 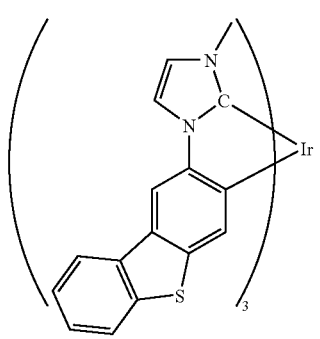
Ir-3-11 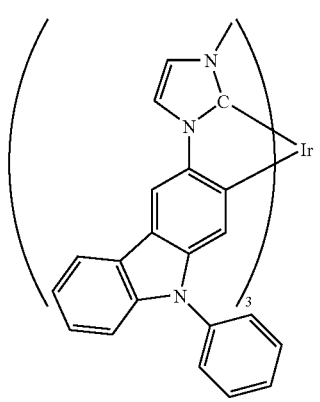
Ir-3-12 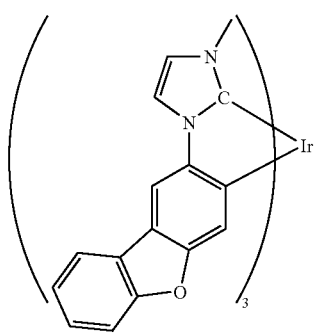
Ir-3-13 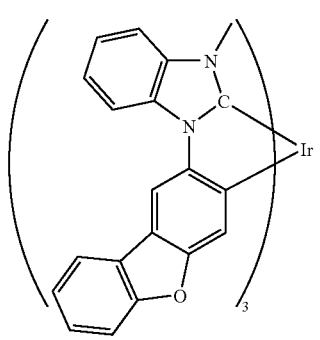
Ir-3-14 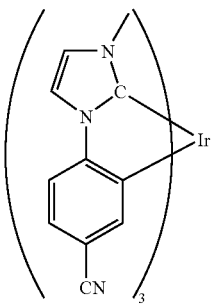
Ir-3-15 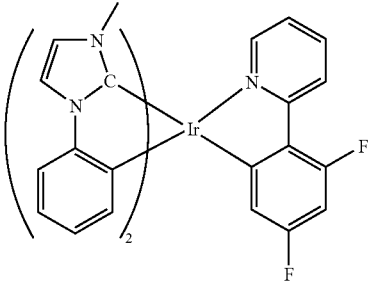
Ir-3-16 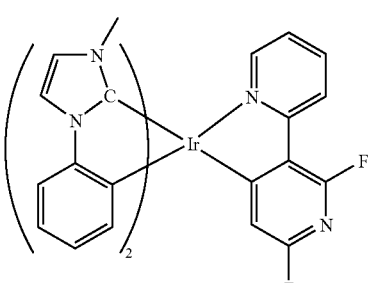
Ir-3-17 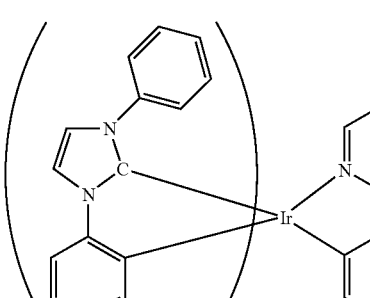
Ir-3-18 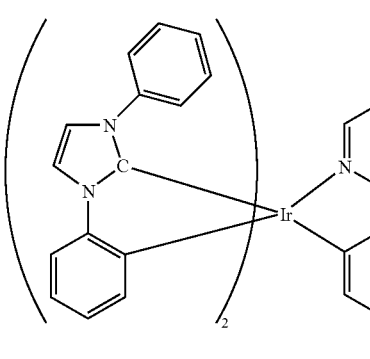

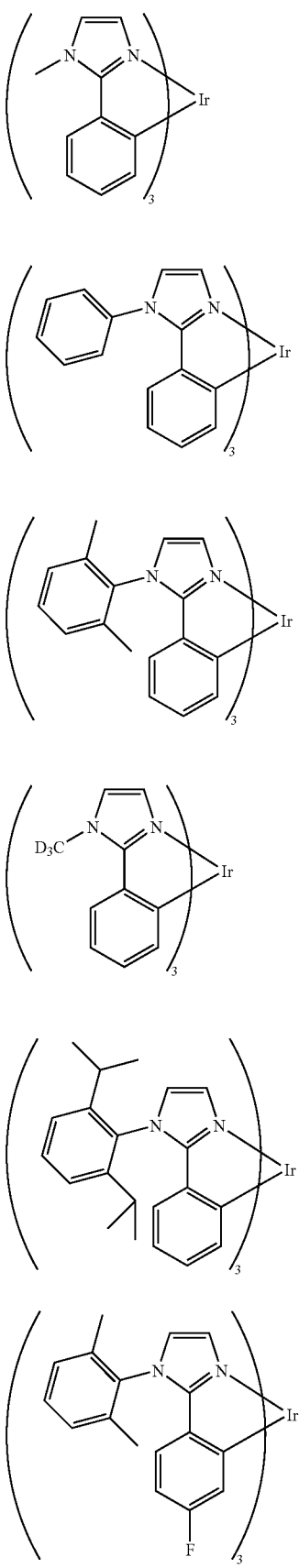
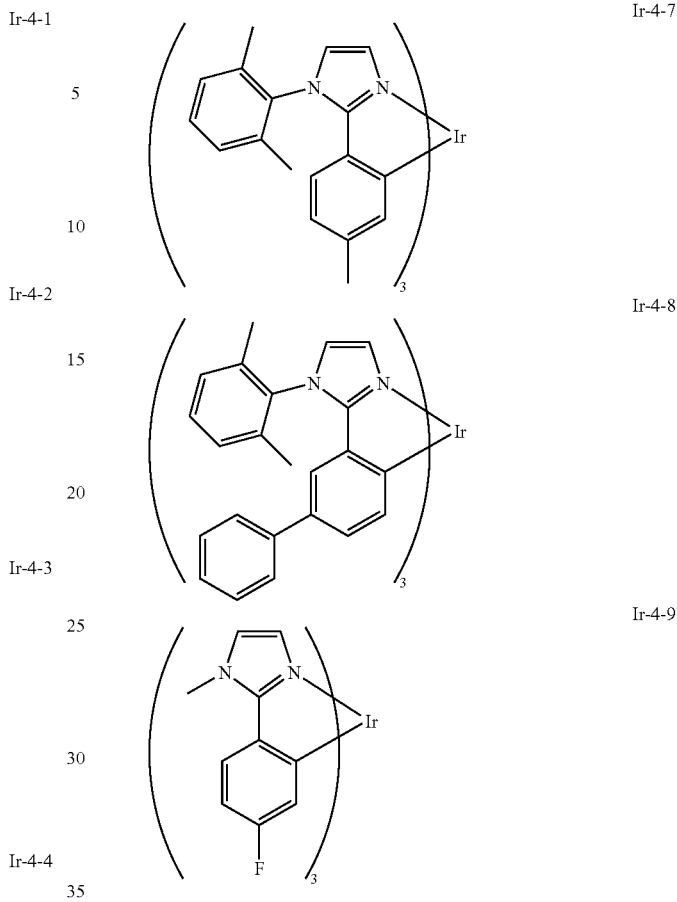

The compounds exemplified above as the complex compounds can be produced, e.g., in the processes described below.

The metal complex compounds can be synthesized using various techniques, including the methods described in *Journal of Organic Chemistry*, 53, 786 (1988), and more specifically, G. R. Newkome et al., page 789, left column, line 53, to right column, line 7, page 790, left column, lines 18 to 38, and page 790, right column, lines 19 to 30, combinations of these methods, and the methods described in *Chemische Berichte*, 113, 2749 (1980), and more specifically, H, Lexy et al., page 2752, lines 26 to 35.

For example, those compounds can be synthesized from metal compounds and ligands or dissociated ligands in the presence or absence of a solvent (e.g., a halogen-containing solvent, an alcohol solvent, an ether solvent, an ester solvent, a ketone solvent, a nitrile solvent, an amide solvent, a sulfone solvent, a sulfoxide solvent, water), in the presence or absence of a base (including inorganic and organic bases, such as sodium methoxide, potassium t-butoxide, triethylamine and potassium carbonate) under room temperature or application of heat (in the usual way or by means of a microwave device).

The iridium complex, though favorably used as a light-emitting material, may be used as materials other than a light-emitting one.

The iridium complex is generally incorporated into a light-emitting layer in an amount of 0.1 to 50 mass % based on all the compounds forming the light-emitting layer. From the viewpoints of durability and external quantum efficiency, the iridium complex content in the light-emitting layer is preferably from 1 to 50 mass %, more preferably from 2 to 40 mass %.

The light emitting material is generally incorporated into a light-emitting layer in an amount of 0.1 to 50 mass % based on all the compounds forming the light-emitting layer. From the viewpoints of durability and external quantum efficiency, the light emitting material content in the light-emitting layer is preferably from 1 to 50 mass %, more preferably from 2 to 40 mass %.

Although the thickness of the light emitting layer is not particularly limited, a thickness of from 2 nm to 500 nm is usually preferred. From the standpoint of external quantum efficiency, the thickness is more preferably from 3 nm to 200 nm, still more preferably from 5 nm to 100 nm.

<Host Material>

As the host material to be used in the invention, hole transporting host materials having an excellent hole transporting property (which may be called "hole transporting hosts") and electron transporting host compounds having an excellent electron transporting property (which may be called "electron transporting hosts") can be used. The compounds of the invention represented by the formula (I) are preferably hole transporting hosts.

<<Hole Transporting Host>>

As the hole transporting hosts to be used in the invention, the following materials can be given as specific examples.

Specific examples include pyrrole, indole, carbazole, azaindole, azacarbazole, triazole, oxazole, oxadiazole, pyrazole, imidazole, thiophene, polyarylalkanes, pyrazoline, pyrazolone, phenylenediamine, arylamines, amino-substituted chalcones, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electroconductive high-molecular oligomers such as thiophene oligomers and polythiophene, organic silanes, and carbon films, and derivatives thereof.

Of these, indole derivatives, carbazole derivatives, aromatic tertiary amine compounds, and thiophene derivatives are preferred, with those having, in the molecule thereof, a carbazole group being more preferred. Compounds having a t-butyl-substituted carbazole group are especially preferred.

<<Electron Transporting Host>>

The electron transporting host in the light emitting layer to be used in the invention has an electron affinity Ea of preferably 2.5 eV or greater and not greater than 3.5 eV, more preferably 2.6 eV or greater and not greater than 3.4 eV, still more preferably 2.8 eV or greater and not greater than 3.3 eV in order to improve durability and avoid reduction in driving voltage. Furthermore, it has an ionization potential Ip of preferably 5.7 eV or greater and not greater than 7.5 eV, more preferably 5.8 eV or greater and not greater than 7.0 eV, still more preferably 5.9 eV or greater and not greater than to 6.5 eV in order to improve durability and avoid reduction in driving voltage.

As such electron transporting hosts, the following materials can be given as specific examples.

Specific examples include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyradine, fluorine-substituted aromatic compounds, heterocyclic tetracarboxylic anhydrides such as naphthalene perylene, and phthalocyanine, derivatives thereof (which may form a fused ring with another ring), and various metal complexes typified by metal complexes of 8-quinolynol derivatives, metallophthalocyanines, and metal complexes having benzoxazole or benzothiazole as the ligand.

The electron transporting hosts are preferably metal complexes, azole derivatives (such as benzimidazole derivatives and imidazopyridine derivatives), and azine derivatives (such as pyridine derivatives, pyrimidine derivatives, and triazine derivatives). Of these, metal complex compounds are preferred in view of durability. The metal complex compounds (A) are more preferably metal complexes having a ligand having at least one nitrogen atom, oxygen atom, or sulfur atom to be coordinated with the metal.

Although a metal ion in the metal complex is not particularly limited, preferred examples include a beryllium ion, a magnesium ion, an aluminum ion, a gallium ion, a zinc ion, an indium ion, a tin ion, a platinum ion, and a palladium ion. Of these, a beryllium ion, an aluminum ion, a gallium ion, a zinc ion, a platinum ion, and a palladium ion being are more preferred, with an aluminum ion, a zinc ion, and a palladium ion being still more preferred.

Although there are various known ligands to be contained in the above-described metal complexes, examples include ligands described in *Photochemistry and Photophysics of Coordination Compounds* written by H. Yersin, published by Springer-Verlag in 1987; and *Organometallic Chemistry—Principles and Applications*, written by Akio Yamamoto, published by Shokabo Publishing in 1982.

The ligands are preferably nitrogen-containing heterocyclic ligands (preferably, $C_{1-30}$, more preferably $C_{2-20}$, especially preferably $C_{3-15}$ ligands which may be either monodentate ligands or multidentate ligands, with ligands from bidentate ones to hexadentate ones being preferred. Mixtures of a monodentate ligand with a multidentate ligand from a bidentate to hexadentate ligand are also preferred).

Examples of the ligands include azine ligands (such as pyridine ligands, bipyridyl ligands, and terpyridine ligands); hydroxyphenylazole ligands (such as hydroxyphenylbenzimidazole ligands, hydroxyphenylbenzoxazole ligands, hydroxyphenylimidazole ligands, and hydroxyphenylimidazopyridine ligands); alkoxy ligands (preferably, $C_{1-30}$, more preferably $C_{1-20}$, especially preferably $C_{1-10}$ ligands such as methoxy, ethoxy, butoxy, and 2-ethylhexyloxy); aryloxy ligands (preferably, $C_{6-30}$, more preferably $C_{6-20}$, especially preferably $C_{6-12}$ ligands such as phenyloxy, 1-naphthyloxy, 2-naphthyloxy, 2,4,6-trimethylphenyloxy, and 4-biphenyloxy); heteroaryloxy ligands (preferably, $C_{1-30}$, more preferably $C_{1-20}$, especially preferably $C_{1-12}$ ligands such as pyridyloxy, pyrazyloxy, pyrimidyloxy, and quinolyloxy); alkylthio ligands (preferably, $C_{1-30}$, more preferably $C_{1-20}$, especially preferably $C_{1-12}$ ligands such as methylthio and ethylthio); arylthio ligands (preferably, $C_{6-30}$, more preferably $C_{6-20}$, especially preferably $C_{6-12}$ ligands such as phenylthio); heteroarylthio ligands (preferably $C_{1-30}$, more preferably $C_{1-20}$, especially preferably $C_{1-12}$ ligands such as pyridylthio, 2-benzimidazolylthio, 2-benzoxazolylthio, and 2-benzothiazolylthio); siloxy ligands (preferably $C_{1-30}$, more preferably $C_{3-25}$, especially preferably $C_{6-20}$ ligands such as triphenylsiloxy group, a triethoxysiloxy group, and a triisopropylsiloxy group); aromatic hydrocarbon anion ligands (preferably $C_{6-30}$, more preferably $C_{6-25}$, especially preferably $C_{6-20}$ ligands such as a phenyl anion, a naphthyl anion, and an anthranyl anion); aromatic heterocyclic anion ligands (preferably, $C_{1-30}$, more preferably $C_{2-25}$, especially preferably $C_{2-20}$ ligands such as a pyrrole anion, a pyrazole anion, a triazole anion, an oxazole anion, a benzoxazole anion, a thiazole anion, a benzothiazole anion, a thiophene anion, and a benzothiophene anion); and indolenine anion ligands. Of these, nitrogen-containing heterocyclic ligands, aryloxy ligands, heteroaryloxy groups, and siloxy ligands are preferred, with nitrogen-containing heterocyclic ligands, aryloxy ligands, siloxy ligands, aromatic hydrocarbon anion ligands, and aromatic heterocyclic anion ligands being more preferred.

Examples of the metal complex electron transporting hosts include compounds described in JP-A-2002-235076, JP-A-2004-214179, JP-A-2004-221062, JP-A-2004-221065, JP-A-2004-221068, and JP-A-2004-327313.

In the light emitting layer of the invention, it is preferred that the host material (including the compound represented by the formula (I)) has a lowest triplet excited state (T1) higher than the T1 of the phosphorescent material from the viewpoint of color purity, luminous efficiency, and running durability.

Although a content of the host compounds is not particularly limited in the invention, it is preferably 15 mass % or greater and not greater than 99.9% mass % relative to the mass of all the compounds constituting the light emitting layer in view of luminous efficiency and driving voltage. When the compound represented by the formula (I) is used as the host material, a host compound other than the compound of the invention is used in an amount of 50 mass % or less, preferably 1 mass % or less relative to the compound of the invention.

(Hole Injection Layer, Hole Transport Layer)

A hole injection layer and a hole transport layer each has a function of receiving holes from the anode or anode side and transporting them to the cathode side. Hole injection materials and hole transporting materials to be used for these layers may be either low molecular compounds or high molecular compounds.

Specifically, they are preferably layers containing a pyrrole derivative, a carbazole derivative, a triazole derivative, an oxazole derivative, an oxadiazole derivative, an imidazole derivative, a polyarylalkane derivative, a pyrazoline derivative, a pyrazolon derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidine compound, a phthalocyanine compound, a porphyrine compound, a thiophene derivative, an organic silane derivative, or a carbon.

The hole injection layer or the hole transport layer of the organic EL device of the invention may contain an electron accepting dopant. As the electron accepting dopant to be introduced into the hole injection layer or the hole transport layer, any of inorganic compounds and organic compounds can be used insofar as it can accept electrons and oxidize an organic compound.

Specific examples of the inorganic compound include metal halides such as ferric chloride, aluminum chloride, gallium chloride, indium chloride, and antimony pentachloride, and metal oxides such as vanadium pentaoxide and molybdenum trioxide.

As the organic compound, compounds having, as a substituent, a nitro group, a halogen atom, a cyano group, or a trifluoromethyl group; quinone compounds, acid anhydride compounds, and fullerenes are preferred.

In addition, those described in JP-A-6-212153, JP-A-11-111463, JP-A-11-251067, JP-A-2000-196140, JP-A-2000-286054, JP-A-2000-315580, JP-A-2001-102175, JP-A-2001-160493, JP-A-2002-252085, JP-A-2002-56985, JP-A-2003-157981, JP-A-2003-217862, JP-A-2003-229278, JP-A-2004-342614, JP-A-2005-72012, JP-A-2005-166637, and JP-A-2005-209643 are preferred.

Of these, particularly preferred are hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, and fullerene C60. Of these, hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone and 2,3,5,6-tetracyanopyridine are more preferred, with tetrafluorotetracyanoquinodimethane being especially preferred.

These electron-accepting dopants may be used either singly or in combination. The amount of the electron-accepting dopants differs, depends on the kind of the materials, but the amount is preferably from 0.01 to 50 mass %, more preferably from 0.05 to 20 mass %, especially preferably from 0.1 to 10 mass %, each relative to the materials of the hole transport layer.

The thickness of each of the hole injection layer and the hole transport layer is preferably 500 nm or less in order to reduce the driving voltage.

The thickness of the hole transport layer is preferably from 1 to 500 nm, more preferably from 5 nm to 200 nm, still more preferably from 10 nm to 100 m. The thickness of the hole injection layer is preferably from 0.1 nm to 200 nm, more preferably from 0.5 to 100 nm, still more preferably from 1 to 100 nm.

The transport injection layer and the hole transport layer may each be a single layer composed of one or more of the above-described materials or a multilayer composed of a plurality of layers having the same composition or different compositions.

(Electron Injection Layer, Electron Transport Layer)

The electron injection layer and the electron transport layer are layers having a function of receiving electrons from the cathode or the cathode side and transporting them to the anode side. The electron injection materials and electron transport materials to be used for these layers may be either a low molecular compound or a high molecular compound.

Specifically, they are preferably layers containing a pyridine derivative, a quinoline derivative, a pyrimidine derivative, a pyrazine derivative, a phthalazine derivative, a phenanthroline derivative, a triazine derivative, a triazole derivative, an oxazole derivative, an oxadiazole derivative, an imidazole derivative, a fluorenone derivative, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, an aromatic cyclic tetracarboxylic anhydride such as naphthalene and perylene, various complexes typified by a metal complex of a 8-quinolinol derivative, metalphthalocyanines, and metal complexes having benzoxazole or benzothiazole as a ligand, and organic silane derivatives typified by silole.

The electron injection layer or the electron transport layer of the organic EL device of the invention can contain an electron donating dopant. The electron donating dopant to be introduced into the electron injection layer or the electron transport layer may be any material insofar as it has an electron donating property and therefore capable of reducing an organic compound. Alkali metals such as Li, alkaline earth metals such as Mg, transition metals containing a rare earth metal, and reductive organic compounds are preferred. As the metal, those having a work function not greater than 4.2 eV are especially preferred. Specific examples of it include Li, Na, K, Be, Mg, Ca, Sr, Ba, Y, Cs, La, Sm, Gd, and Yb. The reductive organic compounds are, for example, nitrogen-containing compounds, sulfur-containing compounds, and phosphorus-containing compounds.

In addition, materials described in JP-A-6-212153, JP-A-2000-196140, JP-A-2003-68468, JP-A2003-229278, and JP-A-2004-342614 can be used.

These electron donating dopant may be used either singly or in combination. The amount of the electron donating dopant varies, depending on the kind of the material, but it is preferably from 0.1 to 99 mass %, more preferably from 1.0 to 80 mass %, especially preferably from 2.0 to 70 mass % relative to the material of the electron transport layer.

The thickness of each of the electron injection layer and the electron transport layer is preferably 500 nm or less in order to reduce the driving voltage.

The thickness of the electron transport layer is preferably from 1 to 500 nm, more preferably from 5 nm to 200 nm, still more preferably from 10 nm to 100 nm. The thickness of the electron injection layer is preferably from 0.1 to 200 nm, more preferably from 0.2 to 100 nm, still more preferably from 0.5 to 50 nm.

Each of the electron injection layer and the electron transport layer may be a single layer composed of one or more of the above-described materials or a multilayer composed of a plurality of layers having the same composition or having different compositions.

(Hole Blocking Layer)

The hole blocking layer is a layer having a function of preventing passage of holes, which have been transported to the light emitting layer from the anode side, to the cathode side. In the invention, the hole blocking layer can be formed as an organic layer adjacent to the light emitting layer on the cathode side.

Examples of compounds constituting the hole blocking layer include aluminum complexes such as BAlq, triazole derivatives, and phenanthroline derivatives such as BCP. The thickness of the hole blocking layer is preferably from 1 to 500 nm, more preferably from 5 to 200 nm, still more preferably from 10 to 100 nm.

The hole blocking layer may be a single layer composed of one or more of the above-described materials or a multilayer composed of a plurality of layers having the same composition or different compositions.

(Electron Blocking Layer)

The electron blocking layer is a layer having a function of preventing passage of electrons, which have been transported to the light emitting layer from the cathode side, to the anode side. In the invention, the electron blocking layer can be formed as an organic layer adjacent to the light emitting layer on the anode side.

Examples of the compound constituting the electron blocking layer are similar to those given above as the hole transporting material.

The thickness of the electron blocking layer is preferably from 1 to 500 nm, more preferably from 5 to 200 nm, still more preferably from 10 to 100 nm.

The hole blocking layer may be a single layer composed of one or more of the above-described materials, or a multilayer composed of a plurality of layers having the same composition or different compositions.

(Protective Layer)

In the invention, the whole organic EL device may be protected by a protective layer.

Any material may be incorporated in the protective layer insofar as it has a function of preventing intrusion of substances, which promote deterioration of the device such as water or oxygen, into the device.

Specific examples of the material include metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$, and $TiO_2$; metal nitrides such as $SiN_x$ and $SiN_xO_y$; metal fluorides such as $MgF_2$, LiF, $AlF_3$ and $CaF_2$; polyethylene, polypropylene, poly(methyl methacrylate), polyimide, polyurea, polytetrafluoroethylene, polychlorotrifluoroethylene, polydichlorodifluoroethylene, chlorotrifluoroethylene/dichlorodifluoroethylene copolymer, copolymers obtainable by copolymerizing a monomer mixture containing tetrafluoroethylene and at least one comonomer, fluorine-containing copolymers having, on the copolymer backbone thereof, a ring structure, water absorptive materials having a water absorption of 1% or greater, and moisture-proof materials having a water absorption of 0.1% or less.

A process for forming the protective layer is not particularly limited. Examples of the process applicable to the formation include a vacuum deposition process, a sputtering process, a reactive sputtering process, a MBE (molecular beam epitaxy) process, a cluster ion beam process, an ion plating process, a plasma polymerization process (high-frequency excited ion plating process), a plasma CVD process, a laser CVD process, a thermal CVD process, a gas source CVD process, a coating process, a printing process, and a transfer process.

(Sealing Container)

Furthermore, the entire organic electroluminescence device of the invention may be sealed using a sealing container.

Also, a space between the sealing container and the device may be filled with a moisture absorbent or an inert liquid. The moisture absorbent is not particularly limited. Examples of it include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, a molecular sieve, zeolite, and magnesium oxide. The inert liquid is not particularly limited and examples of it include paraffins, liquid paraffins, fluorine-based solvents such as perfluoroalkanes, perfluoroamines and perfluoroethers, chlorine-based solvents, and silicone oils.

Alternatively, the organic EL device of the invention may be preferably sealed with the following resin sealing layer.

(Resin Sealing Layer)

It is preferred to use a resin sealing layer to suppress deterioration of the performance of the functional device of the invention which will otherwise occur by the contact with oxygen or moisture in the atmosphere.

(Material)

The resin material for the resin sealing layer is not particularly limited and acrylic resins, epoxy resins, fluorine-based resins, silicon-based resins, rubber-based resins, and ester resins can be used. Of these, epoxy resins are preferred because of their moisture preventive function. Of the epoxy resins, thermosetting epoxy resins and photocurable epoxy resins are preferred.

(Preparation Process)

No particular limitation is imposed on the preparation process of the resin sealing layer. Examples include a process of applying a resin solution, a process of press bonding or hot press bonding a resin sheet, and a process of dry polymerization by vapor deposition or sputtering.

(Film Thickness)

The thickness of the resin sealing layer is 1 µm or greater and not greater than 1 mm, more preferably 5 µm or greater and not greater than 100 µm, most preferably 10 µm or greater and not greater than 50 µm. When the resin sealing layer has a thickness below the above-described range, the inorganic film may be damaged at the time of mounting the second substrate. The resin sealing layer having a thickness exceeding the above-described range, on the other hand, increases the thickness of the electroluminescence device itself and impairs the characteristic of the organic electroluminescence device, that is, a thin film property.

(Sealing Adhesive)

The sealing adhesive used in the invention has a function of preventing intrusion of moisture or oxygen from the edge.

<Material>

For the sealing adhesive, materials similar to those used for the resin sealing layer can be used. Of these, the epoxy adhesives are preferred from the viewpoint of preventing penetration of water, with light curing adhesives and thermosetting adhesives are especially preferred.

Further, addition of a filler to the above-described materials is also preferred.

The filler added to the sealant is preferably an inorganic material such as $SiO_2$, SiO (silicon oxide), SiON (silicon oxynitride), or SiN (silicon nitride). The addition of the filler increases the viscosity of the sealant to improve the processing suitability and improve the humidity resistance.

<Drying Agent>

The sealing adhesive may contain a drying agent. The drying agent is preferably barium oxide, calcium oxide, or strontium oxide.

The amount of the drying agent is preferably 0.01 mass % or greater and not greater than 20 mass %, more preferably 0.05 mass % or greater and not greater than 15 mass % relative to the sealing adhesive. When the amount is below the range, the drying agent cannot bring about sufficient effect. Amounts exceeding the range, on the other hand, make it difficult to uniformly disperse the drying agent in the sealing adhesive. Amounts outside the above range are therefore not preferred.

<Formulation of Sealing Adhesive>
Polymer Composition, Concentration

The sealing adhesive is not particularly limited and those described above can be used. Examples of the light curing epoxy adhesive include "XNR5516", product of Nagase Chemtech. The sealing adhesive may be prepared by adding the drying agent directly to the adhesive and then, dispersing the resulting mixture.

Thickness

The sealing adhesive is preferably applied to give a thickness of 1 µm or greater and not greater than 1 mm. When the thickness is below the range, the sealing adhesive cannot be applied uniformly. When the thickness exceeds the range, on the other hand, water intrusion paths become wide. Thicknesses outside the above-described range are therefore not preferred.

<Sealing Method>

In the invention, the functional device can be obtained by applying an optional amount of the sealing adhesive containing the drying agent by using a disperser, stacking the second substrate over the film, and then curing the stack.

(Driving)

By applying a direct current (which may contain an alternating current component if necessary) voltage (usually from 2 to 15V) or a direct current between the anode and the cathode of the organic electroluminescence device of the invention, light emission can be obtained.

Examples of a method for driving the organic electroluminescence device of the invention include those described in JP-A-2-148687, JP-A-6-301355, JP-A-5-29080, JP-A-7-134558, JP-A-8-234685, and JP-A-8-241047, Japanese Patent No. 2784615, and U.S. Pat. Nos. 5,828,429 and 6,023,308.

The light extraction efficiency of the organic electroluminescence device of the invention can be raised by various known methods. For example, it is possible to improve a light extraction efficiency and improve an external quantum efficiency by processing a surface shape of the substrate (for example, forming a pattern with minute irregularities), controlling the refractive index of the substrate, the ITO layer and/or the organic layer, or controlling the film thickness of the substrate, the ITO layer and/or the organic layer.

The device of the invention may be a so-called top emission type device in which light is emitted from the anode side.

The organic EL element of the invention can have a charge generation layer between two or more light emitting layers in order to improve luminous efficiency.

The charge generation layer has a function of generating charges (holes and electrons) when a voltage is applied and at the same time has a function of injecting the charges thus generated into a layer adjacent to the charge generation layer.

The material for forming the charge generation layer may be any material insofar as it has the above-mentioned functions. The charge generation layer may be made of a single compound or a plurality of compounds.

Specifically, the material may be either conductive or semiconductive such as a doped organic layer. It may also be an insulating material. Examples include materials described in JP-A-11-329748, JP-A-2003-272860 and JP-A-2004-39617.

More specifically, examples may include transparent conductive materials such as ITO and IZO (indium zinc oxide), fullerenes such as C60, conductive organic materials such as oligothiophenes, conductive organic materials such as metallophthalocyanines, metal-free phthalocyanines, metalloporphyrins and metal-free porphyrins, metal materials such as Ca, Ag, Al, Mg:Ag alloys, Al:Li alloys and Mg:Li alloys, hole conductive materials, and electron conductive materials, and mixtures thereof.

Examples of the hole conductive materials include materials obtained by doping a hole transporting organic material such as 2-TNATA or NPD with an electron attractive oxidizing agent such as F4-TCNQ, TCNQ or $FeCl_3$, P-type conductive polymers and P-type semiconductors. Examples of the electron conductive materials include materials obtained by doping an electron transporting organic material with a metal or metal compound having a work function less than 4.0 eV, N-type conductive polymers and N-type semiconductors. Examples of the N-type semiconductors include N-type Si, N-type CdS and N-type ZnS. Examples of the P-type semiconductors include P-type Si, P-type CdTe and P-type CuO.

Further, insulating materials such as $V_2O_5$ can be used for the charge generation layer.

The charge generation layer may be a single layer or a stack of a plurality of layers. Examples of the latter one include a layer having a structure in which a transparent conductive material, a conductive material such as a metal material, and the hole conductive material or the electron conductive material are stacked one after another and a layer having a structure in which the hole conductive material and the electron conductive material are stacked one after another.

It is usually preferred to select the film thickness or the material of the charge generation layer to give light transmittance of 50% or greater. The thickness is not particularly limited, but preferably from 0.5 to 200 nm, more preferably from 1 to 100 nm, still more preferably from 3 to 50 nm, especially preferably from 5 to 30 nm.

The formation process of the charge generation layer is not particularly limited, and the above-described formation process of the organic layer can be employed.

The charge generation layer is inserted between the two or more light-emitting layers. The charge generation layer may contain, on the anode side and the cathode side thereof, a material having a function of injecting charges into an adjacent layer. In order to improve the electron injection property to the adjacent layer on the anode side, an electron injecting compound such as BaO, SrO, $Li_2O$, LiCl, LiF, $MgF_2$, MgO or $CaF_2$ may be stacked on the anode side of the charge generation layer.

Alternatively, the material of the charge generation layer can be selected based on the descriptions of JP-A-2003-45676 and U.S. Pat. Nos. 6,337,492, 6,107,734, and 6,872,472.

The organic EL device of the invention may have a resonator structure. For example, such a device has, on a transparent substrate, a multilayer film mirror composed of a stack of plural films different in refractive index, a transparent or semi-transparent electrode, a light emitting layer, and a metal electrode which have been stacked one after another. Light produced at the light emitting layer repeats reflection and resonates between the multilayer film mirror and the metal electrode while causing them to serve a reflector plate.

In another preferred embodiment, a transparent or semi-transparent electrode and a metal electrode function as a reflector plate on a transparent substrate and light produced at a light emitting layer repeats reflection and resonates therebetween.

A resonator structure is formed by adjusting the effective refractive index of each of two reflector plates and the optical path length determined from the refractive index and thickness of each layer between the reflectors to be optimum for obtaining a desired resonant wavelength. The calculation formula for the first embodiment is described in JP-A-9-180883, while that for the second embodiment is described in JP-A-2004-127795.

APPLICATIONS OF THE INVENTION

The organic electroluminescence device of the invention can be suitably used for display devices, displays, backlights, electrophotography, light sources for illumination, light sources for recording, light sources for exposure, light sources for reading, signs, sign boards, interiors, and optical communications.

The organic EL display can be made a full color type by a known method as described in *Monthly Display*, September issue, 33-37(2000), for example, the three color light emitting method wherein three organic EL devices which respectively emit lights corresponding to the three primary colors (blue (B), green (G), red (R)) are placed on a substrate; the white light method wherein a white light from an organic EL device for white light emission is divided into the three primary colors via color filters; and the color conversion method wherein a blue light emitted from an organic EL device for blue light emission is converted into red (R) and green (G) via a fluorescent pigment layer.

A flat type light source emitting lights of desired colors can be provided by using a plurality of the organic EL devices different in emission color and obtainable by any of the above-described methods. Such a light source is, for example, a white light emitting light source using a blue luminescence device and a yellow luminescence device in combination, and a white light emitting light source using a blue luminescence device, a green luminescence device, and a red luminescence device in combination.

EXAMPLES

The present invention will hereinafter be described in further detail by examples. It should however be borne in mind that the invention is not limited to or by them.

Synthesis of Comparative Compound 1

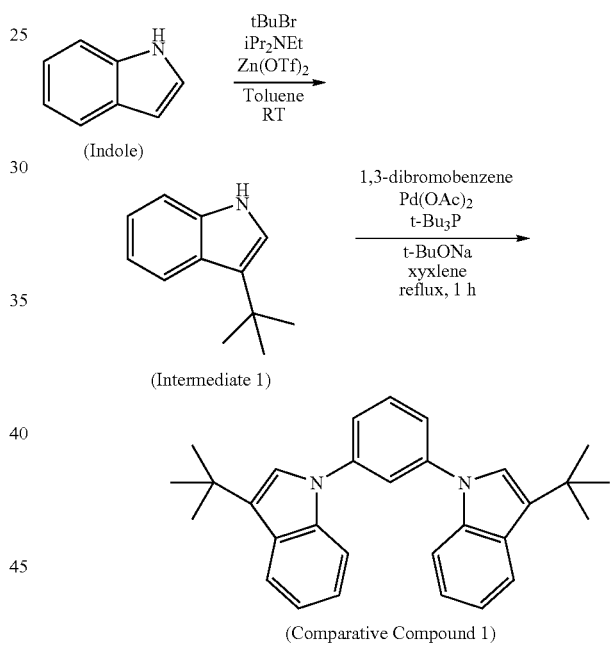

(Comparative Compound 1)

In accordance with the process described in *J. Org. Chem.*, 67, 2705-2708(2002), 3-tert-butylindole (intermediate 1) is synthesized.

In a nitrogen atmosphere, tri-tert-butylphosphine (0.06 mL, 0.24 mol) is added to a mixture of 3-tert-butylindole (0.975 g, 5.63 mmol), 1,3-dibromobenzene (0.604 g, 2.56 mmol), palladium acetate (14 mg, 0.06 mmol), sodium tert-butoxide (0.74 g, 7.7 mmol), and xylene (25 mL). The resulting mixture is stirred for 1 hour while heating under reflux. Water is added to the reaction mixture, followed by extraction with ethyl acetate. The organic layer thus obtained is dried over magnesium sulfate and then, concentrated under reduced pressure. The resulting residue is purified by silica gel column chromatography to yield 1.05 g (98%, 2.51 mmol) of Comparative Compound 1.

$^1$H-NMR data of Comparative Compound 1: 1.52 (s, 18H), 7.12 (s, 2H), 7.14-7.27 (m, 4H), 7.47 (d, 2H), 7.62 (dd, 4H), 7.89 (d, 2H) 400 MHz <Synthesis of Comparative Compound 2>

In a similar manner to that employed for the synthesis of Comparative Compound 1 except for the use of 1,4-dibromobenzene instead of 1,3-dibromobenzene, Comparative Compound 2 can be synthesized.

<Synthesis of Comparative Compound 3>

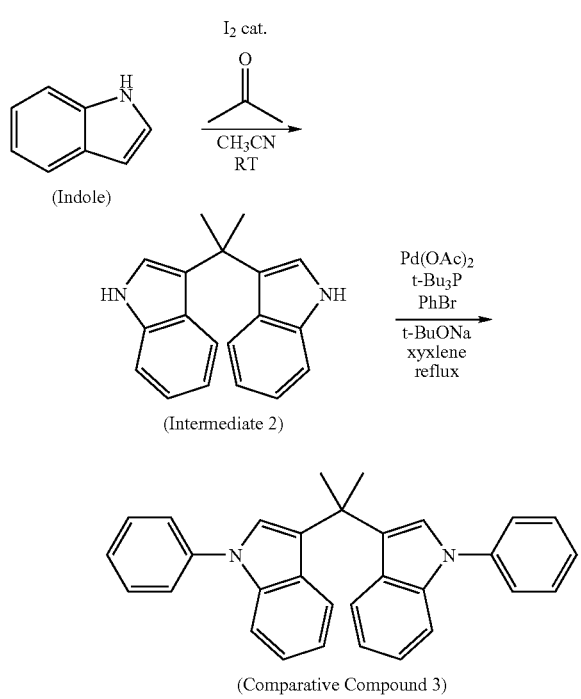

Intermediate 1 is synthesized with reference to the process described in *Tetrahedron Lett.*, 44, 1959(2003). Described specifically, iodine (2.5 g, 10 mmol) is added to a mixture of indole (11.72 g, 100 mmol), acetone (3.67 mL, 50 mmol), and acetonitrile (100 mL) at room temperature. The resulting mixture is stirred for 3 hours. An aqueous solution of sodium thiosulfate is added to the reaction mixture to terminate the reaction. The reaction mixture is extracted with ethyl acetate. The organic layer thus obtained is dried over sodium sulfate, and then concentrated. The residue is purified by silica gel column chromatography to yield Intermediate 2 (3.30 g, 12.0 mmol, 24%).

In a nitrogen atmosphere, t-butylphosphine (0.24 mL, 1.0 mmol) is added to a mixture of Intermediate 2 (3.30 g, 12 mmol), bromobenzene (3.05 g, 29 mmol), palladium acetate (45 mg, 0.25 mmol), sodium t-butoxide (3.6 g, 36 mmol), and xylene (120 mL) at a room temperature. The resulting mixture is stirred for one hour under reflux conditions. The reaction mixture thus obtained is cooled. After addition of water, the mixture is extracted with ethyl acetate. The organic layers collected are dried over sodium sulfate and then concentrated. The residue is purified by column chromatography. The solid thus obtained is recrystallized from isopropyl alcohol. The resulting solid is collected by filtration to yield Comparative Compound 3 (1.4 g).

$^1$H-NMR data of Comparative Compound 3: δ=7.46-7.57 (m, 12H), 7.29-7.37 (m, 2H), 7.27 (s, 2H), 7.12 (dd, 2H), 6.96 (dd, 2H), 2.00 (s, 6H)

<Synthesis of Intermediate 4>

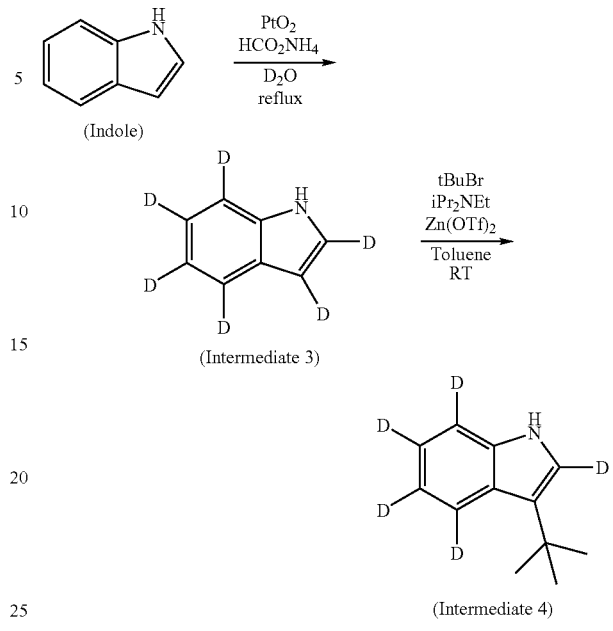

Indole (23.4 g, 200 mmol), platinum oxide (1 g), ammonium formate (1 g), and deuterated water (400 mL) are mixed. The resulting mixture is stirred for 14 hours while heating under reflux. After cooling to room temperature, the reaction mixture is extracted with ethyl acetate. The organic phase is dried over anhydrous sodium sulfate and then reduced under reduced pressure. The residue thus obtained is purified by silica gel column chromatography to yield 17 g of Intermediate 3 (69%, 138 mmol).

As a result of measurement of $^1$H-NMR while using 1,2-dibromobutane as an internal standard substance and deuterated dimethylsulfoxide as a solvent, the deuteration ratio at any position except 1-position is 97% or greater.

Intermediate 4 can be synthesized in a similar manner to that employed for the synthesis of Intermediate 1.

<Synthesis of Intermediate 6>

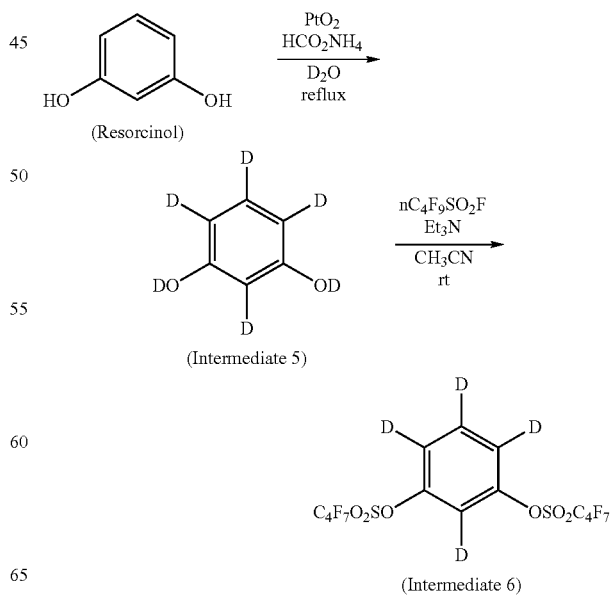

Resorcinol-d6 (Intermediate 5) can be synthesized by the process described in *J. Am. Chem. Soc.* 126(40), 13033-13043 (2004).

In anhydrous acetonitrile (40 mL), Intermediate 5 (4.6 g) and triethylamine (14 mL) are mixed. While cooling a reaction vessel containing the mixture over a water bath, nonafluorobutanesulfonic fluoride (15.5 mL) is added. After stirring at room temperature for 3 hours, water is added, followed by extraction with a hexane-ethyl acetate mixed solvent. The organic layer is then washed successively with dilute hydrochloric acid, water, and saturated saline. After drying over anhydrous sodium sulfate, the solvent is distilled off under reduced pressure to yield 25.9 g of Intermediate 6.

<Synthesis of Exemplified Compound (2-17)>

Intermediate 6 (32 g, 47 mmol), Intermediate 4 (17 g, 95 mmol), bis(benzylideneacetone)palladium (1.37 g, 2.4 mmol), Xantphos (CAS No. 161265-03-8, 2.2 g, 3.8 mmol), and potassium phosphate (40 g, 190 mmol) are mixed in xylene (230 mL) in a nitrogen atmosphere. The resulting mixture is heated under reflux. After the reaction mixture is cooled to room temperature, water and ethyl acetate are added. The resulting mixture is filtered to remove insoluble matters. The organic layer thus obtained is washed with water and saturated saline and then, dried over anhydrous sodium sulfate. The crude product obtained by concentrating the organic layer under reduced pressure is purified by silica gel column chromatography, followed by recrystallization and sublimation to yield 9 g (20 mmol, 43%) of 9 g of Exemplified Compound (2-17).

As a result of $^1$H-NMR analysis using 1,2-dibromobutane as an internal standard and deuterated chloroform and deuterated dimethylsulfoxide as solvents, the deuteration ratio of Exemplified Compound (2-17) is 97% at any position represented by a deuterium atom.

<Synthesis of Exemplified Compound (2-20)>

In a similar manner to that employed for the synthesis of Comparative Compound 2 except for the use of Intermediate 4 instead of Intermediate 1, Exemplified Compound (2-20) can be synthesized.

<Synthesis of Exemplified Compound (4-4)>

In a similar manner to that employed for the synthesis of Comparative Compound 2 except for the use of Intermediate 2 and deuterated bromobenzene-d5 instead of indole and bromobenzene, respectively, Exemplified Compound (4-4) can be synthesized.

In the above-described preparation process, when the substituent defined changes under conditions of a certain synthesis process or is not suited for enforcing the process, it is possible to prepare easily by protecting or deprotecting a functional group (for example, *Protective Groups in Organic Synthesis*, written by T. W. Greene, published by John Wiley & Sons, Inc. in 1981). If necessary, the order of the reaction steps such as introduction of a substituent can be changed as needed.

<Fabrication and Evaluation of Organic Electroluminescence Device>

(1) Fabrication of Organic Electroluminescence Device of Comparative Example 1-1

A glass substrate (product of Geomatec having a surface resistivity of 10 Ω/sq) which is 0.5 mm thick and 2.5 cm square and has an ITO film thereon is placed in a cleaning container, ultrasonically cleaned in 2-propanol, and treated with UV ozone for 30 minutes. On the resulting transparent anode (ITO film), following organic layers are vapor-deposited successively by vacuum deposition.

A deposition rate in Examples of the invention is 0.2 nm/sec unless otherwise particularly specified. The deposition rate is measured using a quartz crystal deposition controller "CRTM-9000", product of ULVAC. The film thicknesses listed below are worked out with a calibration curve prepared on the basis of numerical values obtained from CRTM-9000 and film thicknesses measured using a DEKTAK type stylus film thickness measurer.

<1> Compound A: film thickness of 80 nm

<2> Compound B: film thickness of 10 nm

<3> Co-evaporation of Comparative Compound 1+Light Emitting Material A (10 mass %); film thickness of 60 nm <4> Compound C: film thickness: 10 nm <5> Compound D: film thickness: 30 nm Finally, 0.1 nm of lithium fluoride and 100 nm of metallic aluminum are sequentially deposited to form a cathode. The resulting product is then placed in a glove box, which has been replaced with an argon gas, without being brought into contact with the atmosphere, and is sealed in a sealing can made of stainless with a UV-curing adhesive ("XNR5516HV", product of Nagase Ciba) to obtain the organic electroluminescence device of Comparative Example.

(2) Fabrication of Organic Electroluminescence Devices of Comparative Examples 1-2 to 12-2 and Examples 1-1 to 12-2

In a similar manner to that employed in Comparative Example 1 except that Light emitting material A is replaced by Light emitting materials B to L having the following structures and Comparative Compound 1 is replaced by Comparative Compound 2, Comparative Compound 3, Exemplified Compound (2-17), Exemplified Compound (2-20), and Exemplified Compound (4-4), organic electroluminescence devices of Comparative Examples 1-2 to 12-2 and Examples 1-1 to 12-2 are fabricated.

Compounds A to D have the following chemical structures, respectively.

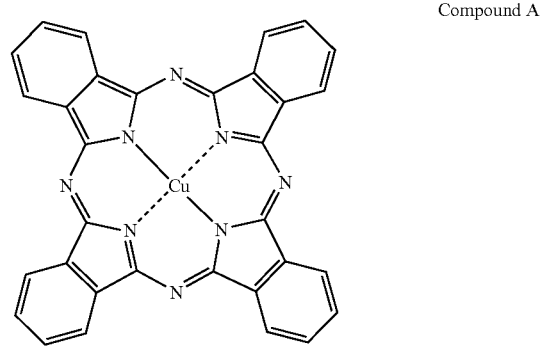

Compound A

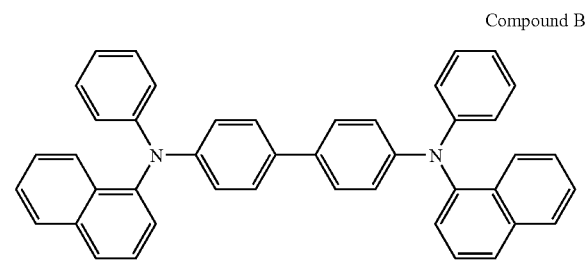

Compound B

Compound C
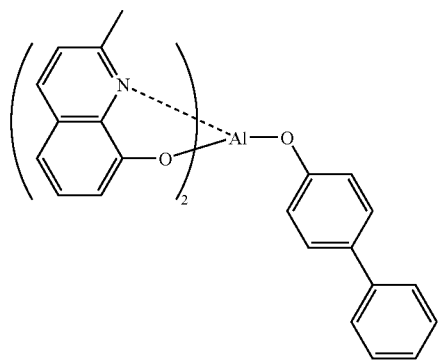
Compound D
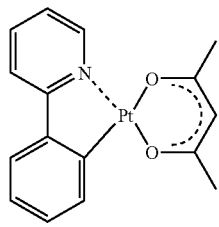
Light emitting materials A to L have the following chemical structures, respectively.
Light emitting material A
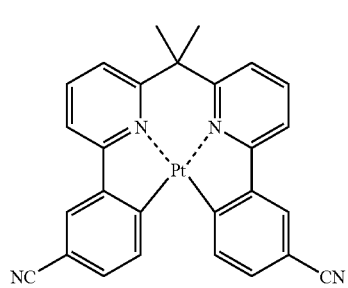
Light emitting material B
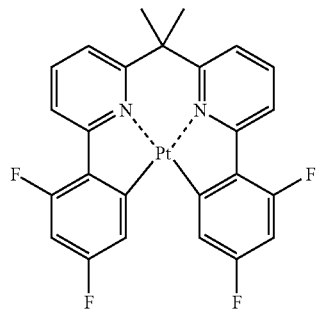
Light emitting material C
Light emitting material D
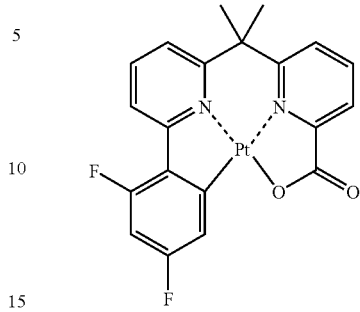
Light emitting material E
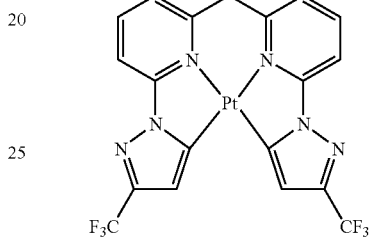
Light emitting material F
Light emitting material G
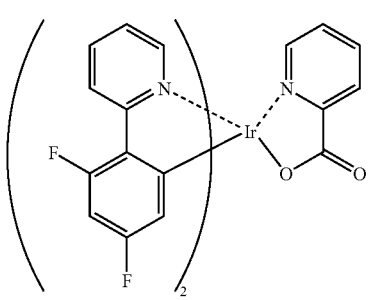
Light emitting material H
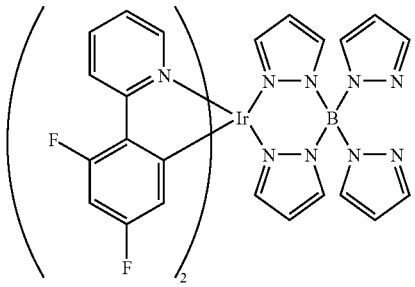

Light emitting material I

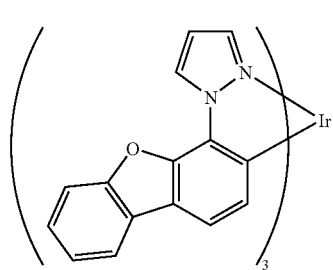

Light emitting material J

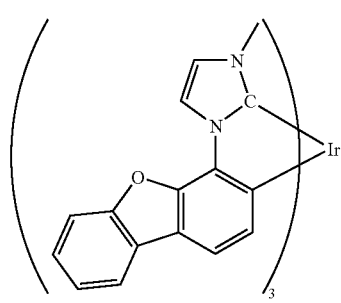

Light emitting material K

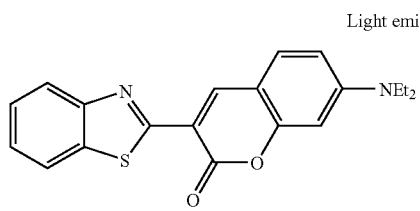

Light emitting material L

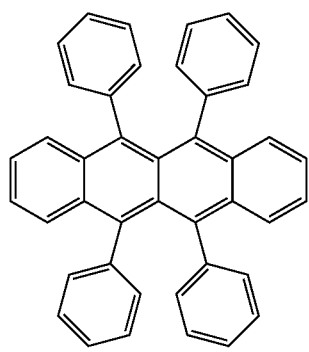

Comparative Compounds 1 to 4 have the following chemical structures.

Comparative Compound 1

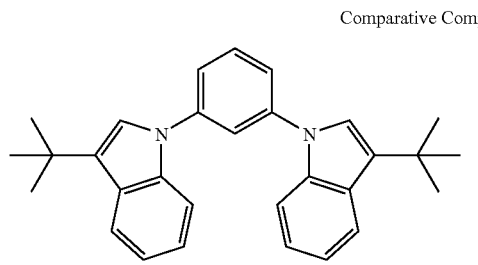

Comparative Compound 2

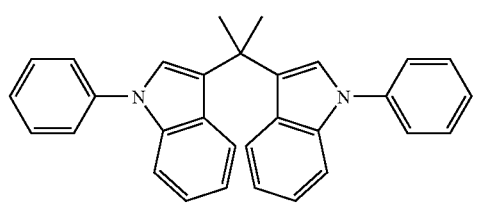

Comparative Compound 3

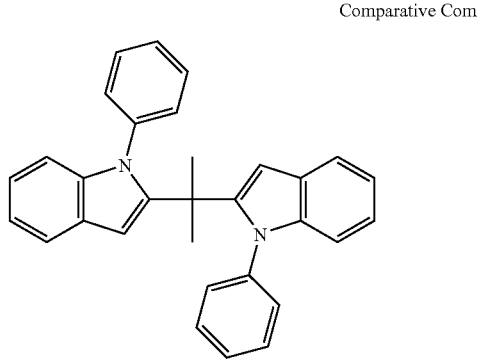

Comparative Compound 4

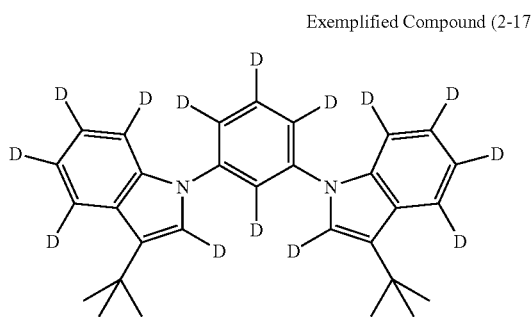

Exemplified Compound (2-17), Exemplified Compound (2-20), Exemplified Compound (4-4) and Exemplified Compound (4-18) have the following chemical structures.

Exemplified Compound (2-17)

Exemplified Compound (2-20)

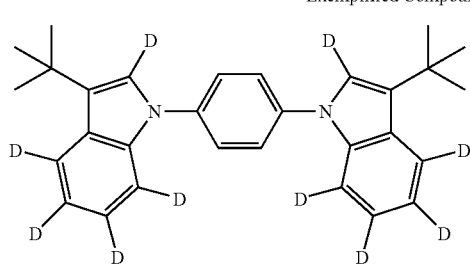

-continued

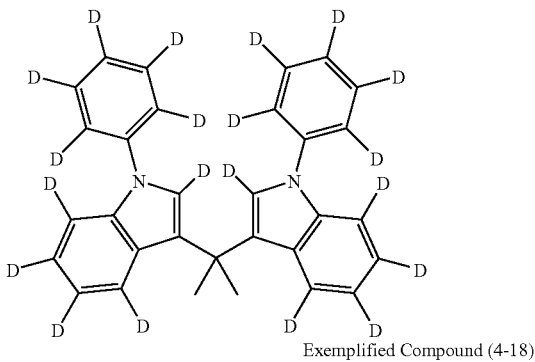
Exemplified Compound (4-4)

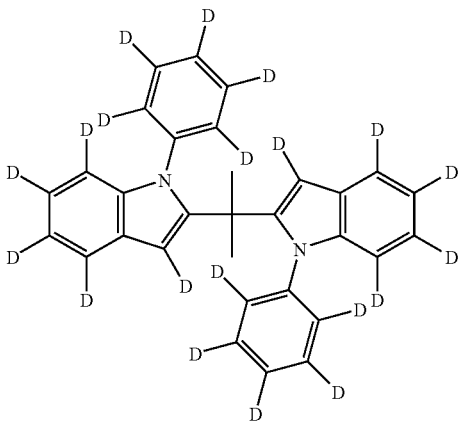
Exemplified Compound (4-18)

(3) Evaluation

The organic electroluminescence devices thus fabricated are evaluated in the following manner.

(Evaluation of Running Durability)

The luminance half-life (the time in which the luminance is decreased to 50% of the initial luminance) of each of the organic electroluminescence devices thus obtained is determined by setting the device in "OLED Test System Model ST-D" manufactured by Tokyo Systems Development and driving it in a constant current mode under the condition of a forward constant current of 0.4 mA.

The evaluation results of the organic electroluminescence devices are shown in the following table. By grouping together Comparative Example and Example using the same light emitting material, the luminance half-life of each of Examples using Exemplified Compound (2-17), Exemplified Compound (2-20), Exemplified Compound (4-4), and Exemplified Compound (4-18) is indicated by a relative value with the results of Comparative Examples using Comparative Compound 1, Comparative Compound 2, Comparative Compound 3, and Comparative Compound 4 as 100.

TABLE 1

|  | Light-emitting material | Material co-evaporated with the light emitting material | Relative value of luminance half-life |
| --- | --- | --- | --- |
| Comparative Example 1-1 | Light emitting material A | Comparative Compound 1 | 100 |
| Example 1-1 | Light emitting material A | Exemplified Compound 2-17 | 165 |
| Comparative Example 1-2 | Light emitting material A | Comparative Compound 3 | 100 |
| Example 1-2 | Light emitting material A | Exemplified Compound 4-4 | 168 |
| Comparative Example 2-1 | Light emitting material B | Comparative Compound 1 | 100 |
| Example 2-1 | Light emitting material B | Exemplified Compound 2-17 | 170 |
| Comparative Example 2-2 | Light emitting material B | Comparative Compound 2 | 100 |
| Example 2-2 | Light emitting material B | Exemplified Compound 2-20 | 175 |
| Comparative Example 3-1 | Light emitting material C | Comparative Compound 1 | 100 |
| Example 3-1 | Light emitting material C | Exemplified Compound 2-17 | 180 |
| Comparative Example 3-2 | Light emitting material C | Comparative Compound 2 | 100 |
| Example 3-2 | Light emitting material C | Exemplified Compound 2-20 | 180 |
| Comparative Example 4-1 | Light emitting material D | Comparative Compound 1 | 100 |
| Example 4-1 | Light emitting material D | Exemplified Compound 2-17 | 170 |
| Comparative Example 4-2 | Light emitting material D | Comparative Compound 3 | 100 |
| Example 4-2 | Light emitting material D | Exemplified Compound 4-4 | 168 |
| Comparative Example 5-1 | Light emitting material E | Comparative Compound 1 | 100 |
| Example 5-1 | Light emitting material E | Exemplified Compound 2-17 | 200 |
| Comparative Example 5-2 | Light emitting material E | Comparative Compound 3 | 100 |
| Example 5-2 | Light emitting material E | Exemplified Compound 4-4 | 205 |

TABLE 2

|  | Light-emitting material | Material co-evaporated with the light emitting material | Relative value of luminance half-life |
| --- | --- | --- | --- |
| Comparative Example 6-1 | Light emitting material F | Comparative Compound 1 | 100 |
| Example 6-1 | Light emitting material F | Exemplified Compound 2-17 | 150 |
| Comparative Example 7-1 | Light emitting material G | Comparative Compound 1 | 100 |
| Example 7-1 | Light emitting material G | Exemplified Compound 2-17 | 160 |
| Comparative Example 8-1 | Light emitting material H | Comparative Compound 1 | 100 |
| Example 8-1 | Light emitting material H | Exemplified Compound 2-17 | 140 |

TABLE 2-continued

|  | Light-emitting material | Material co-evaporated with the light emitting material | Relative value of luminance half-life |
|---|---|---|---|
| Comparative Example 9-1 | Light emitting material I | Comparative Compound 1 | 100 |
| Example 9-1 | Light emitting material I | Exemplified Compound 2-17 | 160 |
| Comparative Example 10-1 | Light emitting material J | Comparative Compound 1 | 100 |
| Example 10-1 | Light emitting material J | Exemplified Compound 2-17 | 150 |
| Comparative Example 10-2 | Light emitting material J | Comparative Compound 3 | 100 |
| Example 10-2 | Light emitting material J | Exemplified Compound 4-4 | 160 |
| Comparative Example 11-1 | Light emitting material K | Comparative Compound 1 | 100 |
| Example 11-1 | Light emitting material K | Exemplified Compound 2-17 | 120 |
| Comparative Example 11-2 | Light emitting material K | Comparative Compound 2 | 100 |
| Example 11-2 | Light emitting material K | Exemplified Compound 2-20 | 125 |
| Comparative Example 12-1 | Light emitting material L | Comparative Compound 1 | 100 |
| Example 12-1 | Light emitting material L | Exemplified Compound 2-17 | 130 |
| Comparative Example 12-2 | Light emitting material L | Comparative Compound 3 | 100 |
| Example 12-2 | Light emitting material L | Exemplified Compound 4-4 | 127 |

(4) Fabrication and Evaluation of Organic Electroluminescence Devices of Comparative Examples 13-1 to 26-2 and Examples 13-1 to 26-2

Organic electroluminescence devices of Comparative Examples 13-1 to 26-2 and Examples 13-1 to 26-2 were each fabricated in the same manner as in Comparative Example 1-1, except that Light emitting material A and Comparative Compound 1 were replaced as shown in Table 3, and evaluated by the method mentioned above. The evaluation results obtained are also shown in Table 3.

Therein, however, the devices of Comparative Example 17-2 and Example 17-2 were configured so as to have a 3 nm-thick layer of Comparative Compound 2 and a 3 nm-thick layer of Exemplified Compound 2-20, respectively, between the layer of Compound B and the layer containing Comparative Compound 1.

The chemical structures of Light emitting material M to Light emitting material Z used in the devices are as follows.

TABLE 3

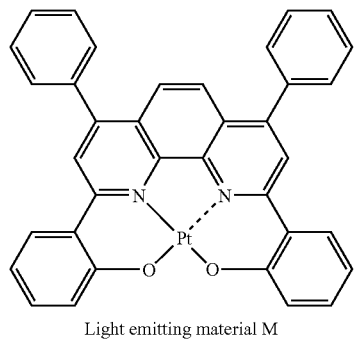

Light emitting material M

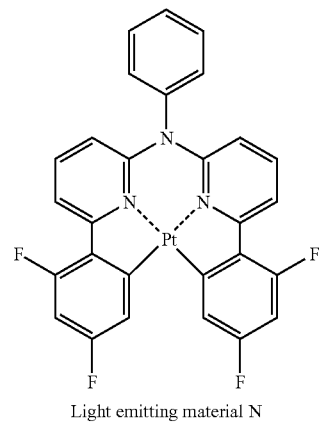

Light emitting material N

TABLE 3-continued
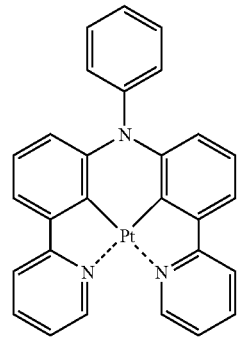
Light emitting material O
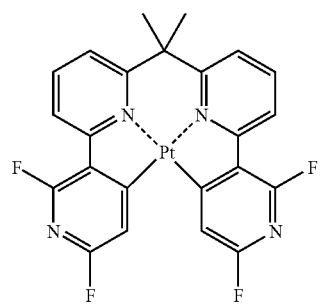
Light emitting material P
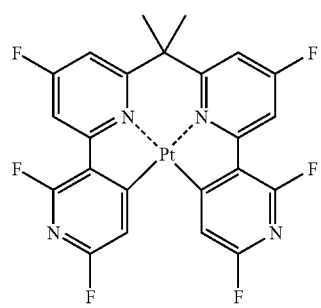
Light emitting material Q
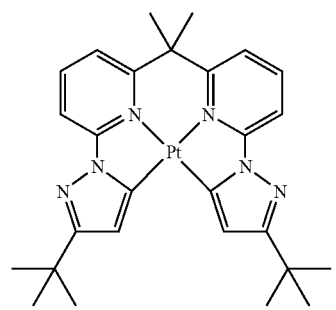
Light emitting material R TABLE 3-continued
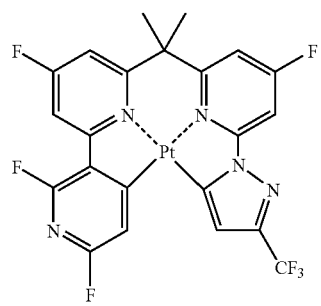
Light emitting material S
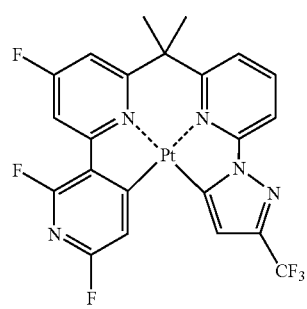
Light emitting material T
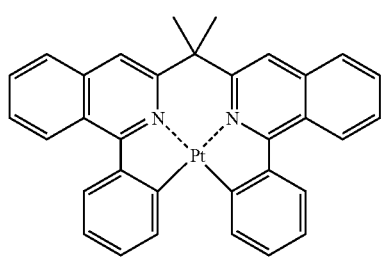
Light emitting material U
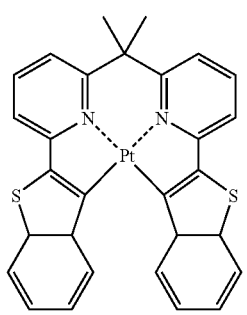
Light emitting material V
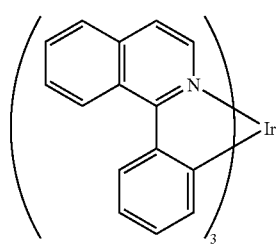
Light emitting material W TABLE 3-continued

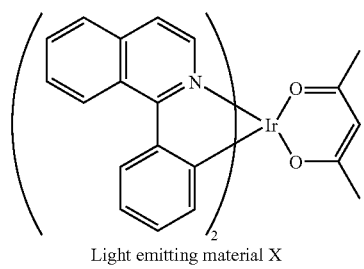

Light emitting material X

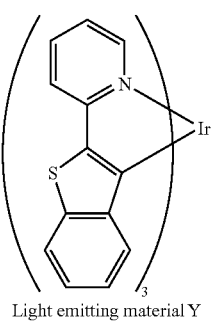

Light emitting material Y

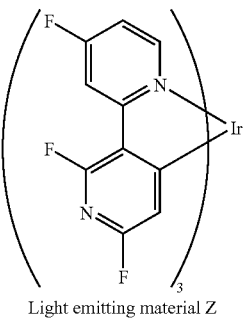

Light emitting material Z

| | Light-emitting material | Material co-evaporated with the light emitting material | Relative value of luminance half-life |
|---|---|---|---|
| Comparative Example 13-1 | Light emitting material M | Comparative Compound 2 | 100 |
| Example 13-1 | Light emitting material M | Exemplified Compound 2-20 | 160 |
| Comparative Example 14-1 | Light emitting material N | Comparative Compound 1 | 100 |
| Example 14-1 | Light emitting material N | Exemplified Compound 2-17 | 175 |
| Comparative Example 15-1 | Light emitting material O | Comparative Compound 2 | 100 |
| Example 15-1 | Light emitting material O | Exemplified Compound 2-20 | 180 |
| Comparative Example 15-2 | Light emitting material O | Comparative Compound 4 | 100 |
| Example 15-2 | Light emitting material O | Exemplified Compound 4-18 | 173 |
| Comparative Example 16-1 | Light emitting material P | Comparative Compound 2 | 100 |
| Example 16-1 | Light emitting material P | Exemplified Compound 2-20 | 203 |
| Comparative Example 17-1 | Light emitting material Q | Comparative Compound 3 | 100 |
| Example 17-1 | Light emitting material Q | Exemplified Compound 4-4 | 214 |
| Comparative Example 17-2 | Light emitting material Q | Comparative Compound 3 | 100 |
| Example 17-2 | Light emitting material Q | Exemplified Compound 4-4 | 225 |
| Comparative Example 18-1 | Light emitting material R | Comparative Compound 3 | 100 |
| Example 18-1 | Light emitting material R | Exemplified Compound 4-4 | 192 |
| Comparative Example 19-1 | Light emitting material S | Comparative Compound 3 | 100 |
| Example 19-1 | Light emitting material S | Exemplified Compound 4-4 | 195 |
| Comparative Example 20-1 | Light emitting material T | Comparative Compound 2 | 100 |
| Example 20-1 | Light emitting material T | Exemplified Compound 2-20 | 221 |
| Comparative Example 21-1 | Light emitting material U | Comparative Compound 2 | 100 |
| Example 21-1 | Light emitting material U | Exemplified Compound 2-20 | 185 |
| Comparative Example 22-1 | Light emitting material V | Comparative Compound 2 | 100 |
| Example 22-1 | Light emitting material V | Exemplified Compound 2-20 | 172 |
| Comparative Example 23-1 | Light emitting material W | Comparative Compound 2 | 100 |
| Example 23-1 | Light emitting material W | Exemplified Compound 2-20 | 165 |
| Comparative Example 24-1 | Light emitting material X | Comparative Compound 2 | 100 |
| Example 24-1 | Light emitting material X | Exemplified Compound 2-20 | 168 |

TABLE 3-continued

| | Light emitting material | Comparative Compound | Relative value |
|---|---|---|---|
| Comparative Example 25-1 | Light emitting material Y | Comparative Compound 2 | 100 |
| Example 25-1 | Light emitting material Y | Exemplified Compound 2-20 | 151 |
| Comparative Example 26-1 | Light emitting material Z | Comparative Compound 1 | 100 |
| Example 26-1 | Light emitting material Z | Exemplified Compound 2-17 | 157 |

(5) Fabrication and Evaluation of Organic Electroluminescence Devices of Comparative Examples A-1 and A-2 and Examples A-1 and A-2

Organic electroluminescence devices of Comparative Examples A-1 and A-2 and Examples A-1 and A-2 were each fabricated in the same manner as in Comparative Example 1-1, except that Light emitting material A, Comparative Compound 1 and Compound C were replaced as shown in Table 4, and evaluated by the foregoing method. The evaluation results obtained are also shown in Table 4.

TABLE 4

| | Light emitting Material | Comparative Compound 1 | Compound C | Relative value of luminance half-life |
|---|---|---|---|---|
| Comparative Example A-1 | Light emitting material P | Comparative Compound 1 | Compound C | 100 |
| Comparative Example A-2 | Light emitting material P | Comparative Compound 1 | Compound E | 110 |
| Example A-1 | Light emitting material P | Exemplified Compound 2-17 | Compound C | 201 |
| Example A-2 | Light emitting material P | Exemplified Compound 2-17 | Compound E | 210 |

The chemical structure of Compound E is as follows.

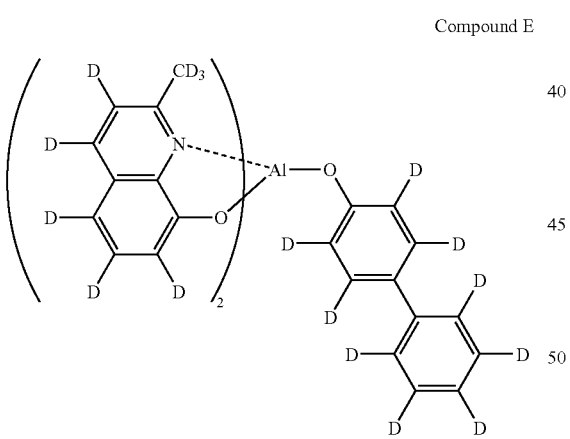

Compound E

Comparing the cases of using Compound C in Table 4 with the cases of using Compound E, which is deuterated Compound C, there is little difference in effect on the luminance half-life value.

The results shown in Table 1 to Table 4 prove that the effect of the invention is particular effect achieved by the compounds represented by the formula (I), each of which has a specific structure and contains at least one deuterium atom and not effect produced by deuteration of a compound.

The invention can provide an organic electroluminescence device excellent in efficiency (power consumption) and durability. In particular, it has further improved efficiency and durability by using a deuterium-containing compound represented by the formula (I) as a host material and using it in combination with a phosphorescent material such as iridium complex or platinum complex.

The entire disclosure of each and every foreign patent application from which the benefit of foreign priority has been claimed in the present application is incorporated herein by reference, as if fully set forth.

What is claimed is:

1. An organic electroluminescent device comprising:
a pair of electrodes; and
an organic layer between the pair of electrodes, which comprises a light-emitting layer and contains a compound represented by the following Formula (Ia) or Formula (Ic):

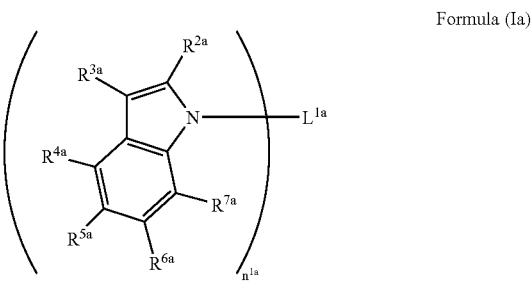

Formula (Ia)

wherein
each of $R^{2a}$ to $R^{7a}$ independently represents a hydrogen atom or a substituent with the proviso that at least one of $R^{2a}$ to $R^{7a}$ represents a deuterium atom or a substituent containing a deuterium atom,
$n^{1a}$ represents an integer of 2 to 6, and
$L^{1a}$ represents an $n^{1a}$-valent linking group,

Formula (Ic)

wherein
Ind represents a residue structure of the compound of the Formula (I),
L represents a linking group bound to the 2- or 3-position of the indole ring of the compound of the formula (I), and
n represents an integer of 2 or greater,

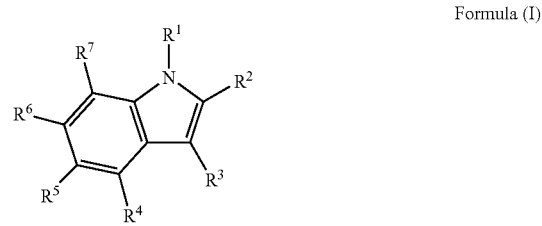

Formula (I)

wherein
each of $R^1$ to $R^7$ independently represents a hydrogen atom or a substituent with the proviso that at least one of $R^1$ to $R^7$ represents a deuterium atom or a substituent containing a deuterium atom, wherein in the above Formula (Ia) and Formula (I), the ratio between deuterium atoms and hydrogen atoms, as represented by the number of deuterium atoms:the number of hydrogen atoms is from 100:0 to 1:99.

2. The organic electroluminescence device according to claim 1, wherein
the light emitting layer contains a phosphorescent material.

3. The organic electroluminescence device according to claim 1, wherein
the light emitting layer contains at least one of a platinum complex phosphorescent material and an iridium complex phosphorescent material.

4. The organic electroluminescence device according to claim 1, wherein
the light emitting layer contains a platinum complex phosphorescent material.

5. The organic electroluminescence device according to claim 1, wherein
the light emitting layer contains a platinum complex phosphorescent material having a tetradentate ligand.

6. The organic electroluminescence device according to claim 1, wherein
at least one of $R^2$ to $R^7$ in the formula (I) represents a deuterium atom.

7. The organic electroluminescence device according to claim 1, wherein the compound represented by the formula (Ia) or formula (Ic) is contained in the light emitting layer.

8. The organic electroluminescence device according to claim 1, wherein the compound represented by the formula (Ia) or (Ic) is contained in a layer adjacent to the light emitting layer.

9. The organic electroluminescence device according claim 1, wherein
$R^1$ in the formula (I) represents an aryl group or a heteroaryl group.

10. The organic electroluminescence device according to claim 1, wherein
one of $R^2$ and $R^3$ in the formula (I) is an alkyl group having a tertiary or quaternary carbon atom, and
the alkyl group is bound to the compound via the tertiary or quaternary carbon atom.

11. An organic electroluminescent device comprising:
a pair of electrodes; and
an organic layer between the pair of electrodes, which comprises a light-emitting layer and contains a compound represented by the following Formula (Ib):

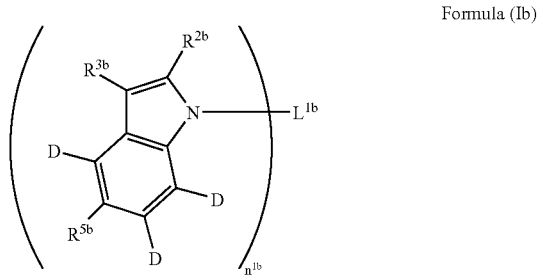

Formula (Ib)

wherein
each of $R^{2b}$, $R^{3b}$ and $R^{5b}$ represents a hydrogen atom or a substituent with the proviso that at least one of $R^{2b}$, $R^{3b}$ and $R^{5b}$ represents a deuterium or a substituent containing a deuterium atom
$n^{1b}$ represents an integer of 2 to 4, and
$L^{1b}$ represents an $n^{1b}$-valent linking group,
wherein in the above Formula (Ib), the ratio between deuterium atoms and hydrogen atoms, as represented by the number of deuterium atoms:the number of hydrogen atoms is from 100:0 to 1:99.

* * * * *